United States Patent
Bachrach et al.

(10) Patent No.: US 8,225,496 B2
(45) Date of Patent: Jul. 24, 2012

(54) AUTOMATED INTEGRATED SOLAR CELL PRODUCTION LINE COMPOSED OF A PLURALITY OF AUTOMATED MODULES AND TOOLS INCLUDING AN AUTOCLAVE FOR CURING SOLAR DEVICES THAT HAVE BEEN LAMINATED

(75) Inventors: Robert Z. Bachrach, Burlingame, CA (US); Yong-Kee Chae, Pleasanton, CA (US); Soo Young Choi, Fremont, CA (US); Nicholas G. J. De Vries, Alameda, CA (US); Yacov Elgar, Sunnyvale, CA (US); Eric A. Englhardt, Palo Alto, CA (US); Michel R. Frei, Palo Alto, CA (US); Charles Gay, Westlake Village, CA (US); Parris Hawkins, Los Altos, CA (US); Choi (Gene) Ho, Sunnyvale, CA (US); James Craig Hunter, Los Gatos, CA (US); Penchala N. Kankanala, Santa Clara, CA (US); Liwei Li, Sunnyvale, CA (US); Wing Hoo (Hendrick) Lo, San Francisco, CA (US); Danny Cam Toan Lu, San Francisco, CA (US); Fang Mei, Foster City, CA (US); Stephen P. Murphy, Perrysburg, OH (US); Srujal (Steve) Patel, San Jose, CA (US); Matthew J. B. Saunders, Sunnyvale, CA (US); Asaf Schlezinger, Sunnyvale, CA (US); Shuran Sheng, Sunnyvale, CA (US); Tzay-Fa (Jeff) Su, San Jose, CA (US); Jeffrey S. Sullivan, Castro Valley, CA (US); David Tanner, San Jose, CA (US); Teresa Trowbridge, Los Altos, CA (US); Brice Walker, Bautista, CA (US); John M. White, Hayward, CA (US); Tae K. Won, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 999 days.

(21) Appl. No.: 12/202,199

(22) Filed: Aug. 29, 2008

(65) Prior Publication Data
US 2009/0077805 A1 Mar. 26, 2009

Related U.S. Application Data

(60) Provisional application No. 60/967,077, filed on Aug. 31, 2007, provisional application No. 61/023,214, filed on Jan. 24, 2008, provisional application No. 61/034,931, filed on Mar. 7, 2008, provisional application No. 61/023,739, filed on Jan. 25, 2008, provisional application No. 61/023,810, filed on Jan. 25, 2008, provisional application No. 61/020,304, filed on Jan. 10, 2008, provisional application No. 61/032,005, filed on Feb. 27, 2008, provisional application No. 61/036,691, filed on Mar. 14, 2008, provisional application No. 61/043,060, filed on Apr. 7, 2008, provisional application No. 61/044,852, filed on Apr. 14, 2008.

(51) Int. Cl.
| | |
|---|---|
| H01L 51/44 | (2006.01) |
| H01L 51/48 | (2006.01) |
| H01L 21/768 | (2006.01) |
| H01L 31/072 | (2012.01) |

(52) U.S. Cl. ............... 29/726; 29/783; 29/795; 29/742; 29/33 P; 29/890.033

(58) Field of Classification Search ............... 29/890.33, 29/783, 787, 791, 795, 740, 741, 742, 564.2, 29/564.7, 33 P, 650
See application file for complete search history.

(56) References Cited

U.S. PATENT DOCUMENTS

| | | | |
|---|---|---|---|
| 1,927,677 | A | 9/1933 | Bennington |
| 3,206,041 | A | 9/1965 | McGrath |
| 3,294,670 | A | 12/1966 | Charschan et al. |
| 3,351,219 | A | 11/1967 | Ruderfer |
| 3,610,159 | A | 10/1971 | Fickenscher |
| 3,750,804 | A | 8/1973 | Lemelson |
| 3,796,327 | A | 3/1974 | Meyer et al. |

| | | |
|---|---|---|
| 3,876,085 A | 4/1975 | Bright |
| 4,152,824 A | 5/1979 | Gonsiorawski |
| 4,190,852 A | 2/1980 | Warner |
| 4,410,558 A | 10/1983 | Izu et al. |
| 4,592,306 A | 6/1986 | Gallego |
| 4,717,790 A * | 1/1988 | Gochermann ............... 136/251 |
| 4,752,352 A * | 6/1988 | Feygin ............................ 216/33 |
| 4,773,944 A | 9/1988 | Nath et al. |
| 4,869,966 A | 9/1989 | Samuelson et al. |
| 5,053,355 A | 10/1991 | Von Campe |
| 5,214,374 A * | 5/1993 | St. Onge .................. 324/754.15 |
| 5,248,349 A | 9/1993 | Foote et al. |
| 5,252,140 A | 10/1993 | Kobayashi et al. |
| 5,329,690 A * | 7/1994 | Tsuji et al. ...................... 29/701 |
| 5,346,770 A | 9/1994 | Osada et al. |
| 5,415,890 A * | 5/1995 | Kloiber et al. ............... 427/242 |
| 5,658,114 A | 8/1997 | Mahler |
| 5,693,238 A | 12/1997 | Schmitt et al. |
| 5,730,808 A | 3/1998 | Yang et al. |
| 5,910,854 A | 6/1999 | Varaprasad et al. |
| 6,021,790 A | 2/2000 | Yoshitani et al. |
| 6,077,374 A * | 6/2000 | Hopfe ............................ 156/102 |
| 6,077,722 A | 6/2000 | Jansen et al. |
| 6,091,021 A | 7/2000 | Ruby et al. |
| 6,092,669 A * | 7/2000 | Kushiya et al. .......... 204/298.13 |
| 6,160,215 A * | 12/2000 | Curtin ........................... 136/244 |
| 6,177,129 B1 | 1/2001 | Wanger et al. |
| 6,184,056 B1 | 2/2001 | Nakamura |
| 6,189,485 B1 | 2/2001 | Matsuda et al. |
| 6,205,656 B1 * | 3/2001 | Adams et al. .................... 29/840 |
| 6,235,634 B1 | 5/2001 | White et al. |
| 6,245,634 B1 | 6/2001 | Or-Bach |
| 6,256,549 B1 * | 7/2001 | Romero et al. ............... 700/121 |
| 6,262,359 B1 | 7/2001 | Meier et al. |
| 6,263,255 B1 | 7/2001 | Tan et al. |
| 6,265,242 B1 * | 7/2001 | Komori et al. .................. 438/66 |
| 6,268,235 B1 | 7/2001 | Sakakura et al. ............... 438/62 |
| 6,287,888 B1 * | 9/2001 | Sakakura et al. ............... 438/96 |
| 6,288,325 B1 * | 9/2001 | Jansen et al. .................. 136/249 |
| 6,303,395 B1 * | 10/2001 | Nulman ........................... 438/14 |
| 6,340,403 B1 * | 1/2002 | Carey et al. .................. 156/182 |
| 6,423,565 B1 * | 7/2002 | Barth et al. ...................... 438/57 |
| 6,445,969 B1 * | 9/2002 | Kenney et al. ............... 700/108 |
| 6,455,347 B1 * | 9/2002 | Hiraishi et al. ................. 438/80 |
| 6,461,444 B1 * | 10/2002 | Nishio et al. .................... 134/29 |
| 6,541,988 B2 * | 4/2003 | Dangelmayer et al. .. 324/756.03 |
| 6,575,687 B2 | 6/2003 | Bonora et al. |
| 6,578,764 B1 | 6/2003 | Hiraishi et al. |
| 6,660,566 B2 * | 12/2003 | Masayuki ..................... 438/124 |
| 6,687,563 B1 | 2/2004 | Wang et al. |
| 6,748,282 B2 | 6/2004 | Lin |
| 6,784,361 B2 | 8/2004 | Carlson et al. |
| 6,841,728 B2 * | 1/2005 | Jones et al. ................... 136/244 |
| 6,933,051 B2 * | 8/2005 | Fleming et al. ............... 428/463 |
| 6,973,406 B2 * | 12/2005 | Zemer et al. ................. 702/118 |
| 7,056,000 B2 * | 6/2006 | Hussey et al. ................. 362/555 |
| 7,071,717 B2 * | 7/2006 | Hoke et al. ............... 324/756.05 |
| 7,129,118 B2 * | 10/2006 | Yoo et al. ....................... 438/113 |
| 7,218,983 B2 | 5/2007 | Puri et al. |
| 7,262,115 B2 | 8/2007 | Baylis et al. |
| 7,335,266 B2 | 2/2008 | Fu et al. |
| 7,335,555 B2 | 2/2008 | Gee et al. |
| 7,432,438 B2 | 10/2008 | Rubin et al. |
| 2001/0037823 A1 | 11/2001 | Middelman et al. |
| 2002/0033191 A1 | 3/2002 | Kondo et al. |
| 2002/0117199 A1 | 8/2002 | Oswald |
| 2002/0182768 A1 | 12/2002 | Morse et al. |
| 2003/0029493 A1 * | 2/2003 | Plessing ........................ 136/251 |
| 2003/0044539 A1 | 3/2003 | Oswald |
| 2003/0075210 A1 * | 4/2003 | Stollwerck et al. ........... 136/243 |
| 2003/0129810 A1 | 7/2003 | Barth et al. |
| 2003/0141820 A1 * | 7/2003 | White et al. ............. 315/111.21 |
| 2004/0194701 A1 | 10/2004 | Yadav et al. |
| 2005/0016454 A1 | 1/2005 | Kurita et al. |
| 2005/0072455 A1 | 4/2005 | Gerhardinger et al. |
| 2005/0105991 A1 | 5/2005 | Hofmeister et al. |
| 2005/0115667 A1 * | 6/2005 | Yokoyama .................... 156/285 |
| 2005/0217718 A1 * | 10/2005 | Dings et al. .................. 136/256 |
| 2005/0224181 A1 | 10/2005 | Merry et al. |
| 2005/0241692 A1 | 11/2005 | Rubin et al. |
| 2005/0252545 A1 | 11/2005 | Nowlan et al. |
| 2005/0284516 A1 * | 12/2005 | Koll .............................. 136/251 |
| 2006/0201074 A1 | 9/2006 | Kurita et al. |
| 2006/0225777 A1 | 10/2006 | Buechel |
| 2006/0235717 A1 * | 10/2006 | Sharma et al. ..................... 705/1 |
| 2007/0017445 A1 * | 1/2007 | Takehara et al. .............. 118/719 |
| 2007/0020903 A1 | 1/2007 | Takehara et al. |
| 2008/0017241 A1 | 1/2008 | Anderson et al. |
| 2008/0038095 A1 | 2/2008 | Ostermann et al. |
| 2008/0115827 A1 | 5/2008 | Woods et al. |
| 2008/0185096 A1 | 8/2008 | Karpinski et al. |
| 2008/0276451 A1 * | 11/2008 | Morad ............................ 29/742 |
| 2008/0281457 A1 | 11/2008 | Bachrach |
| 2009/0012643 A1 | 1/2009 | Bachrach |

FOREIGN PATENT DOCUMENTS

| | | |
|---|---|---|
| EP | 0 768 721 | 7/2002 |
| EP | 1 617 487 | 6/2005 |
| EP | 0 827 212 | 12/2005 |
| EP | 0 640 247 | 5/2007 |
| EP | 1 665 323 | 6/2007 |
| EP | 1 938 964 | 7/2008 |
| WO | WO 01/47020 | 6/2001 |
| WO | WO 03/067671 | 8/2003 |
| WO | WO 03/067673 | 8/2003 |
| WO | WO 2008/118137 | 10/2008 |

OTHER PUBLICATIONS

Shah, et al. "Basic efficiency limits, recent experimental results and novel light-trapping schemes in a Si:H, μc-Si:H and 'micromorph tandem' solar cells" Journal of Non-Crystalline Solids. Jun. 2004.

Meier, et al. "Up-Scaling Process of Thin Film Silicon Solar Cells and Modules in Industrial PECVD KAI" Systems, vol. 2, May 2006.

"Solar signs know-how transfer contract with Roth & Rau AG from Germany", May 22, 2006.

"From Amorph to Micromorph: Production Solutions for Thin Film Solar Modules", www.euroasiasemiconductor.com Sep. 2007.

Paul A. Basore, WEPEC Paper Award. "Large-Area Deposition for Crystalline Silicon on Glass Modules". May 2003.

Paul A. Basore, "CSG-1: Manufacturing A New Polycrystalline Silicon PV Technology", May 2006. 5 pgs.

Guy Beacarne, "Silicon Thin-Film Solar Cells", Advances in OptoElectronics. vol. 2007, Article ID 36970, 12 pages. Aug. 2007.

Arthur R. Buechel. "Unaxis goes solar", Unaxis PowerPoint. May 2003.

"Unaxis Unveils New Production Solution Enabling 45nm Photomask Etching & Beyond", Apr. 19, 2006.

Semiconductor Equipment Assessment. "Results Bulletin: Deposition Equipment for Flat Panel Display Fabrication" www.sea.rl.ac.uk Apr. 2004.

R. Boomsma. "Unaxis Solar Project: A New Opportunity", Unaxis PowerPoint. Mar. 13, 2003. 22 pages.

Meier, et al. "Up-Scaling of Thin Film Silicon Solar Cells by Industrial Large-Area PECVD KAI Systems", Unaxis PowerPoint. Nov. 2005.

Arthur R. Buechel. "Unaxis goes Solar", Unaxis PowerPoint. 1st International Thin Films in Photovoltaic Industry Workshop, Ispra, I, 2005. 18 pages.

"Solar at Work", Oerlikon Solar. Newsletter No. 1. Jun. 2007. www.oerlikon.com/solar.

Janki, et al. "Spatial Resolution of the Spectral Photocurrent Measurement of Thin Film Solarmodules" www.unaxis.com/solar University of Applied Sciences Buchs NTB. 2005.

Unaxis Press Release. "Photovoltaics: Major Industrial venture announced in Neuchatel", Mar. 13, 2003.

International Search Report. PCT/US08/74930. Dtd Nov. 18, 2008.

Scholz, Maschinenbau, Innovative Autoklavtechnik. www.scholz-maschinenbau.de. 2002.

International Search Report. Nov. 18, 2008.

JP Morgan. "SunSpots vol. 5", Sunny Days in Switzerland at Oerlikon Solar. North America Equity Research. Apr. 7, 2008. pp. 1-14.

Specification 096.9.967: KAI-SOL 20 and KAI-SOL 10 PECVD systems. "Horizontal PECVD Parallel systems for thin film a-SI solar cell manufacturing", Feb. 25, 1999. pp. 1-23.
Paul A. Basore. "Large-Area Deposition for Crystalline Silicon on Glass Modules", May 2003. pp. 1-4.
Dr. Uwe Kruger. "Oerlikon as a supplier of Green Technologies—market position and growth potentials", Solar Day, Trubbach 13. Jun. 2007.
"Grid Parity is the Ultimate Target". www.euroaaiasemiconductor.com. Apr. 2008.
Prof. Dr. Franz Baumgartner, Energy Systems. "Future and further development of silicon thin film technology::Prospects for R & D", Jun. 14, 2007. pp. 1-19.
Karsten Weltzien, Oerlikon Solar Day Power Point. ersol Thin Film GmbH. Jun. 6, 2007. pp. 1-21.
Detlev Koch-Ospelt. "End-to-End Mass Production Solutions for Gen 1 & 2 Silicon Thin Film Modules". Power Point. Jun. 13, 2007.
PCT International Search Report and Written Opinion dated Jan. 26, 2009 for International Application No. PCT/US2008/74931.
Official Letter dated Jun. 20, 2011, from Chinese Patent Office for corresponding Chinese Patent Application No. 200880105071.0.
Notice to File a Response dated Oct. 19, 2010 for Korean Application No. 10-2008-7026168.

* cited by examiner

*Primary Examiner* — David Bryant
*Assistant Examiner* — Jason L Vaughan
(74) *Attorney, Agent, or Firm* — Patterson & Sheridan, LLP

(57) ABSTRACT

The present invention generally relates to a system that can be used to form a photovoltaic device, or solar cell, using processing modules that are adapted to perform one or more steps in the solar cell formation process. The automated solar cell fab is generally an arrangement of automated processing modules and automation equipment that is used to form solar cell devices. The automated solar fab will thus generally comprise a substrate receiving module that is adapted to receive a substrate, one or more absorbing layer deposition cluster tools having at least one processing chamber that is adapted to deposit a silicon-containing layer on a surface of the substrate, one or more back contact deposition chambers, one or more material removal chambers, a solar cell encapsulation device, an autoclave module, an automated junction box attaching module, and one or more quality assurance modules that are adapted to test and qualify the completely formed solar cell device.

4 Claims, 31 Drawing Sheets

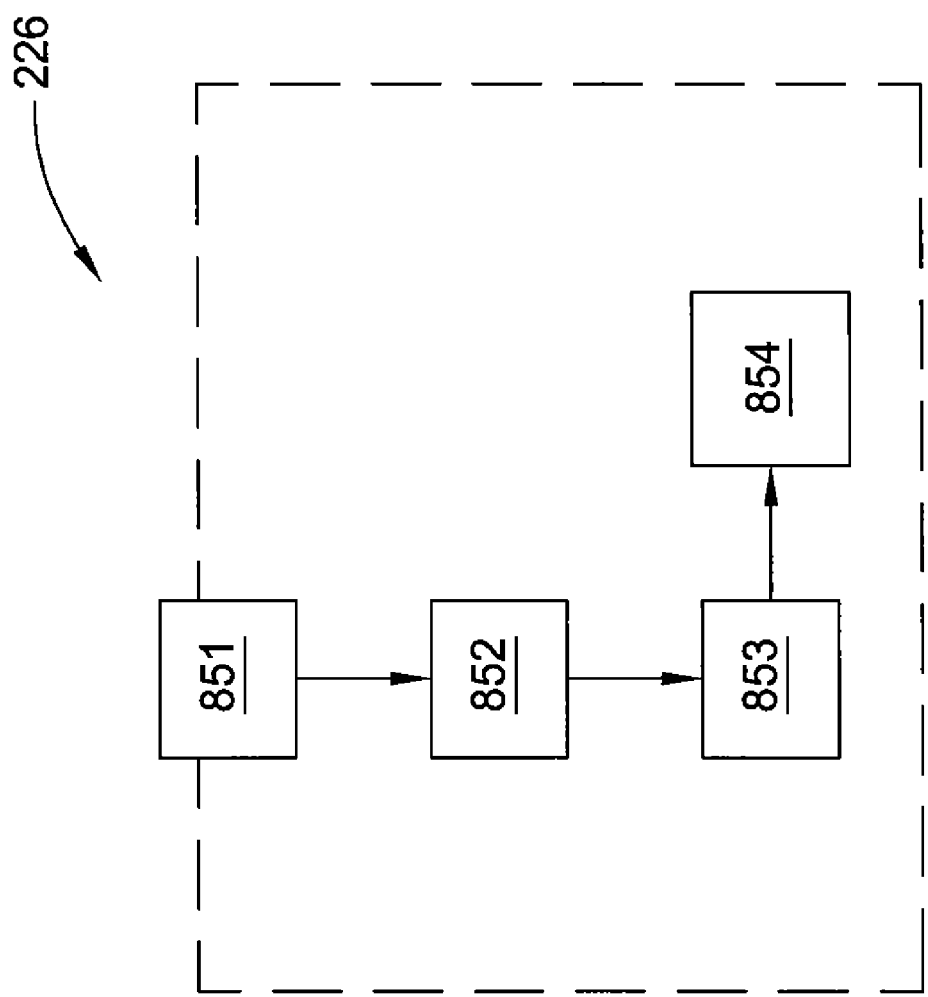

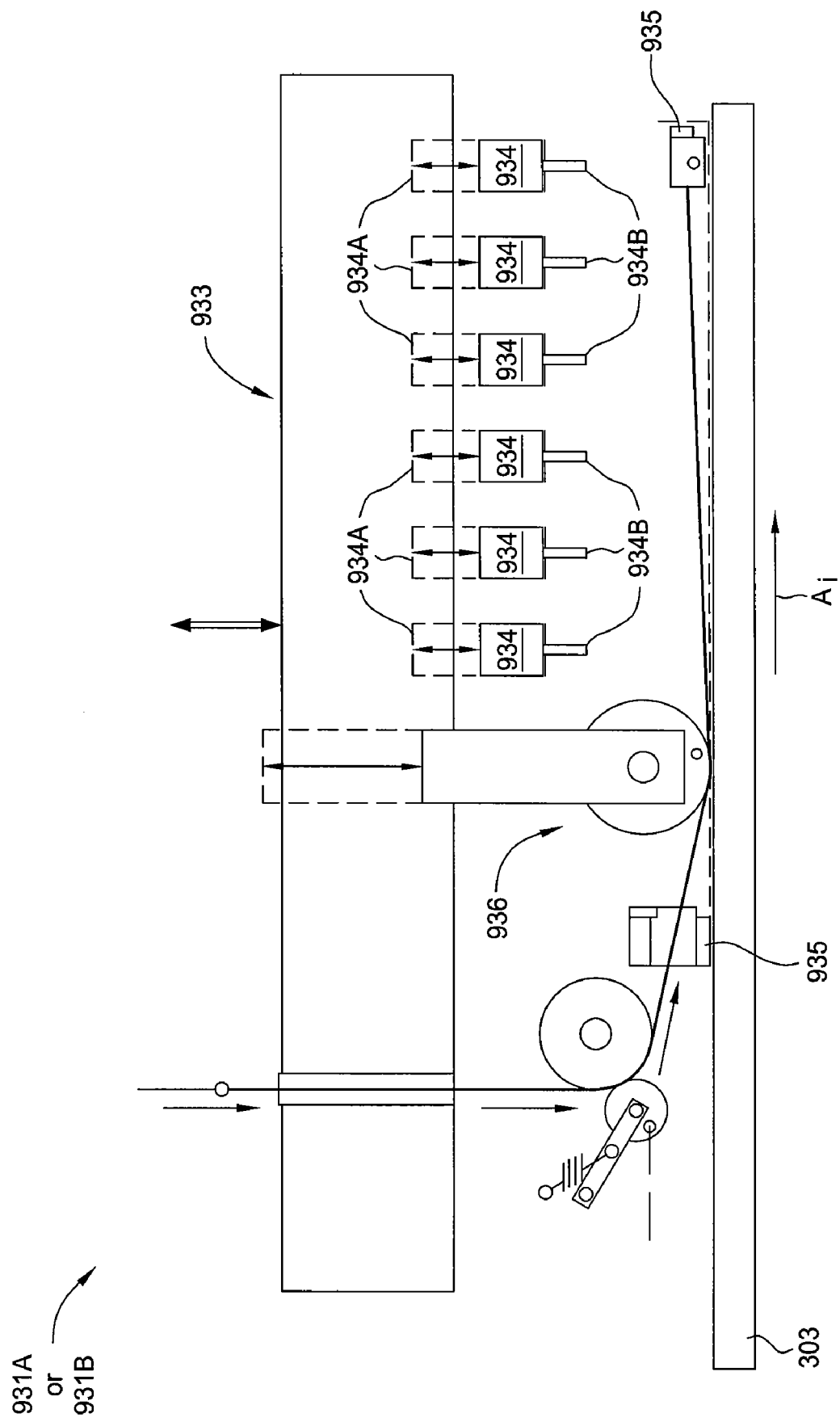

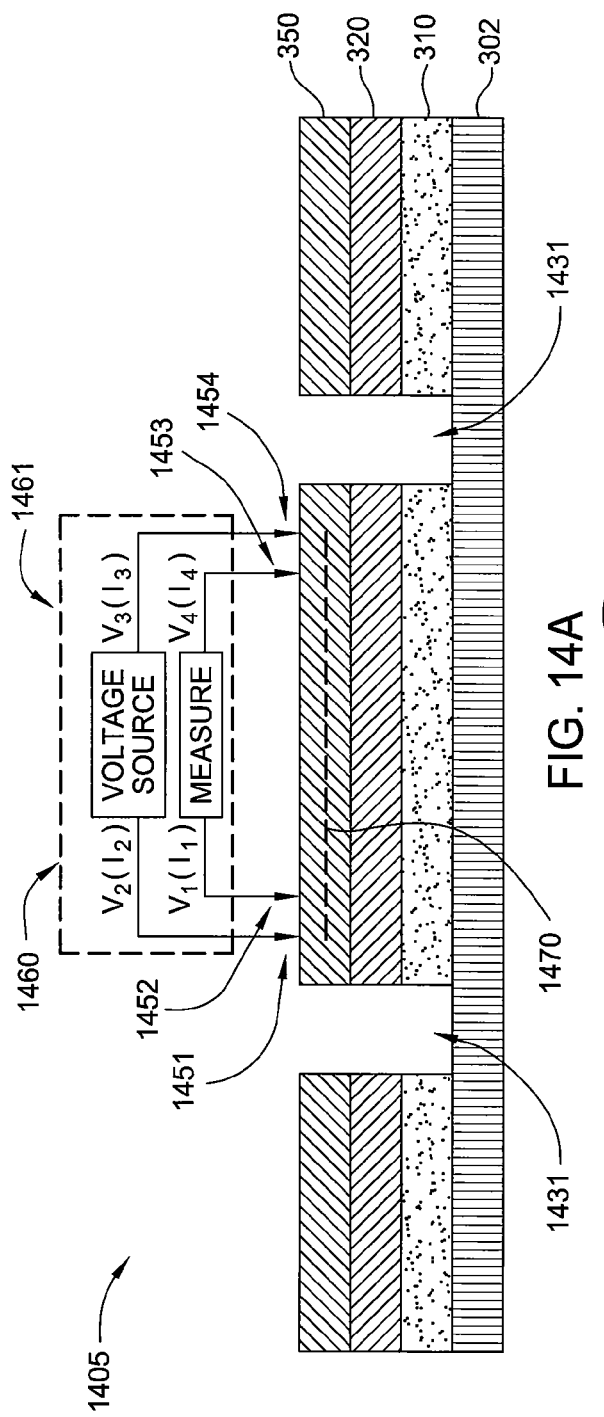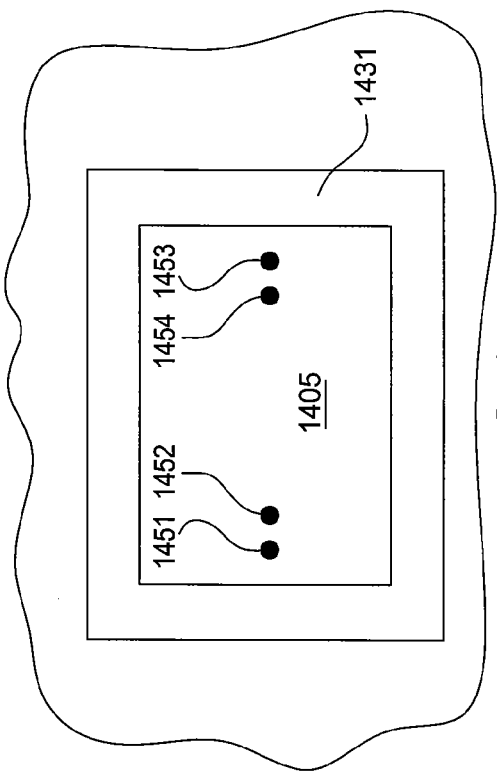

US 8,225,496 B2

AUTOMATED INTEGRATED SOLAR CELL PRODUCTION LINE COMPOSED OF A PLURALITY OF AUTOMATED MODULES AND TOOLS INCLUDING AN AUTOCLAVE FOR CURING SOLAR DEVICES THAT HAVE BEEN LAMINATED

CROSS-REFERENCE TO RELATED APPLICATIONS

This application claims benefit of U.S. Provisional Patent Application Ser. No. 60/967,077, filed Aug. 31, 2007, U.S. Provisional Patent Application Ser. No. 61/023,214, filed Jan. 24, 2008, U.S. Provisional Patent Application Ser. No. 61/034,931, filed Mar. 7, 2008, U.S. Provisional Patent Application Ser. No. 61/023,739, filed Jan. 25, 2008, U.S. Provisional Patent Application Ser. No. 61/023,810, filed Jan. 25, 2008, U.S. Provisional Patent Application Ser. No. 61/020,304, filed Jan. 10, 2008, U.S. Provisional Patent Application Ser. No. 61/032,005, filed Feb. 27, 2008, U.S. Provisional Patent Application Ser. No. 61/036,691, filed Mar. 14, 2008, U.S. Provisional Patent Application Ser. No. 61/043,060, filed Apr. 7, 2008, and U.S. Provisional Patent Application Ser. No. 61/044,852, filed Apr. 14, 2008, which are all incorporated by reference in their entireties.

BACKGROUND OF THE INVENTION

1. Field of the Invention

Embodiments of the present invention generally relate to the design and layout of a production line used to form a solar cell device. Embodiments of the present invention also generally relate to the design and selection of various apparatuses and processes that are useful for forming a solar cell device.

2. Description of the Related Art

Photovoltaic (PV) devices or solar cells are devices which convert sunlight into direct current (DC) electrical power. Typical thin film type PV devices, or thin film solar cells, have one or more p-i-n junctions. Each p-i-n junction comprises a p-type layer, an intrinsic type layer, and a n-type layer. When the p-i-n junction of the solar cell is exposed to sunlight (consisting of energy from photons), the sunlight is converted to electricity through the PV effect. Solar cells may be tiled into larger solar arrays. The solar arrays are created by connecting a number of solar cells and are then joined into panels with specific frames and connectors.

Typically, a thin film solar cell includes active regions and a transparent conductive oxide (TCO) film disposed as a front electrode and/or as a back electrode. The photoelectric conversion unit includes a p-type silicon layer, a n-type silicon layer, and an intrinsic type (i-type) silicon layer sandwiched between the p-type and n-type silicon layers. Several types of silicon films including microcrystalline silicon film ($\mu c$-Si), amorphous silicon film (a-Si), polycrystalline silicon film (poly-Si) and the like may be utilized to form the p-type, n-type, and/or i-type layers of the photoelectric conversion unit. The backside contact may contain one or more conductive layers. There is a need for an improved process of forming a solar cell that has good interfacial contact, low contact resistance and provides a high overall electrical device performance of the solar cells.

With traditional energy source prices on the rise, there is a need for a low cost way of producing electricity using a low cost solar cell device. Conventional solar cell manufacturing processes are highly labor intensive and have numerous interruptions that can affect production line throughput, solar cell cost and device yield. Conventional solar cell fabrication processes contain a number of manual operations that can cause the formed solar cell device properties to vary from one device to another. These manual processes are labor intensive, time consuming and costly. There is a need for a continuous non-interrupted flow of solar cell substrates through a solar cell production line to reduce cost and improve device yield. Thus, there is a need for a production line, or system, that is able to perform all phases of the solar cell fabrication process.

Also, there is a need for an apparatus and method of testing a solar cell device during different phases of the formation process to assure that the solar cells being formed in the production line are formed in a repeatable manner. Also, there is need for a testing module that can characterize the properties of a partially formed solar cell device to assure that its performance is within a desired performance range and that the combination of solar cell formation steps creates a solar cell device that meets the functional and performance specifications required by the solar cell device manufacturer.

SUMMARY OF THE INVENTION

One embodiment of the present invention sets forth a system for forming a solar cell, comprising one or more cluster tools having at least one processing chamber which is adapted to deposit a silicon-containing layer on a surface of a first substrate, a first scribing device that is adapted to remove a portion of the silicon-containing layer from the surface of the first substrate, a test module that is adapted to characterize the output of one or more of the processes performed in the system, wherein the test module comprises a substrate support, a measurement device that is in electrical communication with two or more contact pins which are oriented to contact at least two point on the surface of the first substrate that is disposed on the substrate support, a vision system that is positioned to view the surface of the first substrate, and an actuator that is adapted to position the first substrate disposed on the substrate support relative to the two or more contact pins.

Embodiments of the invention may further provide a system for forming a solar cell, comprising one or more cluster tools having at least one processing chamber which is adapted to deposit a silicon-containing layer on a surface of a first substrate, one or more deposition chambers that is adapted to deposit a conductive layer on the silicon-containing layer, and a bonding wire attach module comprising a substrate handling device that is adapted to transfer the substrate from a first position to a second position, a vision system that is positioned to view the surface of the substrate, two or more conductive element deposition devices that are each adapted to substantially simultaneously position a conductive element on the conductive layer formed on the surface of the substrate as the substrate is moved from the first position to the second position by the substrate handling device, and two or more solder points that can be positioned to provide heat to two or more regions of each conductive element that are disposed on the conductive layer.

Embodiments of the invention may further provide a system for forming a solar cell, comprising a first scribing device that is adapted to remove a portion of a layer formed on a surface of the substrate, one or more cluster tools having at least one processing chamber which is adapted to deposit a silicon-containing layer over the layer, a first substrate transporting device that is in transferrable communication with the one or more cluster tools, the first scribing device, and a first buffer chamber, wherein the first buffer chamber has a plurality of substrate supporting positions and is disposed between the one or more cluster tools and the scribing device, one or more deposition chambers that is adapted to deposit a conductive layer over the silicon-containing layer, a second substrate transporting device that is in transferrable communication with the one or more cluster tools, the one or more deposition chambers and a second buffer chamber, wherein the second buffer chamber has a plurality of substrate supporting positions and is disposed between the one or more cluster tools and the one or more deposition chambers.

Embodiments of the invention may further provide a system for forming a solar cell, comprising one or more cluster tools having at least one processing chamber which is adapted to deposit a silicon-containing layer, one or more deposition chambers that is adapted to deposit a conductive layer over the silicon-containing layer, an edge deletion module comprising a substrate transferring device that is adapted to transfer the substrate from a first position to a second position, at least two edge delete devices that each have an actuator and a abrasive member coupled to the actuator, wherein the at least two edge delete devices are configured to substantially simultaneously remove a portion of the silicon-containing layer and the deposited conductive layer from the surface of the substrate as the substrate transferring device transfers the substrate from the first position to the second position.

Embodiments of the invention may further provide a system for forming a solar cell, comprising one or more cluster tools having at least one processing chamber which is adapted to deposit a silicon-containing layer on a surface of a first substrate, one or more deposition chambers that is adapted to deposit a conductive layer on a surface of the first substrate, a lamination device that is adapted to bond a second substrate to the first substrate by applying heat and pressure to the first and second substrates which have the silicon-containing layer and a bonding layer disposed therebetween, an autoclave comprising a vessel, a fluid delivery system that is in fluid communication with a processing region of the vessel, and a substrate support that is adapted to support a plurality of first and second substrates that have been bonded, wherein the substrate support can be moveably disposed within the processing region.

Embodiments of the invention may further provide a method of forming a plurality of solar cell devices on a large area substrate, comprising depositing a photoabsorbing layer on the surface of the substrate, removing at least a portion of the photoabsorbing layer from a region on a surface of the substrate, depositing a metal layer on the surface of the substrate, removing at least a portion of the metal layer from a region on the surface of the substrate, forming one or more test structures on the substrate, wherein the test structures are electrically isolated from the solar cell devices formed on other portions of the substrate, and comprise at least a portion of the metal layer or a portion of the photoabsorbing layer, and measuring the electrical characteristics of a portion of the test structure, wherein measuring the electrical characteristics comprises contacting a surface of the substrate with two or more contact pins, supplying a current or voltage to two of the two or more contact pins, and measuring the current flow or voltage at two of the two or more contact pins.

Embodiments of the invention may further provide a method of processing a solar cell substrate in an automated and integrated solar cell production system, comprising loading a substrate into an automated and integrated solar cell production system, cleaning the substrate to remove one or more contaminants from a surface of a substrate, depositing a plurality of photoabsorbing layers on a surface of a substrate having a front contact layer deposited thereon, removing at least a portion of the photoabsorbing layers from a region on a surface of the substrate to form a plurality of interconnects therethrough, depositing a back contact layer on the photoabsorbing layers and in the interconnects formed therethrough, removing at least a portion of the back contact layer from a region on the surface of the substrate to form isolated regions of the back contact layer, bonding a back glass substrate to the surface of the of the substrate to form a composite structure, positioning the composite structure in a processing region of an autoclave chamber, and heating the composite structure and delivering a gas into the processing region of the autoclave to form an improved bond between the back glass and substrate.

Embodiments of the invention may further provide a method of processing a solar cell substrate in an automated and integrated solar cell production system, comprising loading a substrate into an automated and integrated solar cell production system, cleaning the substrate to remove one or more contaminants from a surface of a substrate, depositing a plurality of photoabsorbing layers on a surface of a substrate having a front contact layer deposited thereon, removing at least a portion of the photoabsorbing layers from a region on a surface of the substrate to form a plurality of interconnects therethrough, depositing a back contact layer on the photoabsorbing layers and in the interconnects formed therethrough, removing at least a portion of the back contact layer from a region on the surface of the substrate to form isolated regions of the back contact layer, bonding a back glass substrate to the surface of the of the substrate to form a composite structure.

Embodiments of the invention may further provide an automated and integrated system for forming a solar cell, comprising a substrate receiving module that is adapted to receive a substrate, a substrate seaming module, a first cleaning module positioned to clean a substrate after the substrate is processed in the substrate seaming module, a front contact isolation module, a second substrate cleaning module positioned to clean a substrate after the substrate has been processed in the front contact isolation module, one or more cluster tools having at least one processing chamber that is adapted to deposit a silicon-containing layer on a surface of the substrate, a photabsorbing layer(s) isolation module, one or more deposition chambers that is adapted to deposit a metal layer on a surface of the substrate, one or more back contact isolation modules, an edge exclusion module, a third substrate cleaning module positioned to clean the substrate after the substrate has been processed in the edge exclusion module, a bonding wire attach module, and a bonding module.

Embodiments of the invention may further provide an automated and integrated system for forming a solar cell, comprising material removal chambers that are adapted to remove material from a surface of the substrate, a test module that is adapted to characterize the output of one or more of the processes performed in the system, wherein the test module comprises a plurality of contact pins, a measurement device that is in electrical communication with at least one of the plurality of contact pins, a vision system that is positioned to view a surface of the substrate, and is adapted to view features formed on the substrate by use of a camera, a controller and one or more robotic devices, and an actuator that is adapted to position the contact pins relative to the substrate so that the contact pins can make electrical contact with a desired surface of the substrate.

Embodiments of the invention may further provide a method of processing a solar cell substrate, comprising cleaning a substrate to remove one or more contaminants from a surface of a substrate, depositing a photoabsorbing layer on the surface of the substrate, removing at least a portion of the photoabsorbing layer from a region on a surface of the substrate, depositing a back contact layer on the surface of the substrate, removing at least a portion of the back contact layer from a region on the surface of the substrate, bonding a back glass substrate to the surface of the of the substrate to form a composite structure, positioning the composite structure in a processing region of an autoclave chamber, and heating the composite structure and delivering a gas into the processing region of the autoclave to form an improved bond between the back glass and substrate.

Embodiments of the invention may further provide an automated integrated solar cell production line, comprising a substrate loading station to load substrates into the integrated production line, a first substrate cleaner disposed downstream from the substrate loading station and adapted to clean a substrate after introduction into the production line, a front contact isolation module disposed downstream from the first substrate cleaner and adapted to etch a front contact layer deposited thereon to provide isolation therebetween, a plurality of cluster tools disposed downstream from the front contact isolation module and having at least one processing chamber that is adapted to deposit a silicon-containing layer on a surface of the substrate, an interconnect formation module disposed downstream from the plurality of cluster tools and adapted to etch the silicon-containing layer and form interconnects to the front contact layer, one or more metal deposition chambers disposed downstream from the back contact isolation module and adapted to deposit a metal layer over the silicon-containing layer, a back contact isolation module disposed downstream from the one or more metal deposition chambers, one or more material removal chambers disposed downstream from the one or more metal deposition chambers that are adapted to remove material from a perimeter area of a substrate, a second substrate cleaner disposed downstream from the one or more material removal chambers, a bonding wire attach module disposed downstream from the second substrate cleaner, and a lamination device disposed downstream from the bonding wire attach module that is adapted to bond a second substrate to the first substrate by applying heat and pressure to the first and second substrates which have the silicon-containing layer and a bonding layer disposed therebetween.

Embodiments of the invention may further provide a method of processing a solar cell substrate in an automated and integrated solar cell production system, comprising loading a substrate into an automated and integrated solar cell production system, cleaning the substrate to remove one or more contaminants from a surface of a substrate, depositing a plurality of photoabsorbing layers on a surface of a substrate having a front contact layer deposited thereon, removing at least a portion of the photoabsorbing layers from a region on a surface of the substrate to form a plurality of interconnects therethrough, depositing a back contact layer on the photoabsorbing layers and in the interconnects formed therethrough, removing at least a portion of the back contact layer from a region on the surface of the substrate to form isolated regions of the back contact layer, bonding a back glass substrate to the surface of the of the substrate to form a composite structure, positioning the composite structure in a processing region of an autoclave chamber, and heating the composite structure and delivering a gas into the processing region of the autoclave to form an improved bond between the back glass and substrate.

Embodiments of the invention may further provide a method of processing a solar cell substrate in an automated and integrated solar cell production system, comprising loading a substrate into an automated and integrated solar cell production system, cleaning the substrate to remove one or more contaminants from a surface of a substrate, depositing a plurality of photoabsorbing layers on a surface of a substrate having a front contact layer deposited thereon, removing at least a portion of the photoabsorbing layers from a region on a surface of the substrate to form a plurality of interconnects therethrough, depositing a back contact layer on the photoabsorbing layers and in the interconnects formed therethrough, removing at least a portion of the back contact layer and at least a portion of the photo absorbing layers from two or more regions on the surface of the substrate generally simultaneously using two or more material removal devices, and bonding a back glass substrate to the surface of the of the substrate to form a composite structure.

Embodiments of the invention may further provide an automated and integrated system for forming a solar cell, comprising one or more cluster tools having at least one processing chamber that is adapted to deposit a silicon-containing layer on a surface of a first substrate, one or more deposition chambers that is adapted to deposit a metal layer on a surface of the first substrate, an edge deletion module that is adapted to remove at least a portion of the metal layer and at least a portion of the silicon-containing layer from two or more regions on the surface of the first substrate generally simultaneously using two or more material removal devices, a bonding wire attach module that is adapted to substantially simultaneously positioning two or more buss lines on the metal layer, and a bonding module that is adapted to bond a second substrate to the first substrate by applying heat and pressure to the first and second substrates which have the silicon-containing layer and a bonding layer disposed therebetween.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8A illustrates a schematic plan view of one embodiment of an edge deletion module according to one embodiment described herein.

FIG. 9B illustrates a schematic cross-sectional view of the bonding wire attach module according to one embodiment described herein.

FIG. 14A is a schematic cross-sectional diagram of a measurement assembly and typical test structure according to one embodiment described herein.

FIG. 14B is a plan view of the typical test structure illustrated in FIG. 14A according to one embodiment described herein.

For clarity, identical reference numerals have been used, where applicable, to designate identical elements that are common between figures. It is contemplated that features of one embodiment may be incorporated in other embodiments without further recitation.

DETAILED DESCRIPTION

The present invention generally relates to a system used to form a photovoltaic device, or solar cell, using processing modules that are adapted to perform one or more steps in the solar cell formation process. In one embodiment, the system is adapted to form a thin film solar cell device by accepting an unprocessed substrate and performing multiple deposition, material removal, cleaning, bonding, and testing steps to form a complete functional and tested solar cell device. While the discussion below primarily describes the formation of a silicon thin film solar cell device, this configuration is not intended to limiting as to the scope of the invention since the apparatus and methods disclosed herein could also be used to form, test and analyze other types of solar cell devices made from materials, such as III-V type solar cells, thin film chalcogenide solar cells (e.g., CIGS, CdTe cells), amorphous or nanocrystalline silicon solar cells, photochemical type solar cells (e.g., dye sensitized), crystalline silicon solar cells, organic type solar cells or other similar solar cell devices.

The system is generally an arrangement of processing modules and automation equipment used to form solar cell devices that are interconnected by automated material handling system. In one embodiment, the system is a fully automated solar cell production line that is designed to reduce and/or remove the need for human interaction and/or labor intensive processing steps to improve the device reliability, process repeatability, and the solar cell formation process cost of ownership (CoO). In one configuration, the system is adapted to form a silicon thin film solar cell device and generally comprises a substrate receiving module, one or more cluster tools having at least one processing chamber that is adapted to deposit an absorbing layer on a surface of the substrate, one or more back contact deposition chambers, one or more material removal chambers, a solar cell encapsulation device, an autoclave module, a junction box attaching module, one or more quality assurance modules that are adapted to test and qualify the completely formed solar cell device, and a system controller that is adapted to control the components found within the system. The one or more quality assurance modules may include a solar simulator, parametric testing module, and a shunt bust and qualification module.

Figure 1:
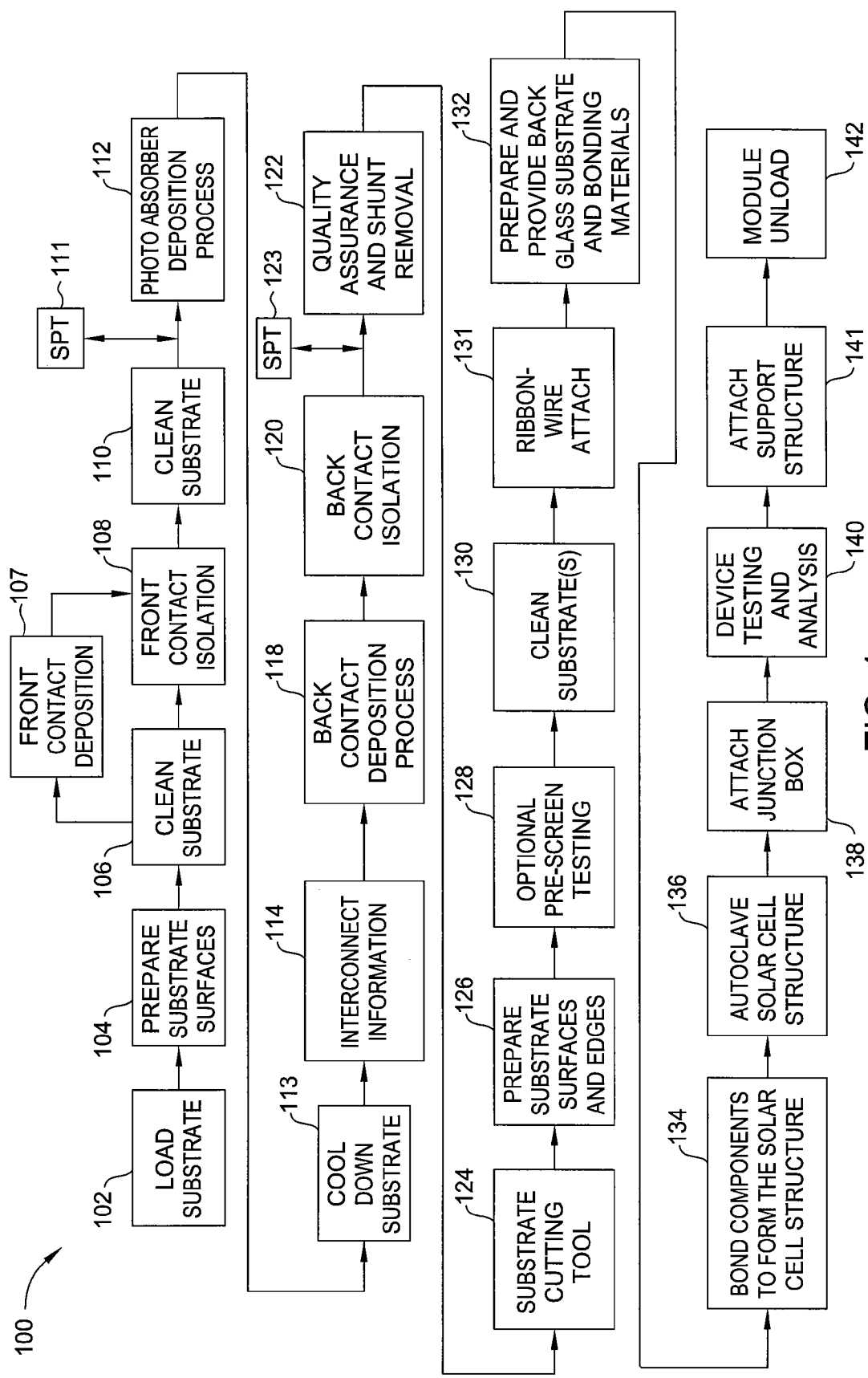
FIG. 1 illustrates a process sequence for forming a solar cell device according to one embodiment described herein.
Figure 2A:
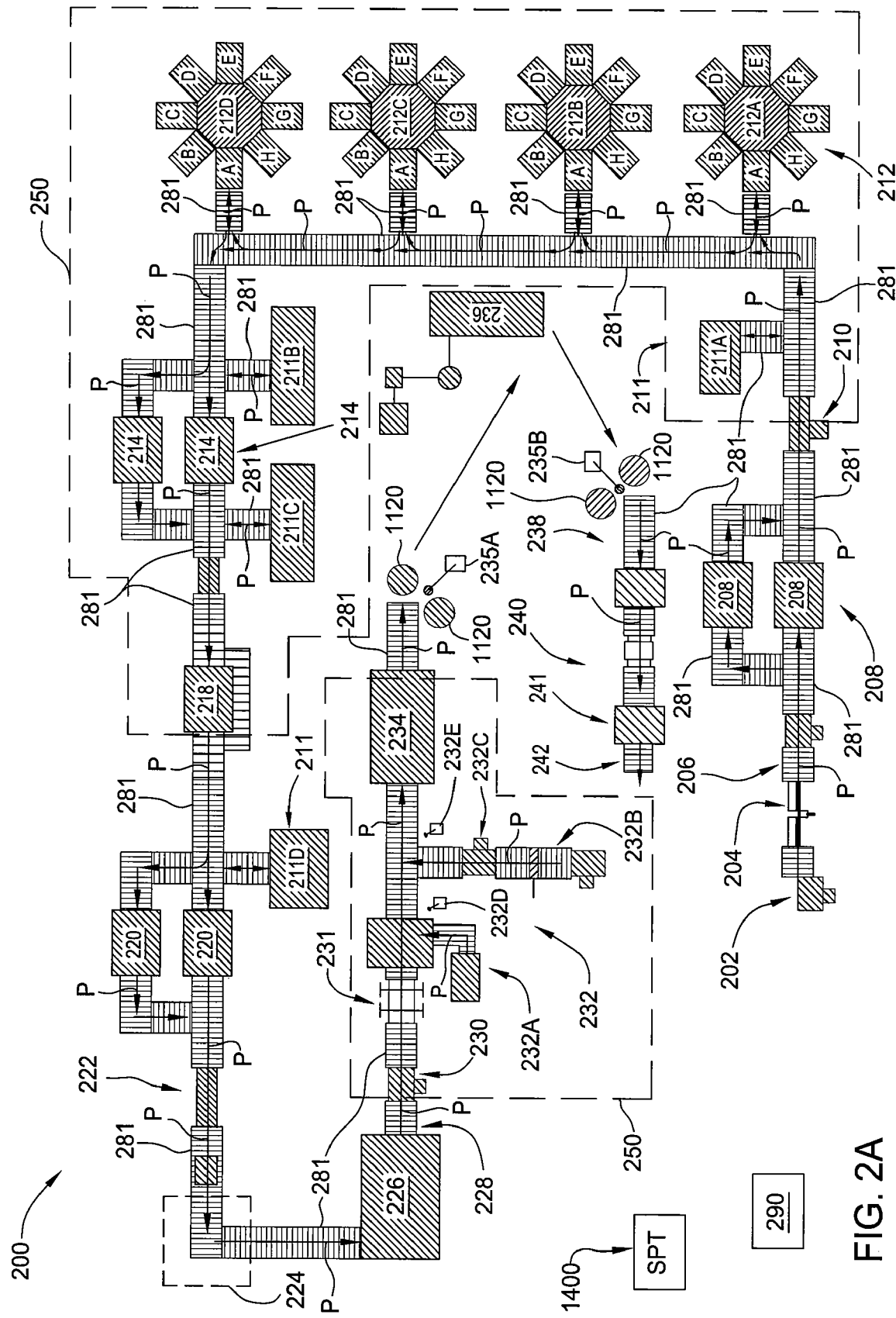
FIG. 2A illustrates a plan view of a solar cell production line according to one embodiment described herein.
Figure 2B:
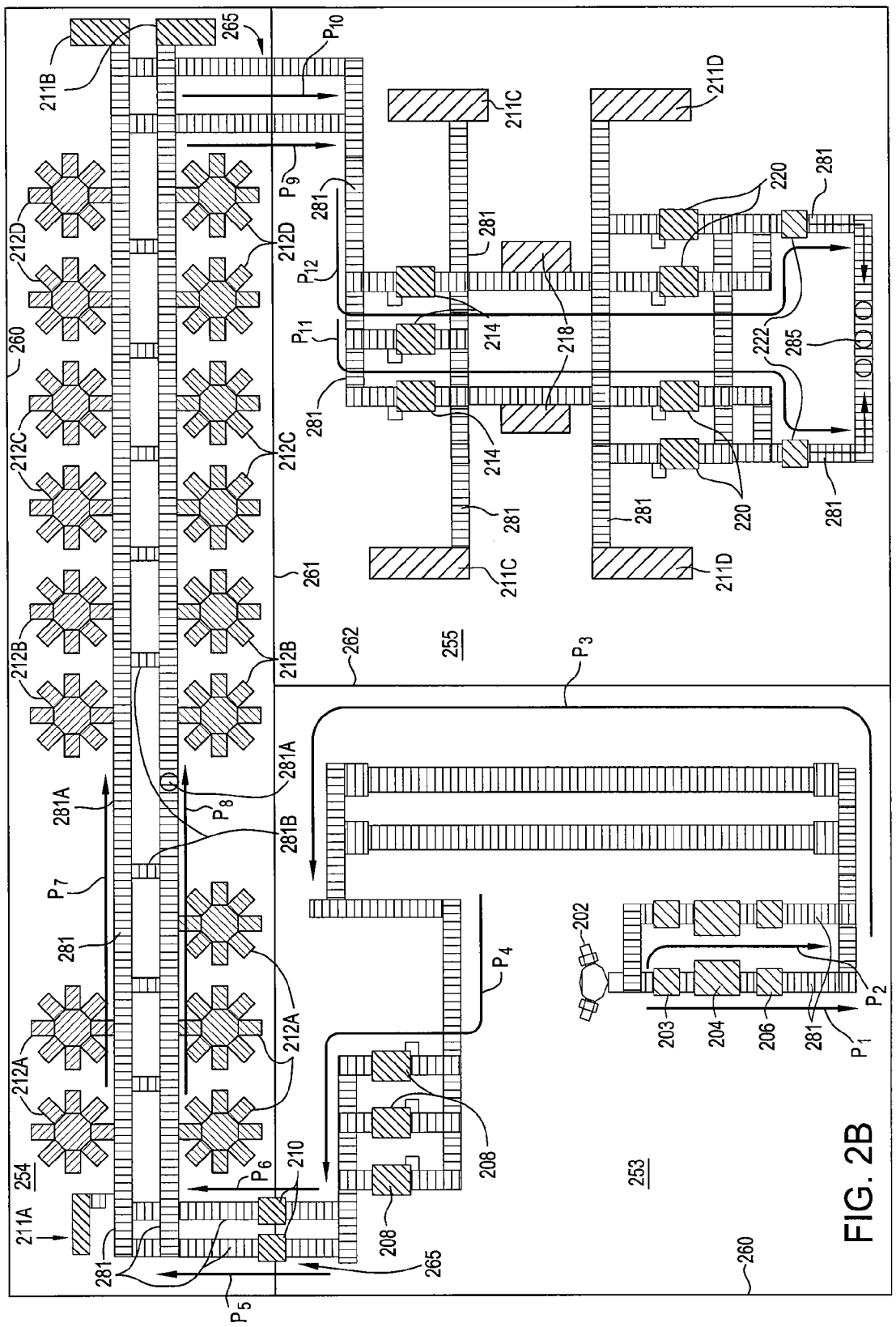
FIGS. 2B-2C are plan views of another solar cell production line configuration according to one embodiment described herein.
Figure 2C:
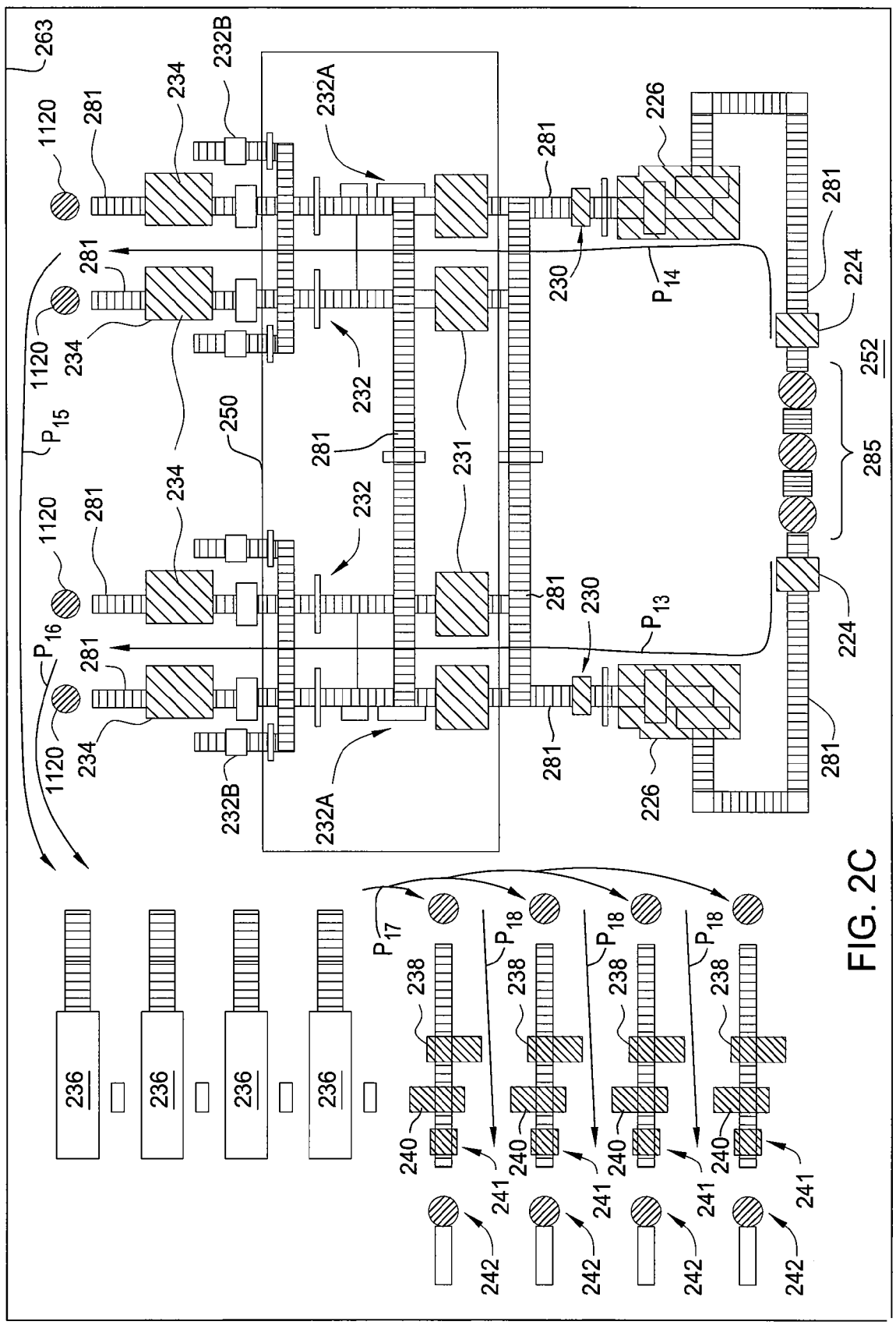

FIG. 1 illustrates one embodiment of a process sequence 100 that contains a plurality of steps (i.e., steps 102-142) that are each used to form a solar cell device using a novel solar cell production line 200 described herein. The configuration, number of processing steps, and order of the processing steps in the process sequence 100 is not intended to be limiting to the scope of the invention described herein. FIG. 2A is a plan view of one embodiment of the production line 200 which is intended to illustrate some of the typical processing modules and process flows through the system and other related aspects of the system design, and is thus not intended to be limiting to the scope of the invention described herein. FIGS. 2B-2C are plan views of another embodiment of the production line 200, which is configured in a different orientation.

In general, a system controller 290 may be used to control one or more components found in the solar cell production line 200. The system controller 290 is generally designed to facilitate the control and automation of the overall solar cell production line 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 290 determines which tasks are performable on a substrate. Preferably, the program is software readable by the system controller 290 that includes code to perform tasks relating to monitoring, execution and control of the movement, support, and/or positioning of a substrate along with the various process recipe tasks and various chamber process recipe steps being performed in the solar cell production line 200. In one embodiment, the system controller 290 also contains a plurality of programmable logic controllers (PLC's) that are used to locally control one or more modules in the solar cell production line 200, and a material handling system controller (e.g., PLC or standard computer) that deals with the higher level strategic movement, scheduling and running of the complete solar cell production line 200. An example of a system controller, distributed control architecture, and other system control structure that may be useful for one or more of the embodiments described herein can be found in the U.S. Provisional Patent Application Ser. No. 60/967,077, which has been incorporated by reference.

Figure 3A:
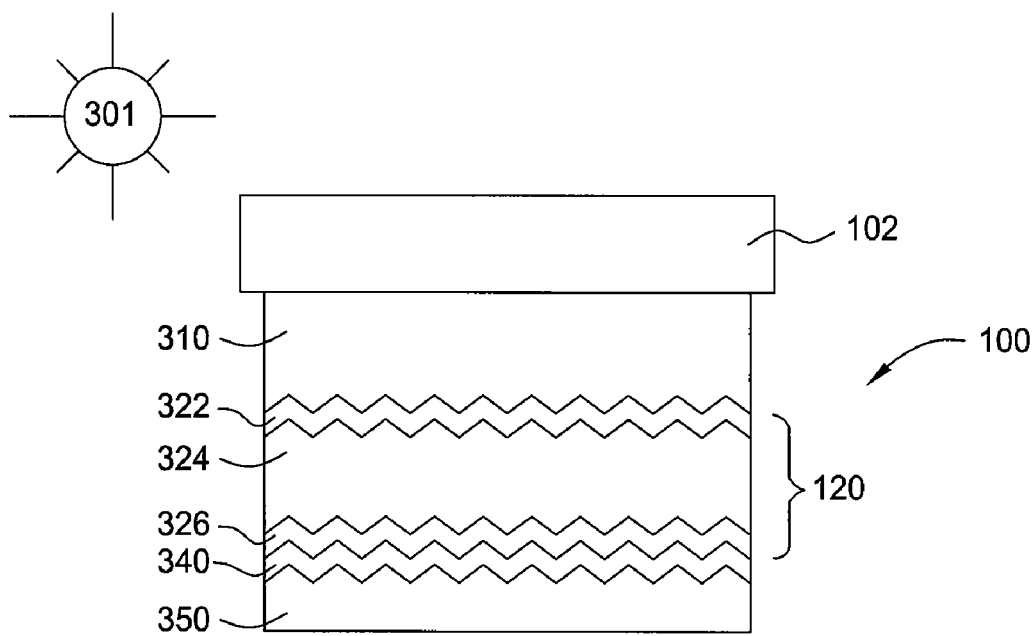
FIG. 3A is a side cross-sectional view of a thin film solar cell device according to one embodiment described herein.

Examples of a solar cell 300 that can be formed using the process sequence(s) illustrated in FIG. 1 and the components illustrated in the solar cell production line 200 are illustrated in FIGS. 3A-3E. FIG. 3A is a simplified schematic diagram of a single junction amorphous or micro-crystalline silicon solar cell 300 that can be formed and analyzed in the system described below. As shown in FIG. 3A, the single junction amorphous or micro-crystalline silicon solar cell 300 is oriented toward a light source or solar radiation 301. The solar cell 300 generally comprises a substrate 302, such as a glass substrate, polymer substrate, metal substrate, or other suitable substrate, with thin films formed thereover. In one embodiment, the substrate 302 is a glass substrate that is about 2200 mm×2600 mm×3 mm in size. The solar cell 300 further comprises a first transparent conducting oxide (TCO) layer 310 (e.g., zinc oxide (ZnO), tin oxide (SnO)) formed over the substrate 302, a first p-i-n junction 320 formed over the first TCO layer 310, a second TCO layer 340 formed over the first p-i-n junction 320, and a back contact layer 350 formed over the second TCO layer 340. To improve light absorption by enhancing light trapping, the substrate and/or one or more of thin films formed thereover may be optionally textured by wet, plasma, ion, and/or mechanical processes. For example, in the embodiment shown in FIG. 3A, the first TCO layer 310 is textured, and the subsequent thin films deposited thereover generally follow the topography of the surface below it. In one configuration, the first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å. The back contact layer 350 may include, but is not limited to a material selected from the group consisting of Al, Ag, Ti, Cr, Au, Cu, Pt, alloys thereof, and combinations thereof.

Figure 3B:
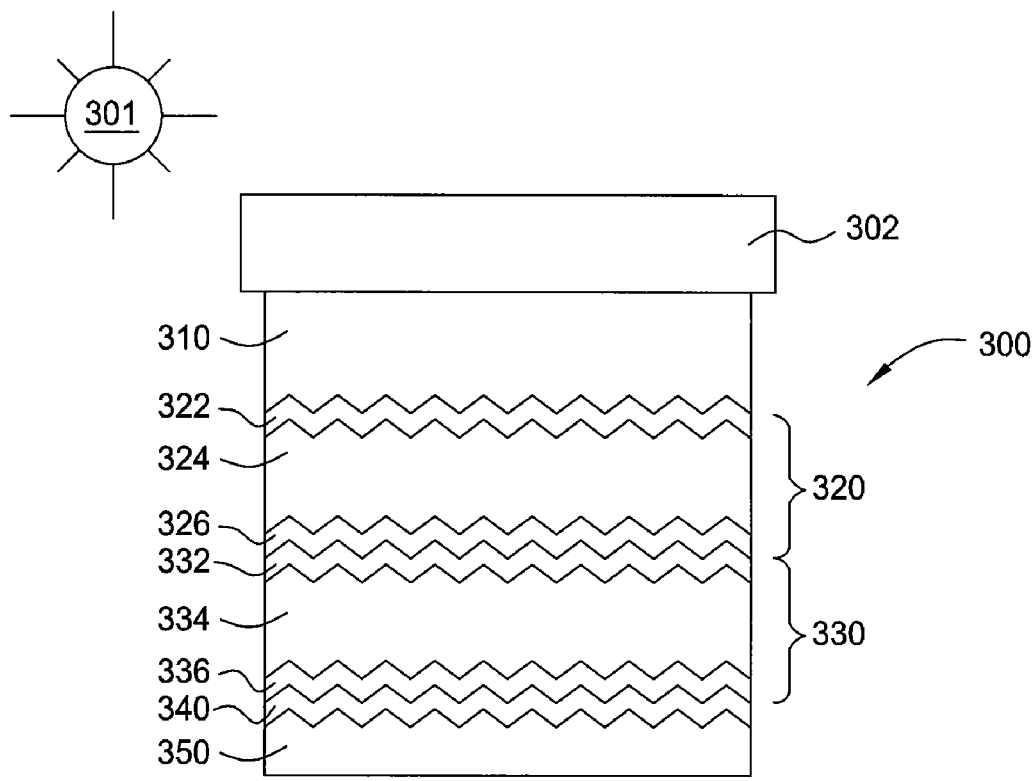
FIG. 3B is a side cross-sectional view of a thin film solar cell device according to one embodiment described herein.

FIG. 3B is a schematic diagram of an embodiment of a solar cell 300, which is a multi-junction solar cell that is oriented toward the light or solar radiation 301. Solar cell 300 comprises a substrate 302, such as a glass substrate, polymer substrate, metal substrate, or other suitable substrate, with thin films formed thereover. The solar cell 300 may further comprise a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a back contact layer 350 formed over the second TCO layer 340. In the embodiment shown in FIG. 3B, the first TCO layer 310 is textured, and the subsequent thin films deposited thereover generally follow the topography of the surface below it. The first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å. The second p-i-n junction 330 may comprise a p-type microcrystalline silicon layer 332, an intrinsic type microcrystalline silicon layer 334 formed over the p-type microcrystalline silicon layer 332, and an n-type amorphous silicon layer 336 formed over the intrinsic type microcrystalline silicon layer 334. In one example, the p-type microcrystalline silicon layer 332 may be formed to a thickness between about 100 Å and about 400 Å, the intrinsic type microcrystalline silicon layer 334 may be formed to a thickness between about 10,000 Å and about 30,000 Å, and the n-type amorphous silicon layer 336 may be formed to a thickness between about 100 Å and about 500 Å. The back contact layer 350 may include, but is not limited to a material selected from the group consisting of Al, Ag, Ti, Cr, Au, Cu, Pt, alloys thereof, and combinations thereof.

Figure 3C:
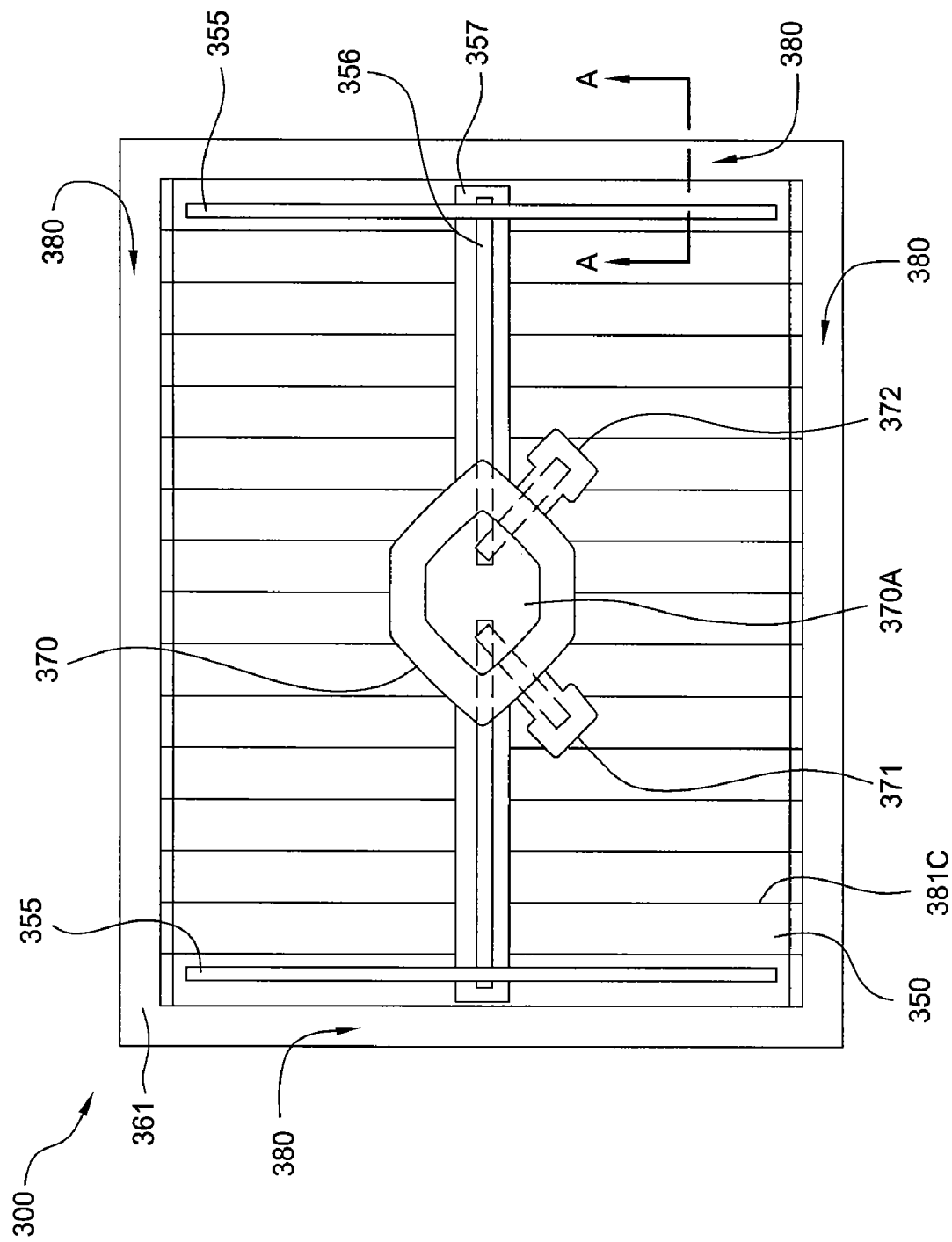
FIG. 3C is a plan view of a composite solar cell structure according to one embodiment described herein.
Figure 3D:
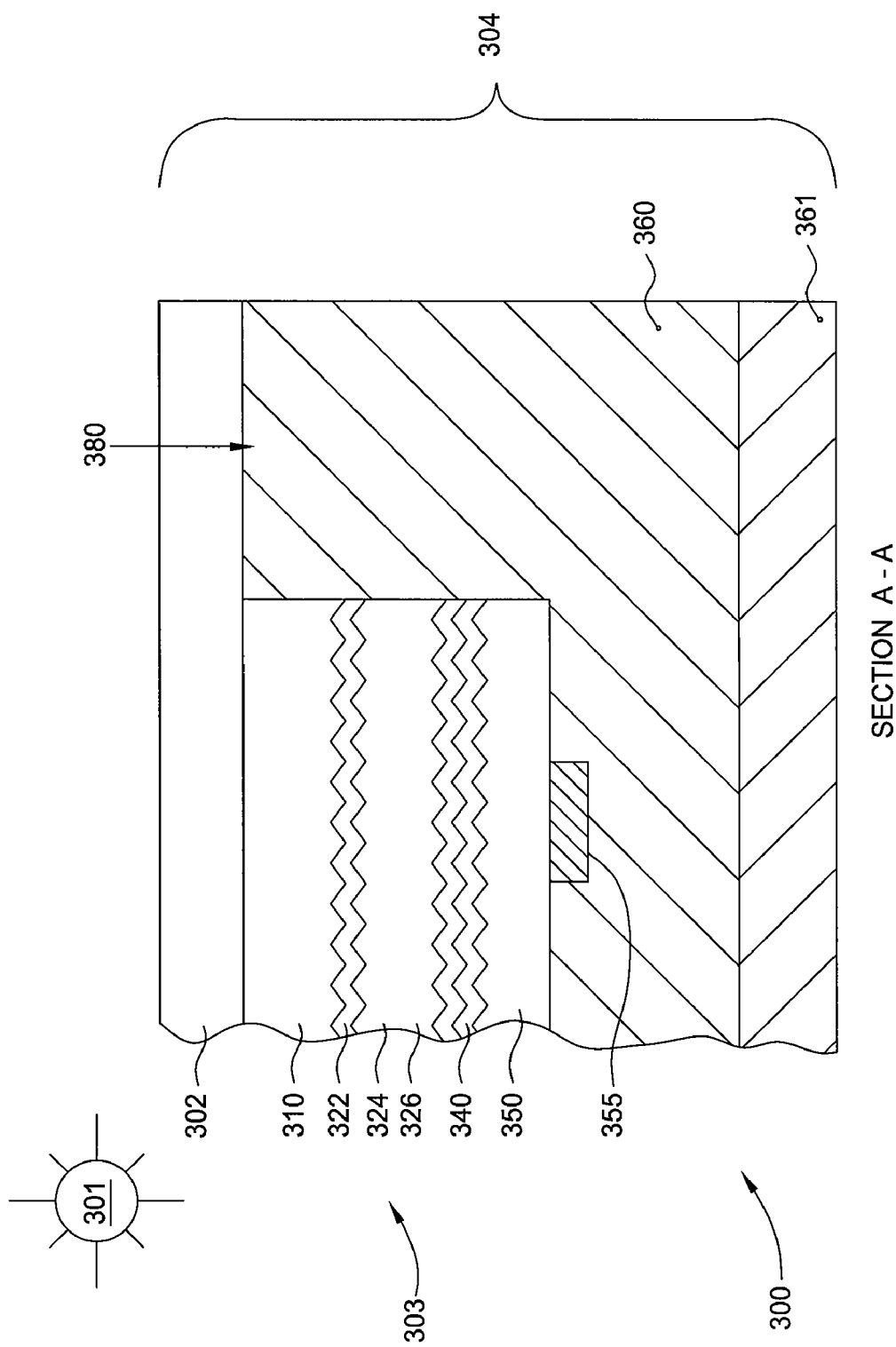
FIG. 3D is a side cross-sectional view along Section A-A of FIG. 3C.

FIG. 3C is a plan view that schematically illustrates an example of the rear surface of a formed solar cell 300 that has been produced in the production line 200. FIG. 3D is a side cross-sectional view of portion of the solar cell 300 illustrated in FIG. 3C (see section A-A). While FIG. 3D illustrates the cross-section of a single junction cell similar to the configuration described in FIG. 3A, this is not intended to be limiting as to the scope of the invention described herein.

As shown in FIGS. 3C and 3D, the solar cell 300 may contain a substrate 302, the solar cell device elements (e.g., reference numerals 310-350), one or more internal electrical connections (e.g., side buss 355, cross-buss 356), a layer of bonding material 360, back glass substrate 361, and junction box 370. The junction box 370 may generally contain two junction box terminals 371, 372 that are electrically connected to portions of the solar cell 300 through the side buss 355 and cross-buss 356 that are in electrical communication with the back contact layer 350 and active regions of the solar cell device. To avoid confusion relating to the actions specifically performed on the substrates 302 in the discussion below, a substrate 302 having one or more of the deposited layers (e.g., reference numerals 310-350) and/or one or more internal electrical connections (e.g., side buss 355, cross-buss 356) disposed thereon will be generally referred to as a device substrate 303. Similarly, where deemed appropriate, a device substrate 303 that has been bonded to a back glass substrate 361 using a bonding layer 360 will be referred to as a composite solar cell structure 304, for clarity reasons.

Figure 3E:
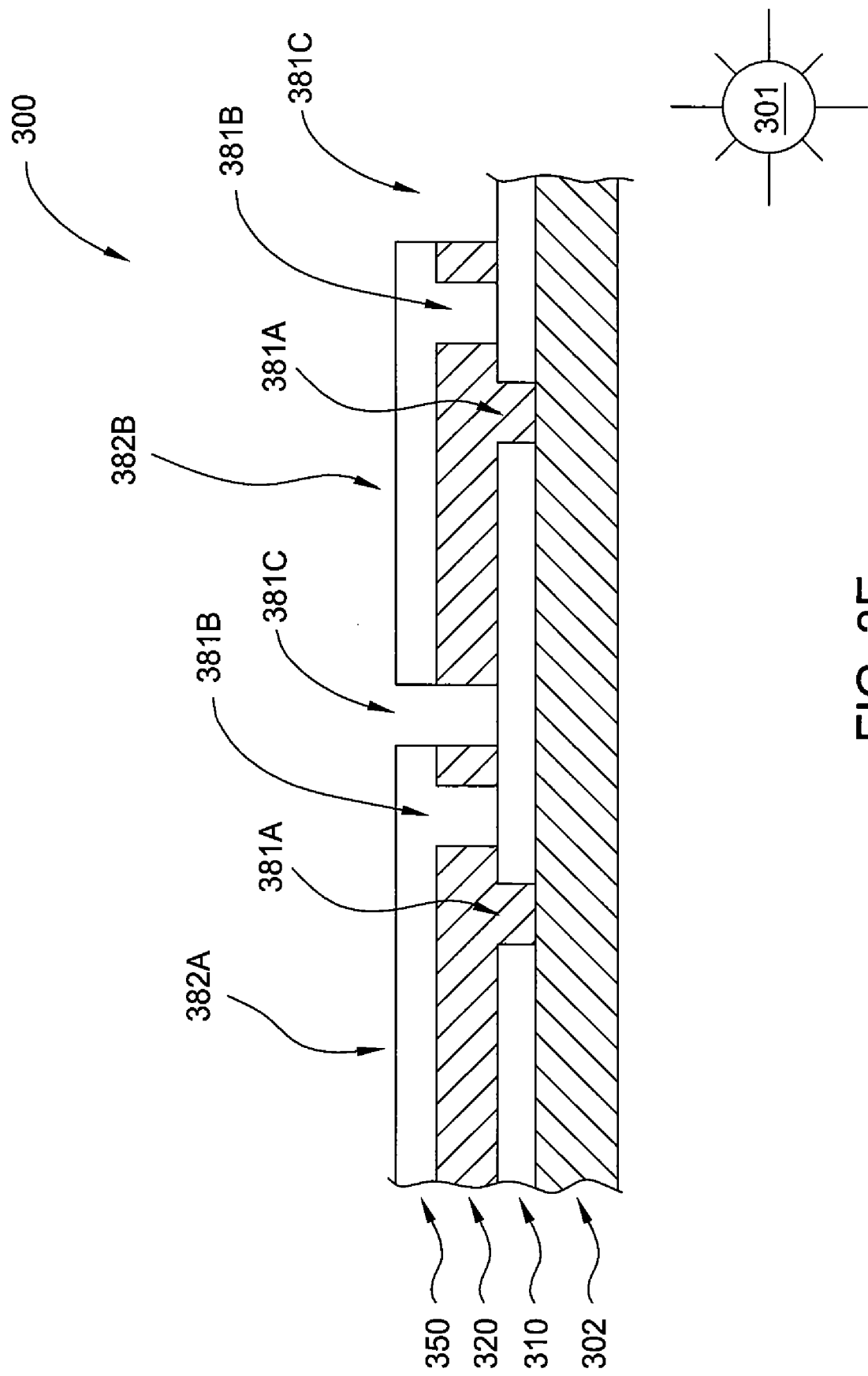
FIG. 3E is a side cross-sectional view of a thin film solar cell device according to one embodiment described herein.

FIG. 3E is a schematic cross-section of a solar cell 300 illustrating various scribed regions used to form individual cells 382A-382B within the solar cell 300. As illustrated in FIG. 3E, the solar cell 300 includes a transparent substrate 302, a first TCO layer 310, a first p-i-n junction 320, and a back contact layer 350. Three laser scribing steps may be performed to produce isolation grooves 381A, 381B, and 381C, which are generally required to form a high efficiency solar cell device. Although formed together on the substrate 302, the individual cells 382A and 382B are isolated from each other by the isolation groove 381C formed in the back contact layer 350 and the first p-i-n junction 320. In addition, the isolation groove 381B is formed in the first p-i-n junction 320 so that the back contact layer 350 is in electrical contact with the first TCO layer 310. In one embodiment, the isolation groove 381A is formed by the laser scribe removal of a portion of the first TCO layer 310 prior to the deposition of the first p-i-n junction 320 and the back contact layer 350. Similarly, in one embodiment, the isolation groove 381B is formed in the first p-i-n junction 320 by the laser scribe removal of a portion of the first p-i-n junction 320 prior to the deposition of the back contact layer 350. While a single junction type solar cell is illustrated in FIG. 3E, this configuration is not intended to be limiting to the scope of the invention described herein.

General Solar Cell Formation Process Sequence

Referring to FIGS. 1 and 2A, the process sequence 100 generally starts at step 102 in which a substrate 302 is loaded into the loading module 202 found in the solar cell production line 200. In one embodiment, the substrates are received in a "raw" state where the edges, overall size and/or cleanliness of the substrates are not well controlled. Receiving "raw" substrates reduces the cost to prepare and store substrates prior to forming a solar device and thus reduces the facilities costs and production costs of the formed solar cell device. However, typically, it is advantageous to receive "raw" substrates that have a transparent conducting oxide (TCO) layer (e.g., first TCO layer 310) already deposited on a surface of the substrate before it is received into the system in step 102. If a conductive layer, such as TCO layer, has not been deposited on the surface of the "raw" substrates then a front contact deposition step (step 107), which is discussed below, generally needs to be performed on a surface of the substrate.

In one embodiment, the substrates are loaded into the solar cell production line 200 in a sequential fashion, and thus do not use a cassette or batch style substrate loading and substrate movement system. Cassette style and/or batch loading type systems generally require the substrates to be un-loaded from the cassette, processed, and then returned to the cassette before moving to the next step in the process sequence. This style of grouping substrates is generally inefficient and decreases the solar cell production line throughput due to the increase in overhead required to move the substrates to and from the cassette, and transfer the cassette to multiple positions within the production line. The use of a batch style process sequence generally prevents the use of an asynchronous flow of substrates through the production line, which is believed to provide improved substrate throughput during steady state processing and when one or more modules are brought down for maintenance or due to a fault condition. Generally, batch or cassette based schemes are not able to achieve the throughput of the production line described herein, due to the inefficiency created by queuing the substrates, and loading and unloading of substrates from the cassette.

In the next step, step 104, the surfaces of the substrate are prepared to prevent yield issues later on in the process. In one embodiment of step 104, the substrate is inserted into front end substrate seaming module 204 that is used to prepare the edges of the substrate to reduce the likelihood of damage, such as chipping or particle generation from occurring during the subsequent processes. Damage to the substrate can affect device yield and the cost to produce a usable solar cell device. One embodiment, of a front end substrate seaming module 204 and a method of using the automated module is further discussed below in conjunction with FIG. 5. In one aspect, the front end substrate seaming module 204 is used to round or bevel the edges of the substrate. In one embodiment, a diamond impregnated belt or disc is used to grind the material from the edges of the substrate. In another embodiment, a grinding wheel, grit blasting or laser ablation technique is used to remove the material from the edges of the substrate.

Next the substrate is transported to the cleaning module 206 in which step 106, or substrate cleaning step, is performed on the substrate to remove any contaminants found on the surface of the substrate. Common contaminants may include materials deposited on the substrate during the substrate forming process and/or during shipping or storing of the substrates. Typically, the cleaning module 206 uses wet chemical scrubbing and rinsing steps to remove any undesirable contaminants. In one example, the process of cleaning the substrate may occur as follows. First, the substrate enters the contaminant removal section of the washer from either a transfer table or an automation device 281 (discussed below). In general, the system controller 290 establishes the timing for each substrate that enters the cleaning module 206. The contaminant removal section may utilize dry cylindrical brushes in conjunction with a vacuum system to dislodge and extract contaminants from the surface of the substrate. Next, a conveyor within the cleaning module 206 transfers the substrate to a pre-rinse section, where spray tubes dispense hot Di water at a temperature, for example, of 50° C. from a DI water heater onto a surface of the substrate. Commonly, since the substrate may have a TCO layer disposed thereon, and since TCO layers are generally electron absorbing materials, Di water is used to avoid any traces of possible contamination and ionizing of the TCO layer. Next, the rinsed substrate enters the wash section. In the wash section, the substrate is wet-cleaned with a brush (e.g., perlon) and hot water. In some cases a detergent (e.g., Alconox™, Citrajet™, Detojet™, Transene™, and Basic H™), surfactant, pH adjusting agent, and other cleaning chemistries are used to clean and remove unwanted contaminants and particles from the substrate surface. A water re-circulation system recycles the hot water flow. Next, in the final rinse section of the cleaning module 206, the substrate is rinsed with water at ambient temperature to remove any traces of the contaminants. Finally, in the drying section, an air blower is used to dry the substrate with hot air. In one configuration a deionization bar is used to remove the electrical charge from the substrate at the completion of the drying process. Contamination, in particular particles, on the TCO surface and/or on the bare glass surface can interfere with the subsequent laser scribing step(s). For example, if the laser beam runs across a particle, it may be unable to scribe a continuous line and a short circuit between cells will result. In addition, any particulate debris present in the scribed pattern and/or on the TCO of the cells after laser scribing can cause shunting and non-uniformities between layers. Therefore, a well-defined and well-maintained cleaning process is thus generally needed to ensure that contamination is removed. In general, the cleaning module 206 is available from the Energy and Environment Solutions division of Applied Materials in Santa Clara, Calif.

Referring to FIGS. 1 and 2A, in one embodiment, prior to performing step 108 the substrates are transported to a front end processing module (not illustrated in FIG. 2A) in which a front contact formation process, or step 107, is performed on the substrate. In one embodiment, the front end processing module is similar to the processing module 218 discussed below. In step 107, the one or more substrate front contact formation steps may include one or more preparation, etching and/or material deposition steps that are used to form the front contact regions on a bare solar cell substrate. In one embodiment, step 107 generally comprises one or more PVD deposition steps that are used to form the front contact region on a surface of the substrate. In another embodiment, one or more CVD deposition steps are used to form the front contact region on a surface of the substrate. In one embodiment, the front contact region contains a transparent conducting oxide (TCO) layer that may contain metal element selected from a group consisting of zinc (Zn), aluminum (Al), indium (In), and tin (Sn). In one example, a zinc oxide (ZnO) is used to form at least a portion of the front contact layer. In general, the front end processing module is an ATON™ PVD 5.7 tool available from Applied Materials in Santa Clara, Calif. in which one or more processing steps are performed to deposit the front contact formation steps.

Next the substrate is transported to the scribe module 208 in which step 108, or front contact isolation step, is performed on the substrate to electrically isolate different regions of the substrate surface from each other. In step 108, material is removed from the substrate surface by use of a material removal step, such as a laser ablation process or laser scribing process. The success criteria for step 108 are to achieve good cell-to-cell and cell-to-edge isolation, while minimizing the scribing area. In one embodiment, a Nd:vanadate (Nd:YVO$_4$) laser source is used ablate material from the substrate surface to form lines that electrically isolate one region of the substrate from the next. In one configuration, a laser scribe process performed during step 108 uses a 1064 nm wavelength pulsed laser to pattern the material disposed on the substrate to isolate each of the individual cells (e.g., reference numerals 382A and 382B) that make up the solar cell 300. As shown in FIG. 3E, in one example, the isolation groove 381A is formed in the first TCO layer 310 by use of a laser scribing process. In one embodiment, a 5.7 m$^2$ substrate laser scribe module available from Applied Materials, Inc. of Santa Clara, Calif. is used to provide simple reliable optics and substrate motion for accurate electrical isolation of regions of the substrate surface. In another embodiment, a water jet cutting tool or diamond scribe is used to isolate the various regions on the surface of the substrate. In one aspect, it is desirable to assure that the temperature of the substrates entering the scribe module 208 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

Next the substrate is transported to the cleaning module 210 in which step 110, or a pre-deposition substrate cleaning step, is performed on the substrate to remove any contaminants found on the surface of the substrate after performing the cell isolation step (step 108). Typically, the cleaning module 210 uses wet chemical scrubbing and rinsing steps to remove any undesirable contaminants found on the substrate surface after performing the cell isolation step. In one embodiment, a cleaning process similar to the processes described in step 106 above is performed on the substrate to remove any contaminants on the surface(s) of the substrate.

Next the substrate is transported to the processing module 212 in which step 112, or one or more photoabsorber deposition steps are performed on the substrate. In step 112, the one or more photoabsorber deposition steps may include one or more preparation, etching and/or material deposition steps that are used to form the various regions of the solar cell device. Step 112 generally comprises a series of sub-processing steps that are used to form one or more p-i-n junctions. An example of the sub-processing steps is discussed below in conjunction with FIGS. 4A-4B. In one embodiment, the one or more p-i-n junctions comprise amorphous silicon and/or microcrystalline silicon materials. In general, the one or more processing steps are performed in one or more processing chambers found in one or more cluster tools (e.g., cluster tools 212A-212D) contained in the processing module 212 that are used to form one or more layers in the solar cell device formed on the substrate. In one embodiment, in cases where the solar cell device is formed to include a multiple junctions, such as the tandem junction type of the solar cell 300 illustrated in FIG. 3B, the cluster tool 212A in the processing module 212 is adapted to form the first p-i-n junction 320 and at least one of the cluster tools 212B-212D are configured to form the second p-i-n junction 330. An example of a cluster tool and processing sequence used in the cluster tool, which can be used in the processing module 212, is further discussed below in conjunction with FIGS. 4A-4B. Information regarding the hardware and processing methods used to deposit one or more layers in the p-i-n junctions is further described in U.S. patent application Ser. No. 12/178,289, filed Jul. 23, 2008, and U.S. patent application Ser. No. 12/170,387, filed Jul. 9, 2008, which are both herein incorporated by reference.

Figure 6:
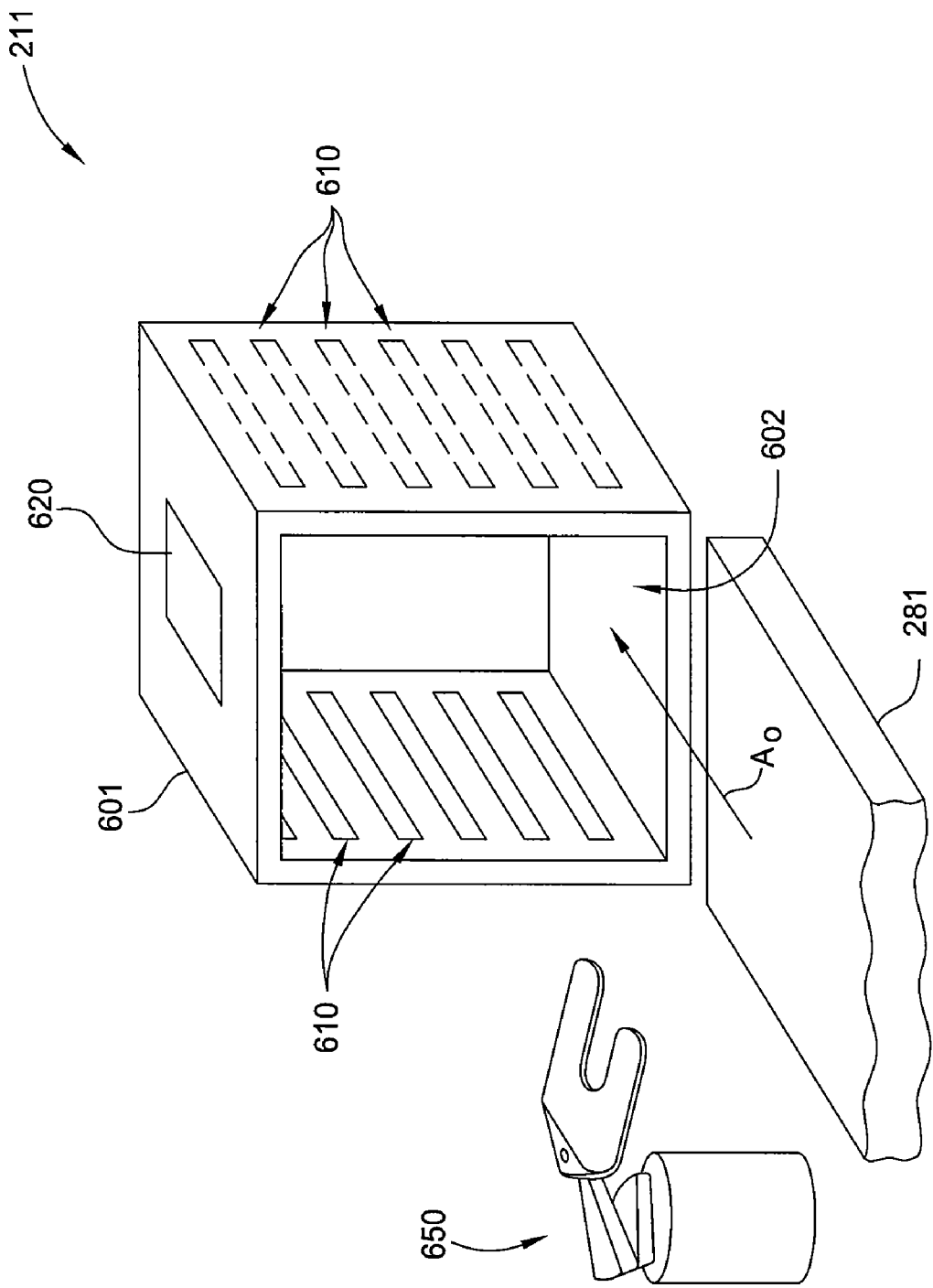
FIG. 6 is an isometric view of an accumulator module according to one embodiment described herein.

In one embodiment of the process sequence 100, a cool down step, or step 113, is performed after step 112 has been performed. The cool down step is generally used to stabilize the temperature of the device substrate 303 to assure that the processing conditions seen by each substrate in the subsequent processing steps are repeatable. Generally, the temperature of the device substrate 303 exiting the processing module 212 could vary by many degrees Celsius and exceed a temperature of about 50° C., which can cause variability in the subsequent processing steps and solar cell performance. In one embodiment, the cool down step is performed in one or more of the substrate supporting positions found in one or more accumulators 211, which are illustrated in FIG. 6. In one configuration of the production line, as shown in FIG. 2A, the processed substrates may be positioned in one of the accumulators 211B for a desired period of time to control the temperature of the substrate. In one embodiment, the system controller 290 is used to control the positioning, timing and movement of the substrates through the accumulator(s) 211 to control the temperature of the substrates before proceeding down stream through the production line. Referring to FIG. 6, in one embodiment, the accumulator 211 contains a body 601 that has a plurality of opposing shelves 610 positioned vertically within a holding region 602 that is positioned to receive a substrate from an automation device 281. The automation device 281, discussed further below, may comprise a conveyor, or robotic device, that is adapted to move and position a substrate on the opposing shelves 610 within the holding region 602. In one embodiment, a robot robotic device 650 is used to load and un-load the device substrates 303 from the holding region 602 and the automation device 281. In one embodiment, a temperature controlling device 620 is positioned within the accumulator 211 to actively control the temperature of the substrates retained in the holding region 602. The temperature controlling device 620 may contain heating and/or cooling elements, and air movement devices and filters positioned to control the temperature of the substrates in the holding region 602.

Next the substrate is transported to the scribe module 214 in which step 114, or the interconnect formation step, is performed on the substrate to electrically isolate various regions of the substrate surface from each other. In step 114, material is removed from the substrate surface by use of a material removal step, such as a laser ablation process. In one embodiment, a Nd:vanadate (Nd:YVO$_4$) laser source is used ablate material from the substrate surface to form lines that electrically isolate one solar cell from the next. In one embodiment, a 5.7 m$^2$ substrate laser scribe module available from Applied Materials, Inc. is used to perform the accurate scribing process. In one configuration, laser scribe process performed during step 108 uses a 532 nm wavelength pulsed laser to pattern the material disposed on the substrate 302 to isolate the individual cells that make up the solar cell 300. As shown in FIG. 3E, in one example, the isolation groove 381B is formed in the first p-i-n junction 320 layers by use of a laser scribing process. In another embodiment, a water jet cutting tool or diamond scribe is used to isolate the various regions on the surface of the solar cell. In one aspect, it is desirable to assure that the temperature of the substrates entering the scribe module 214 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

Next the substrate is transported to the processing module 218 in which one or more substrate back contact formation steps, or step 118, are performed on the device substrate 303. In step 118, the one or more substrate back contact formation steps may include one or more preparation, etching and/or material deposition steps that are used to form the back contact regions of the solar cell device. In one embodiment, step 118 generally comprises one or more PVD deposition steps that are used to form the back contact layer 350 on the surface of the substrate. In one embodiment, the one or more PVD deposition steps are used to form a back contact layer that contains a metal layer selected from a group consisting of zinc (Zn), tin (Sn), aluminum (Al), copper (Cu), silver (Ag), nickel (Ni) and vanadium (V). In one example, a zinc oxide (ZnO) or nickel vanadium alloy (NiV) are used to form at least a portion of the back contact layer. In another example, an aluminum (Al) and nickel vanadium alloy (NiV) are used to form at least a portion of the back contact layer. In general, the one or more processing steps are performed using an ATON™ PVD 5.7 tool available from Applied Materials in Santa Clara, Calif. In another embodiment, one or more CVD deposition steps are used to form the back contact region on a surface of the substrate.

Next the substrate is transported to the scribe module 220 in which step 120, or back contact isolation step, is performed on the device substrate 303 to electrically isolate the plurality of solar cells contained on the substrate surface from each other. In step 120, material is removed from the substrate surface by use of a material removal step, such as a laser ablation process. In one embodiment, a Nd:vanadate (Nd:YVO$_4$) laser source is used ablate material from the substrate surface to form lines that electrically isolate one solar cell from the next. In one embodiment, a 5.7 m$^2$ substrate laser scribe module, available from Applied Materials, Inc., is used to accurately scribe the desired regions of the substrate. In one configuration, laser scribe process performed during step 120 uses a 532 nm wavelength pulsed laser to pattern the material disposed on the substrate 302 to isolate the individual cells that make up the solar cell 300. As shown in FIG. 3E, in one example, the isolation groove 381C is formed in the first p-i-n junction 320 and back contact layer 350 by use of a laser scribing process. In one aspect, it is desirable to assure that the temperature of the substrates entering the scribe module 220 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

Next the substrate is transported to the quality assurance module 222 in which step 122, or quality assurance and/or shunt removal steps, are performed on the device substrate 303 to assure that the devices formed on the substrate surface meet a desired quality standard and in some cases correct defects in the formed device. In step 122, a probing device is used to measure the quality and material properties of the formed solar cell device by use of one or more substrate contacting probes. In one embodiment, the quality assurance module 222 projects a low level of light at the p-i-n junction(s) of the solar cell and uses the one more probes to measure the output of the cell to determine the electrical characteristics of the formed solar cell device(s). If the module detects a defect in the formed device it can take corrective actions to fix the defects in the formed solar cells on the substrate. In one embodiment, if a short or other similar defect is found, it may be desirable to create a reverse bias between regions on the substrate surface to control and/or correct one or more of the defectively formed regions of the solar cell device. During the correction process the reverse bias generally delivers a voltage high enough to cause the defects in the solar cells to be corrected. In one example, if a short is found between supposedly isolated regions of the substrate the magnitude of the reverse bias may be raised to a level that causes the conductive elements in areas between the isolated regions to change phase, decompose or become altered in some way to eliminate or reduce the magnitude of the electrical short. In one embodiment of the process sequence 100, the quality assurance module 222 and factory automation system are used together to resolve quality issues found in a formed substrate during the quality assurance testing. In one case, a substrate may be sent back upstream in the processing sequence to allow one or more of the fabrication steps to be re-performed on the substrate (e.g., back contact isolation step (step 120)) to correct one or more quality issues with the processed substrate.

Next, the substrate is optionally transported to the substrate cutting module 224 in which step 124, or substrate cutting step, is used to cut the substrate into a plurality of smaller substrates to form a plurality of smaller solar cell devices. In one embodiment of step 124, the substrate is inserted into edge deletion module 226 that uses a CNC glass cutting tool to accurately cut and section the substrate to form solar cell devices that are a desired size. In one embodiment, the solar cell production line 200 is adapted to accept (step 102) and process substrates that are 5.7 m$^2$ in size that eventually cut down to at least four 1.4 m$^2$ substrates during step 124. In one embodiment, the system is designed to process large substrates (e.g., 2200 mm×2600 mm×3 mm sized substrate (Gen. 8.5)) and produce various sized photovoltaic cells without additional equipment or processing steps. Currently amorphous silicon (a-Si) thin film factories must have one product line for each different size module. In one example, a Gen. 8.5 sized substrate 302 can be cut into half or quarter sized solar cells. In one embodiment, the production line 200 is able to quickly switch to manufacture different solar module sizes by use of commands sent from the system controller 290.

In one embodiment of the production line 200, the front end of the line (FEOL) (e.g., steps 102-122) is designed to process a large substrate (e.g., 2200 mm×2600 mm), and the back end of the line (BEOL) can use a large substrate or multiple smaller substrates formed by use of a sectioning process. In this configuration, the remainder of the manufacturing line can handle the various sizes. The flexibility in output with a single input is unique in the solar thin film industry and offers significant savings in capital expenditure. Moreover, the production line 200 is generally able to provide a high solar cell device throughput, which is typically measured in Mega-Watts per year, at a lower cost by forming solar cell devices on a single large substrate and then sectioning the substrate to form solar cells of a more preferable size. The throughput is increased since the process sequence is similar to processing multiple substrates, while eliminating the increased overhead time and increased cost associated with separately transferring, separately monitoring, and separately controlling the flow of the multiple substrates through the multiple processing chambers in the system. The material cost for the input glass is lower since customers are able to purchase a larger quantity of one glass size to produce the various size modules. In one embodiment, to achieve this goal, steps 102-122 can be configured to use equipment that is adapted to perform process steps on large substrates, such as 2200 mm×2600 mm×3 mm glass substrates, and steps 124 onward can be adapted to fabricate various smaller sized modules with no additional equipment required. In another embodiment, step 124 is positioned in the processing sequence 100 prior to step 122 so that the initially large substrate can be sectioned to form multiple individual solar cells that are then tested and characterized one at a time or as a group (i.e., two or more at a time). In this case, steps 102-121 can be configured to use equipment that is adapted to perform process steps on large substrates, such as 2200 mm×2600 mm×3 mm glass substrates, and steps 124 and 122 onward can be adapted to fabricate various smaller sized modules with no additional equipment required.

Referring back to FIGS. 1 and 2A, next the substrate is transported to edge deletion module 226 in which step 126, or substrate surface and edge preparation step, is used to prepare various surface of the substrate to prevent yield issues later on in the process. In one embodiment of step 126, the substrate is inserted into edge deletion module 226 that is used to prepare the edges of the substrate to reduce the likelihood of damage, such as chipping or particle generation from occurring during the subsequent processes. Damage to the substrate can affect device yield and the cost to produce a usable solar cell device. In another embodiment, the edge deletion module 226 is used to remove deposited material from the edge of the substrate (e.g., 10 mm) to provide a region that can be used to form a hermetic seal with the backside glass (i.e., steps 134-136 discussed below). Material removal from the edge of the substrate may also be useful to prevent electrical shorts in the final formed solar cell. In one embodiment, a diamond impregnated belt is used to grind the deposited material from the edge regions of the substrate. In another embodiment, a grinding wheel is used to grind the deposited material from the edge regions of the substrate. In yet another embodiment, grit blasting or laser ablation techniques are used to remove the deposited material from the edge of the substrate. In one aspect, the edge deletion module 226 is used to round or bevel the edges of the substrate by use of shaped grinding wheel, angled and aligned belt sanders, and/or abrasive wheel. One embodiment of a seamer/edge deletion module and method of using the seamer/edge deletion module is further discussed below in conjunction with FIGS. 8A-8C.

Next the substrate is transported to the pre-screen module 228 in which step 128, or optional pre-screen steps, is performed on the substrate to assure that the devices formed on the substrate surface meet a desired quality standard. In step 128, a light emitting source and probing device are used to measure the output of the formed solar cell device by use of one or more substrate contacting probes. If the module detects a defect in the formed device, it can take corrective actions, or the solar cell can be scrapped.

Next the substrate is transported to the cleaning module 230 in which step 130, or a pre-lamination substrate cleaning step, is performed on the substrate to remove any contaminants found on the surface of the substrates after performing steps 122-128. Typically, the cleaning module 230 uses wet chemical scrubbing and rinsing steps to remove any undesirable contaminants found on the substrate surface after performing the cell isolation step. In one embodiment, a cleaning process similar to the processes described in step 106 is performed on the substrate to remove any contaminants on the surface(s) of the substrate.

Next the substrate is transported to a bonding wire attach module 231 in which step 131, or a bonding wire attach step, is performed on the device substrate 303. Step 131 is used to attach the various wires/leads that are required to connect the various external electrical components to the formed solar cell device. Typically, the bonding wire attach module 231 is an automated wire bonding tool that is advantageously used to reliably and quickly form the numerous interconnects that are often required to form the large solar cells formed in the production line 200, which is discussed further below. In one embodiment, the bonding wire attach module 231 is used to form the side-buss 355 (FIG. 3C) and cross-buss 356 on the formed back contact region (step 118). In this configuration the side-buss 355 may be a conductive material that can be affixed, bonded and/or fused to the back contact layer 350 found in the back contact region to form a good electrical contact. In one embodiment, the side-buss 355 and cross-buss 356 each comprise a metal strip, such as copper tape, a nickel coated silver ribbon, a silver coated nickel ribbon, a tin coated copper ribbon, a nickel coated copper ribbon, or other conductive material that can carry the current delivered by the solar cell and be reliably bonded to the metal layer in the back contact region. In one embodiment, the metal strip is between about 2 mm and about 10 mm wide and between about 1 mm and about 3 mm thick. The cross-buss 356, which is electrically connected to the side-buss 355, can be electrically isolated from the back contact layer(s) of the solar cell by use of an insulating material 357, such as an insulating tape. The ends of each of the cross-busses 356 generally have one or more leads that are used to connect the side-buss and cross-buss to the electrical connections found in a junction box 370 which is used to connect the formed solar cell to the other external electrical components. For further information on soldering bus wire to thin film solar modules, please see U.S. Provisional Patent Application Ser. No. 60/967,077, U.S. Provisional Patent Application Ser. No. 61/023,810, and U.S. Provisional Patent Application Ser. No. 61/032,005, which is incorporated by reference herein. An embodiment of a bonding wire attach module and method of using the bonding wire attach module is further discussed below in conjunction with FIGS. 9A-9C.

In the next step, step 132, a bonding material 360 (FIG. 3D) and "back glass" substrate 361 are prepared for delivery into the solar cell formation process. The preparation process is generally performed in the glass lay-up module 232, which generally comprises a material preparation module 232A, a glass loading module 232B and a glass cleaning module 232C. The back glass substrate 361 is bonded onto the solar cell devices formed in steps 102-130 above by use of a laminating process (step 134 discussed below). In general, step 132 requires the preparation of a polymeric material that is to be placed between the back glass substrate 361 and the deposited layers on the device substrate 303 to form a hermetic seal to prevent the environment from attacking the solar cell during its life. Referring to FIG. 2A, step 132 generally comprises a series of sub-steps in which a bonding material is prepared in a material preparation module 232A, the bonding material 360 is then placed over the partially formed solar cell devices by a robot 232D, a back glass substrate 361 is loaded into the glass loading module 232B and is washed by use of a glass cleaning module 232C, and then the back glass substrate 361 is placed over the bonding material 360 and the device substrate 303 by use of a glass loading robot 232E.

In one embodiment, the material preparation module 232A is adapted to receive the bonding material 360 in a sheet form and perform one or more cutting operations to provide a bonding material, such as Polyvinyl Butyral (PVB) or Ethylene Vinyl Acetate (EVA) that is sized to form a reliable seal between the back glass substrate 361 and the solar cells formed on the device substrate 303. In general, when using bonding materials 360 that are polymeric, it is desirable to control the temperature (e.g., 16-18° C.) and relative humidity (e.g., RH 20-22%) of the solar cell production line 200 where the bonding material 360 is stored and integrated into the solar cell device to assure that the attributes of the bond formed in the bonding module 234 (discussed below) are repeatable and the dimensions of the polymeric material is stable. It is generally desirable to store the bonding material prior to use in temperature and humidity controlled area (e.g., T=6-8° C.; RH=20-22%). The tolerance stack up of the various components in the bonded device (Step 134) can be an issue when forming large solar cells. Therefore accurate control of the bonding material properties and tolerances of the cutting process are required to assure that a reliable hermetic seal is formed. In one embodiment, PVB may be used to advantage due to its UV stability, moisture resistance, thermal cycling, good US fire rating, compliance with Intl Building Code, low cost, and reworkable thermo-plastic properties. In one example, a 30 gauge or a 45 gauge PVB material sheet is used to bond the back glass substrate 361 to the device substrate 303. In one part of step 132, the bonding material is transported and positioned over the back contact layer 350 and side-buss 355 (FIG. 3C) and cross-buss 356 (FIG. 3C) elements of device substrate 303 using an automated robotic device. In one embodiment, a robot 232D, which can be a conventional robotic device (e.g., 6-axis robot), is used to pickup and place the bonding material 360 on the device substrate 303. The device substrate 303 and bonding material 360 are then positioned to receive a back glass substrate 361, which can be placed thereon by use of the same automated robotic device used to position the bonding material 360, or a second automated robotic device. In one embodiment, a glass loading robot 232E, which can be a conventional robotic device (e.g., 6-axis robot), is used to place the back glass substrate 361 on the device substrate 303 and bonding material 360.

In one embodiment, prior to positioning the back glass substrate 361 over the bonding material 360, one or more preparation steps are performed to the back glass substrate 361 to assure subsequent sealing processes and that a final solar product is desirably formed. In one case, the back glass substrate 361 is received in a "raw" state where the edges, overall size and/or cleanliness of the substrate are not well controlled. Receiving "raw" substrates reduces the cost to prepare and store substrates prior to forming a solar device and thus will reduce the solar cell device cost, facilities costs, and production costs of the finally formed solar cell device. In one embodiment of step 132, the back glass substrate 361 surfaces and edges are prepared in a seaming module (e.g., seamer 204) prior to performing the back glass substrate cleaning step. In the next sub-step of step 132 the back glass substrate is transported to the glass cleaning module 232C in which a substrate cleaning step is performed on the substrate to remove any contaminants found on the surface of the substrate. Common contaminants may include materials deposited on the substrate during the substrate forming process (e.g., glass manufacturing process) and/or during shipping of the substrates. Typically, the cleaning module 232C uses wet chemical scrubbing and rinsing steps to remove any undesirable contaminants as discussed above. The prepared back glass substrate is then positioned over the bonding material and device substrate 303 by use of an automated robotic device.

Next the device substrate 303, the back glass substrate 361, and the bonding material 360 are transported to the bonding module 234 in which step 134, or lamination steps are performed to bond the backside glass substrate to the solar cell devices formed in steps 102-130 discussed above. In step 134, a bonding material 360, such as Polyvinyl Butyral (PVB) or Ethylene Vinyl Acetate (EVA), is sandwiched between the backside glass substrate 361 and the solar cells, and heat and pressure is applied to the structure to form a bonded and sealed device using various heating elements and other devices found in the bonding module 234, which are discussed below. The device substrate 303, the back glass substrate 361 and bonding material 360 thus form a composite solar cell structure 304 (FIG. 3D) that at least partially encapsulates the active regions of the solar cell 300. In one embodiment, at least one hole formed in the back glass substrate 361 remains at least partially uncovered by the bonding material 360 to allow portions of the cross-buss 356 or the side buss 355 to remain exposed so that electrical connections can be made to these regions of the solar cell device in future steps (i.e., step 138). One embodiment of a bonding module 234 and method of using the bonding module 234 is further discussed below in conjunction with FIG. 10A.

Next the composite solar cell structure 304 is transported to the autoclave module 236 in which step 136, or autoclave steps are performed on the composite structure to remove trapped gasses in the bonded structure and assure that a good bond is formed during step 134. In step 134, a bonded structure is inserted in the processing region of the autoclave module where heat and high pressure gases are delivered to reduce the amount of trapped gas and improve the properties of the bond between the substrate 302, back glass substrate and bonding material 360. The processes performed in the autoclave are also useful to assure that the stress in the glass and bonding layer (e.g., PVB layer) are more controlled to prevent future failures of the hermetic seal or failure of the glass due to the stress induced during the bonding/lamination process. In one embodiment, it may be desirable to heat the substrate, back glass substrate 361 and bonding material 360 to a temperature that causes stress relaxation in the one or more of the components in the formed structure. One embodiment of an autoclave module 236 and method of using the autoclave module 236 is further discussed below in conjunction with FIG. 11.

Next the substrate is transported to the junction box attachment module 238 in which step 138, or junction box attachment steps, is performed on the formed solar cell device. The junction box attachment module 238 is used to install a junction box 370 (FIG. 3C) on a partially formed solar cell. The installed junction box 370 acts as an interface between the external electrical components that will connect to the formed solar cell, such as other solar cells or the power grid, and the internal electrical connections points, such as the leads, formed during step 131. In one embodiment, the junction box 370 contains one or more junction box terminals 371, 372 so that the formed solar cell can be easily and systematically connected to other external devices to deliver the generated electrical power. An embodiment of a junction box attachment module 238 and method of using the junction box attachment module 238 is further discussed below in conjunction with FIGS. 12A-12 B.

Next the substrate is transported to the device testing module 240 in which the step 140, or device screening and analysis steps, are performed on the substrate to assure that the devices formed on the substrate surface meet desired quality standards. In one embodiment, the device testing module 240 is a solar simulator module (discussed below) that is used to qualify and test the output of the one or more formed solar cells. In step 140, a light emitting source and probing device are used to measure the output of the formed solar cell device by use of one or more automated components that are adapted to make electrical contact with terminals in the junction box. If the module detects a defect in the formed device it can take corrective actions or the solar cell can be scrapped. An embodiment of a device testing module 240 and method of using the device testing module 240 is further discussed below in conjunction with FIGS. 13A-13B and FIGS. 14A-14D.

Next the substrate is transported to the support structure attachment module 241 in which the step 141, or support structure mounting steps, are performed on the composite solar cell structure 304 to form solar cell device that has one or more mounting elements fixedly attached to a non light receiving surface. The support structure attachment module 241 is thus used to form a complete solar cell device that can easily be mounted and rapidly installed at a customer's site. Conventional solar cell production lines require a significant amount of human interaction and assembly to position, mount and connect the various supporting elements to a solar cell 300 device so that they can be ready to be installed at the customer's site. An embodiment of a support structure attachment module 241 and method of using the support structure attachment module 241 is further discussed below in conjunction with FIGS. 15A-15B.

Next the substrate is transported to the unload module 242 in which step 142, or device unload steps are performed on the substrate to remove the formed solar cells from the solar cell production line 200. In this step the substrates may be received and packaged for shipping in an automated or semi-automated fashion.

In one embodiment of the solar cell production line 200, one or more regions in the production line are positioned in a clean room environment to reduce or prevent contamination from affecting the solar cell device yield and useable lifetime. In one embodiment, as shown in FIG. 2A, a class 10,000 clean room space 250 is placed around the modules used to perform steps 108-118 and steps 130-134.

Alternate Production Line Configuration

In an effort to increase the production capability of the production line 200 a configuration similar to the one shown in FIGS. 2B-2C can be used to provide multiple automated parallel flow paths to each interconnected processing module. FIGS. 2B and 2C are plan views of one embodiment of the production line 200 that can provide improved solar cell 300 throughput during normal processing and fault states, improved device yield, improved production line uptime, and an improved utilization of the land used to house production line 200 components. In general, the movement of substrates through the production line 200 illustrated in FIGS. 2B-2C is performed by use of multiple automation devices 281 that are adapted to transfer and position the substrates by use of commands sent by the system controller 290. The system controller 290 can thus be used to control the simultaneous movement of multiple substrates through the production line 200 to provide the optimum substrate throughput. Since the processing modules and processing steps used to form a solar cell using the production line 200 configuration shown in FIGS. 2B and 2C are similar to the processing modules and processing steps discussed above relating to FIGS. 1 and 2A, a review of each of the processing modules and processing steps will not be re-discussed here.

FIG. 2B is a plan view of a processing area 251 which contains processing modules (e.g., reference numerals 202, 204, 206, 210, 212, 214, 218, etc.) and automation devices 281 that are used to perform steps 102-122 described above in conjunction with FIG. 1. In one embodiment, the processing area 251, shown in FIG. 2B, is further segmented into three sub-processing areas 253-255 that are isolated from each other by the walls 260-262. The sub-processing areas 253-255 are configured to isolate the various regions of the production line 200 line to reduce cross-contamination between components contained within the production line, maintain desired particulate contamination levels in different areas of the production line, and reduce the chance of exposing all fab personnel to some of the hazardous chemicals and gasses that are used to form a solar cell 300. FIG. 2C is a plan view of a processing area 252 that is enclosed by the walls 263, and is generally positioned adjacent to processing area 251. Processing area 252 generally contains processing modules (e.g., reference numerals 224-242) and automation devices 281 that are adapted to perform steps 124-142, which are discussed above.

Referring to FIGS. 1 and 2B, the process sequence 100 generally starts at step 102 in which a "raw" substrate 302 is loaded into the loading module 202 found in the first sub-processing area 253 of the solar cell production line 200. Once loaded, the substrate 302 is then received by one or more of the automation devices 281 which are adapted to transfer the substrate 302 to the processing modules found in region 253A of the first sub-processing area 253. In one embodiment, the substrate 302 can be transferred and processed in either of the groups of processing modules positioned along paths $P_1$ or $P_2$. As shown in FIG. 2B, the groups of processing modules may include a dry cleaning module 203, a seaming module 204, and cleaning module 206, which are interconnected by the automation devices 281. In one embodiment, an optional front contact deposition module 207 is contained within region 253A to deposit the TCO layer 310 (FIG. 3A-3B) on a surface of the substrate 302. Alternately, as noted above, in one embodiment, the substrate 302 is delivered to the loading module 202 with a TCO layer 310 already formed on the surface of the substrate 302.

As shown in FIG. 2B, an optional dry cleaning module 203 is added into the processing sequence 100 to remove particulates and other contaminants from the surface of the substrate 302. The dry cleaning module 203 may comprise one or more brushes and/or gas delivery nozzles that are used to dislodge and remove contaminants from one or more surfaces of the substrate 302.

Next, the device substrate 303 is transferred from region 253A to the processing modules found in region 253B following path $P_3$ using the automation devices 281. In one embodiment, the device substrate 303 can be transferred and processed in any one of the scribing modules 208 following path $P_4$. In this configuration, the front contact isolation step 108 can be performed on multiple substrates in parallel to minimize the time that a substrate may be waiting to be processed in one of the scribing modules 208. In one embodiment, one or more of the automation devices 281 also contains one or more lifting conveyors 283 that are used to allow substrates upstream of a desired processing chamber to be delivered past a substrate that is blocking its movement to the desired processing chamber. In this way the movement of substrates to various processing chambers will not be impeded by other substrates waiting to be delivered to another processing chamber position.

Next, the device substrate 303 is transferred from the first sub-processing area 253 to the processing modules found in the second sub-processing area 254 following paths $P_5$ or $P_6$ by use of the automation devices 281. While transferring the substrate along paths $P_5$ or $P_6$ the device substrate 303 can be cleaned using the cleaning module 210 before entering the second sub-processing area 254. In one embodiment, second sub-processing area 254 is separated from the first sub-processing area 253 by the wall 261 that has openings 265 formed therein that allow the automation devices 281 to transfer substrates between the sub-processing areas 253 and 254, and sub-processing areas 254 and 255. In one embodiment, the device substrate 303 is then transferred to one or more of the cluster tools 212A-212D to receive one or more of the photoabsorbing layers. In one embodiment, the device substrate 303 is transferred to the accumulator 211A prior to being transferred to one or more of the cluster tools 212A-212D. The paths used to move a device substrate 303 to a cluster tool and/or between cluster tools can be greatly enhanced by configuring the automation devices 281 to allow a substrate to move along either of the parallel transferring paths $P_7$ or $P_8$ to a desired destination. To allow a transferred substrate to avoid being blocked by another stationary substrate positioned on an automation device, the automation devices 281A that are aligned along the paths $P_7$ or $P_8$ are also connected to cross-transferring automation devices 281B that allows a substrate to be moved between the automation devices 281A as needed. After being processed in one or more of the cluster tools 212A-212D the device substrate 303 may be transferred to one of the accumulator 211B prior to being transferred to third sub-processing area 255 of the processing area 251.

Next, the device substrate 303 is transferred from second sub-processing area 254 through the opening 265 in the wall 261 to the processing modules found in third sub-processing area 255 following paths $P_9$ or $P_{10}$ by use of the automation devices 281. The device substrate 303 is then transferred using one or more of the automation devices 281 to one of the scribing modules 214, contact deposition chambers 218, scribe modules 220, and quality assurance modules 222 that are positioned along path $P_{11}$ or path $P_{12}$. After performing the desired processing steps the device substrate is transferred to a transfer elevator 285 that links the third sub-processing area 255 in the processing area 251 with the processing area 252. The processing area 252 generally contains processing modules (e.g., reference numerals 224-242) and automation devices 281 that are used to perform steps 124-142 in the processing sequence 100. In one embodiment, the transfer elevator 285 is a conventional substrate transferring device that is adapted to transfer substrate between the processing area 251 and the processing area 252, which may be positioned at different vertical levels, such different floors of a multiple story building. Configuring the processing area 251 in a stacked vertical relationship with the processing area 252, has several advantages that may include the efficient use of land required to house the large components that are used to form 5.7 m² sized solar cells, and provide for the efficient delivery of consumable material to various adjacently positioned regions of the production line 200 contained in the processing areas 251 and 252 by use of linking material delivery components, such as elevators, conveyors and the like.

Next, the device substrate 303 is transferred from the transfer elevator 285 to the processing modules found in processing area 252 following paths $P_{13}$ or $P_{14}$ by use of the automation devices 281. The device substrate 303 is then transferred using one or more of the automation devices 281 to one of the substrate cutting module modules 224, edge deletion module 226, cleaning module 230, bonding wire attach module 231, glass lay-up module 232, and bonding modules 234 that are positioned along path $P_{13}$ or path $P_{14}$. After performing the desired processing steps the formed composite solar cell structure 304 is transferred to one of the autoclave modules 236 following paths $P_{15}$ or $P_{16}$.

After performing the autoclave process 136 the composite solar cell structure 304 is then transferred to next group of processing modules following path $P_{17}$. The composite solar cell structure 304 is then transferred to one of the junction box attachment modules 238, testing modules 240, support structure attachment module 241, and unload modules 242 that are positioned along path $P_{18}$. During the unload module processing step the substrates may be received and packaged for shipping in an automated or semi-automated fashion.

Front Seamer Module Design and Processes

The front end substrate seaming module 204 is generally used to prepare the edges of the substrate to reduce the likelihood of damage, such as chipping or particle generation from occurring during the subsequent solar cell formation processes. In one embodiment, one or more grinding wheels or a diamond impregnated belts are used to grind the material from the edges of the substrate. In yet another embodiment, grit blasting or laser ablation techniques are used to remove the material from the edges of the substrate.

Figure 5:
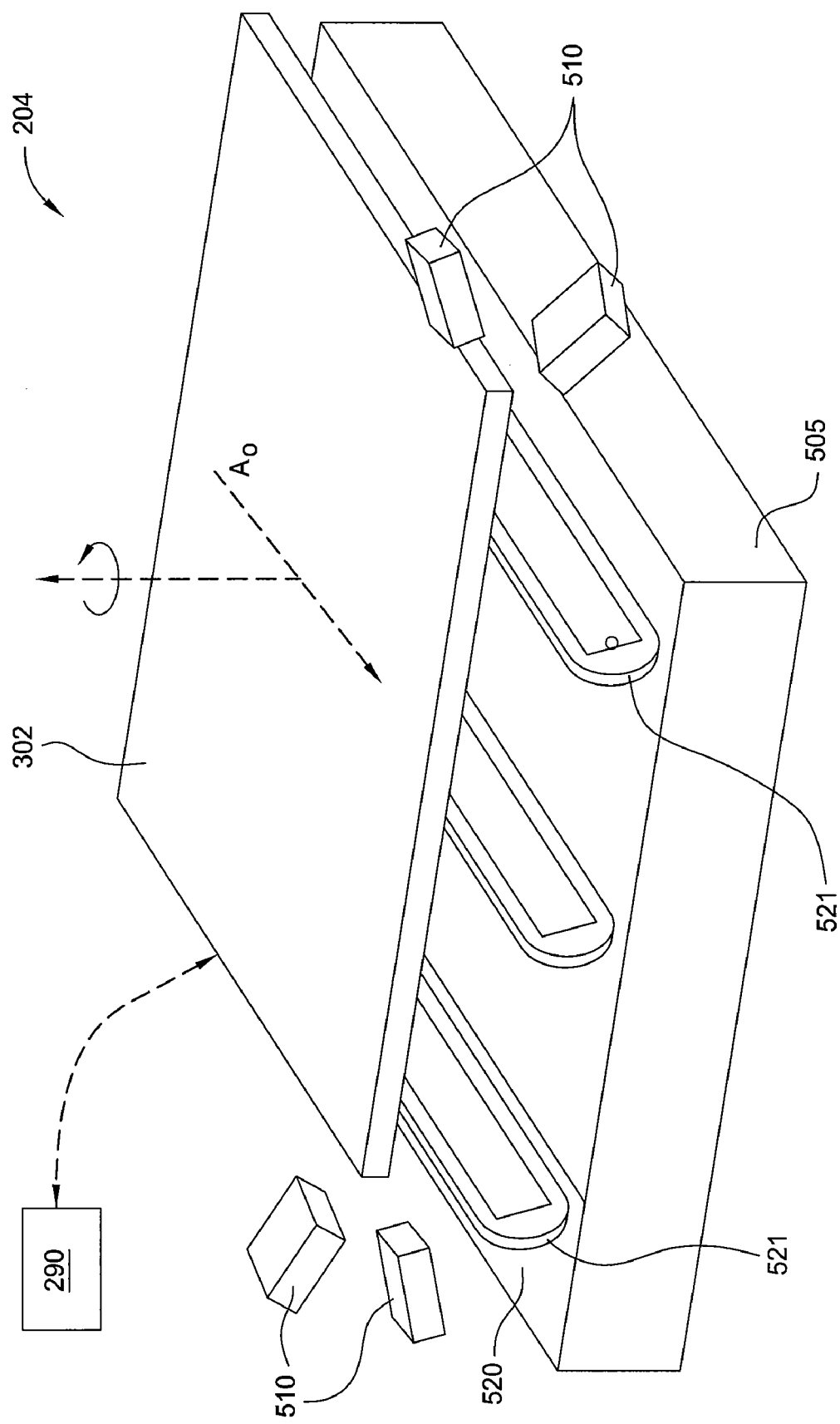
FIG. 5 illustrates a front substrate end seaming module according to one embodiment described herein.

FIG. 5 illustrates one embodiment of a front substrate end seaming module 204 that may be used to prepare the edges of the substrate (step 104), discussed above. The front substrate end seaming module 204 generally contains a plurality of edge seaming elements 510, a positioning system 520 and a supporting structure 505 that are used to shape or modify one or more of the edges of a substrate 302 as it is moved through the front substrate end seaming module 204 by the positioning system 520. In one embodiment, the edges and corners of the substrate 302 can be machined by moving the substrate 302 relative to abrasive elements found in the edge seaming elements 510. In one embodiment, the abrasive elements are grinding wheels or belts that can be positioned by use of actuating components found in each of the edge seaming elements 510. In one configuration, the substrate 302 is moved relative to the edge seaming elements 510 by use of one or more belts 521 that are moved by one or more rotary actuators (not shown) found in the positioning system 520. The positioning system 520 is adapted to receive the substrate from the automation components upstream of the front substrate end seaming module 204 and transfer the processed substrate to automation components connected to the other downstream processing modules following path "A$_o$" shown in FIG. 5.

Photoabsorber Deposition Processing Module(s) and Processing Sequence

Figure 4A:
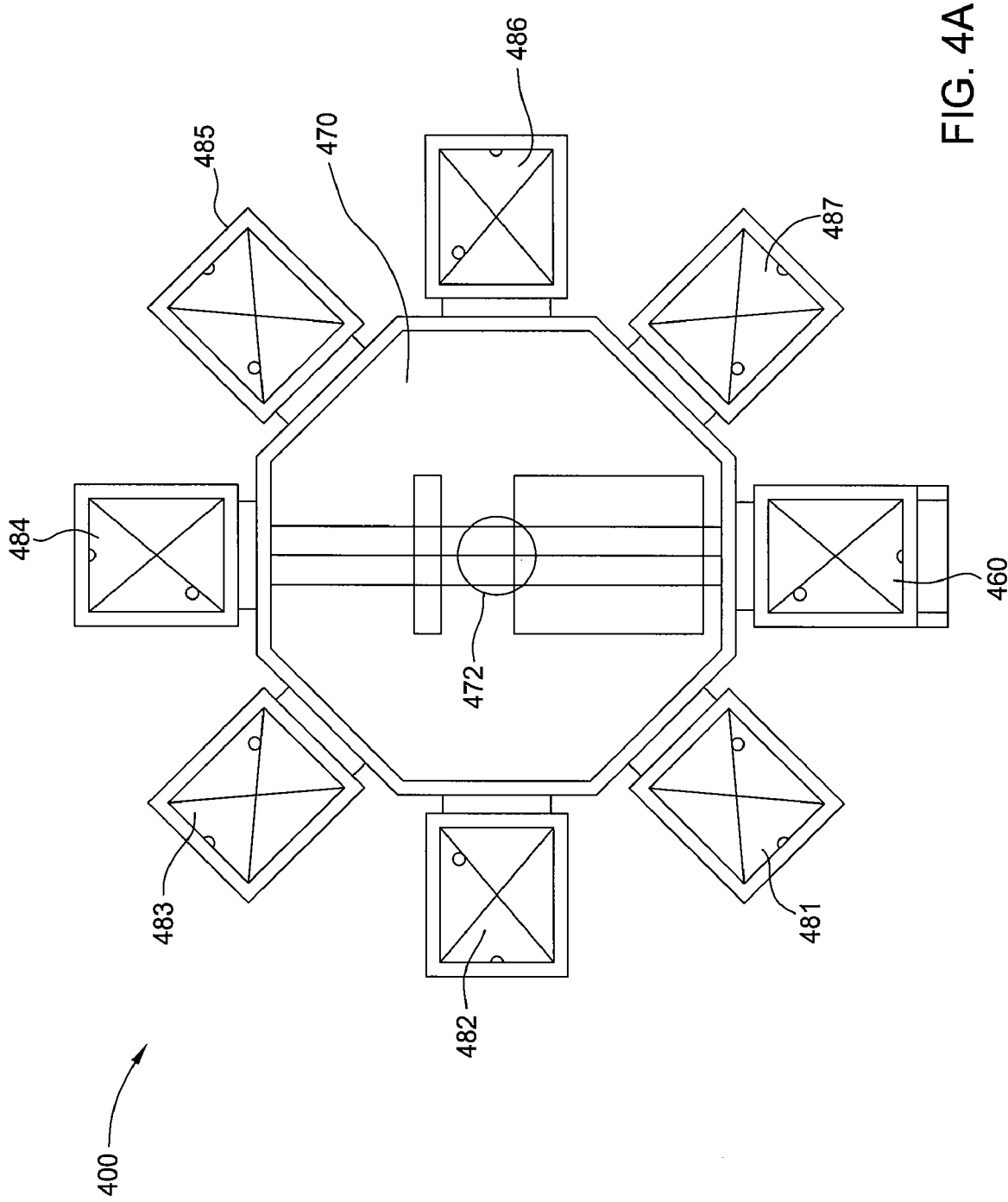
FIG. 4A illustrates a plan view of an cluster tool that may be used according to one embodiment described herein.
Figure 4B:
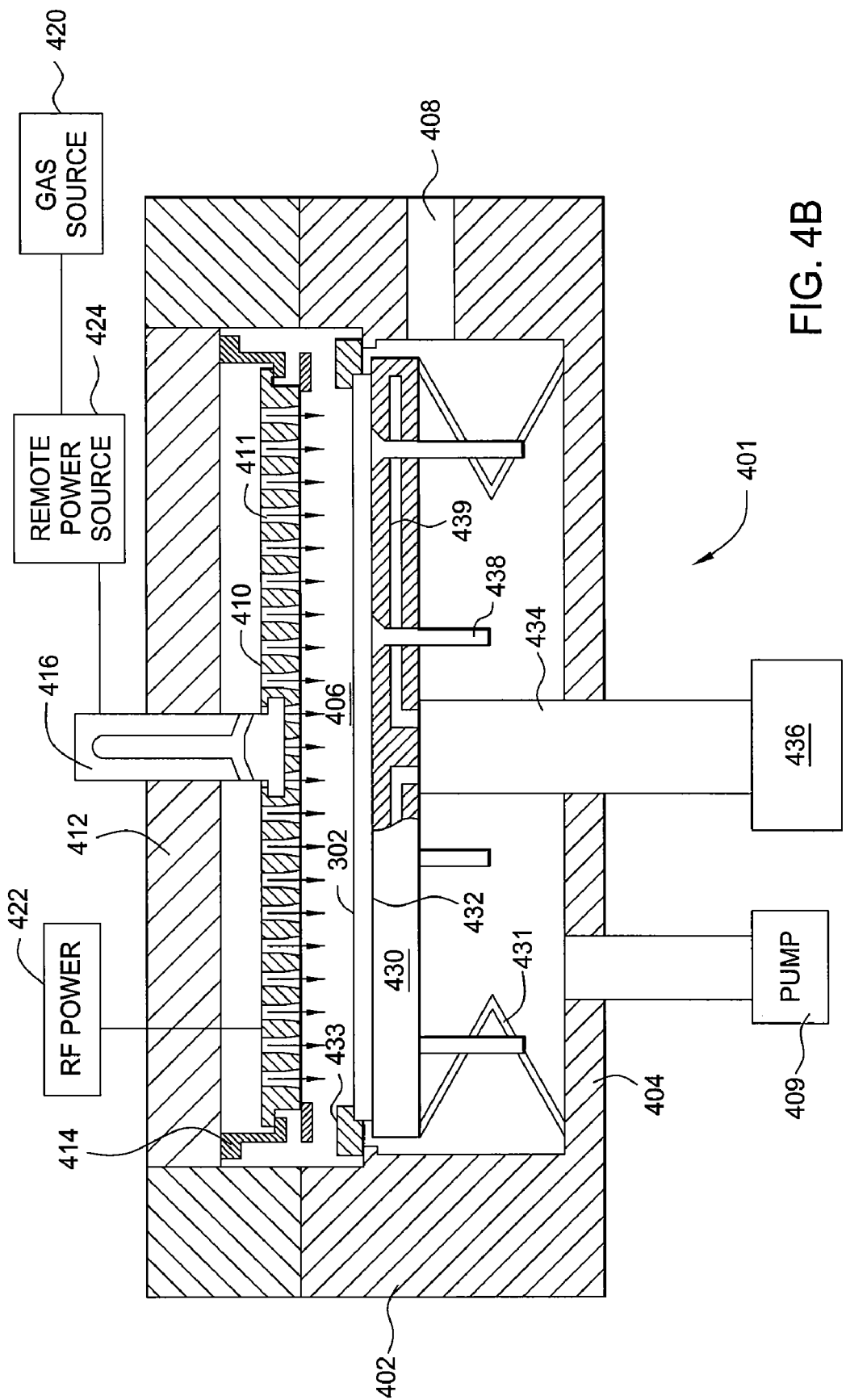
FIG. 4B is a side cross-sectional view of a deposition chamber according to one embodiment described herein.

FIGS. 4A-4B illustrate a processing system 400 and a processing chamber 401 that may be used to form a portion of the solar cell 300, discussed above. FIG. 4A is a top schematic view of one embodiment of a processing system 400, which may be one of the one or more cluster tools 212A-212D shown in the processing module 212 illustrated in FIG. 2A. The processing system 400 can thus be used to perform one or more processing steps that are used to form the various regions of the solar cell device. The processing system 400 will generally contain a plurality of process chambers 481-487, such as a plasma enhanced chemical vapor deposition (PECVD) chamber 401 (FIG. 4B), capable of depositing one or more desired layers on the substrate surface. The process system 400 includes a transfer chamber 470 coupled to a load lock chamber 460 (e.g., reference numeral "A" in cluster tools 212A-212D in FIG. 2A) and the process chambers 481-487 (e.g., reference numerals "B"-"H" in cluster tools 212A-212D in FIG. 2A). The load lock chamber 460 allows substrates to be transferred between the ambient environment outside the system and vacuum environment within the transfer chamber 470 and process chambers 481-487. The load lock chamber 460 includes one or more evacuatable regions holding one or more substrate. The evacuatable regions are pumped down during input of substrates into the system 400 and are vented during output of the substrates from the system 400. The transfer chamber 470 has at least one vacuum robot 472 disposed therein that is adapted to transfer substrates between the load lock chamber 460 and the process chambers 481-487. While seven process chambers are shown in FIG. 4A, the system 400 may have any suitable number of process chambers.

FIG. 4B is a schematic cross-section view of one embodiment of a processing chamber, such as a PECVD chamber 401 in which one or more films of a solar cell 300 may be deposited. One suitable plasma enhanced chemical vapor deposition chamber is available from Applied Materials, Inc., located in Santa Clara, Calif. It is contemplated that other deposition chambers, such as hot wire chemical vapor deposition (HWCVD), low pressure chemical vapor deposition (LPCVD), physical vapor deposition (PVD), evaporation, or other similar devices, including those from other manufacturers, may be utilized to practice the present invention. In one embodiment, the chamber 401 generally includes walls 402, a bottom 404, and a showerhead 410, and substrate support 430 which define a process volume 406. The process volume is accessed through a valve 408 such that the substrate, such as substrate 302, may be transferred in and out of the PECVD chamber 401. The substrate support 430 includes a substrate receiving surface 432 for supporting a substrate and stem 434 coupled to a lift system 436 to raise and lower the substrate support 430. A shadow frame 433 may be optionally placed over periphery of the device substrate 303 that may already have one or more layers formed thereon, for example, the TCO layer 310. Lift pins 438 are moveably disposed through the substrate support 430 to move a substrate to and from the substrate receiving surface 432. The substrate support 430 may also include heating and/or cooling elements 439 to maintain the substrate support 430 at a desired temperature. The substrate support 430 may also include grounding straps 431 to provide RF grounding at the periphery of the substrate support 430. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 410 is coupled to a backing plate 412 at its periphery by a suspension 414. The showerhead 410 may also be coupled to the backing plate by one or more center supports 416 to help prevent sag and/or control the straightness/curvature of the showerhead 410. A gas source 420 is coupled to the backing plate 412 to provide gas through the backing plate 412 and through the plurality of holes 411 in the showerhead 410 to the substrate receiving surface 432. A vacuum pump 409 is coupled to the PECVD chamber 401 to control the process volume 406 at a desired pressure. An RF power source 422 is coupled to the backing plate 412 and/or to the showerhead 410 to provide a RF power to the showerhead 410 so that an electric field is created between the showerhead and the substrate support so that a plasma may be generated from the gases between the showerhead 410 and the substrate support 430. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 20050251990 published on Nov. 17, 2006 to Choi et al., and U.S. Publication 2006/0060138 published on Mar. 23, 2006 to Keller et al, which are all incorporated by reference in their entirety to the extent not inconsistent with the present disclosure.

A remote plasma source 424, such as an inductively coupled remote plasma source, may also be coupled between the gas source and the backing plate. Between processing substrates, a cleaning gas may be provided to the remote plasma source 424 so that a remote plasma is generated and provided to clean chamber components. The cleaning gas may be further excited by the RF power source 422 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al, which is incorporated by reference to the extent not inconsistent with the present disclosure.

Referring back to FIG. 4A, in one embodiment of the system 400, one of the process chambers 481-487 is configured to deposit a p-type silicon layer(s) of a first p-i-n junction 320 or a second p-i-n junction 330 of a solar cell device, another one of the process chambers 481-487 is configured to deposit an intrinsic silicon layer of the first or the second p-i-n junction, and another of the process chambers 481-487 is configured to deposit the n-type silicon layer(s) of the first or the second p-i-n junction. While a three chamber process configuration may have some contamination control advantages, it will generally have a lower substrate throughput than a two chamber processing system, and generally cannot maintain a desirable throughput when one or more of the processing chambers is brought down for maintenance.

In certain embodiments of the invention, one of the one or more cluster tools 212A-212D (FIG. 2A) that is configured similarly to the system 400 (FIG. 4) is configured to form a first p-i-n junction having an intrinsic type amorphous silicon layer, such as the first p-i-n junction 320 illustrated in FIGS. 3A-3B. In one embodiment, one of the process chambers 481-487 is configured to deposit the p-type silicon layer(s) of the first p-i-n junction while the remaining process chambers 481-487 are each configured to deposit both the intrinsic type amorphous silicon layer(s) and the n-type silicon layer(s) of the first p-i-n junction. In one embodiment, the intrinsic type amorphous silicon layer(s) and the n-type silicon layer(s) of the first p-i-n junction 320 may be deposited in the same chamber without performing a passivation process, which is used to minimize cross-contamination between the deposited layers, in between the deposition steps. While the discussion of the processing system 400 and its components references its use in forming the various elements of the first p-i-n junction this configuration is not intended to be limiting as to the scope of the invention described herein, since the processing system 400 could be adapted to form the first p-i-n junction, the second p-i-n junction, both the first and second p-i-n junctions, or other combinations thereof without deviating from the basic scope of the invention described herein.

In one example, in which the substrate processing sequence performed in a system configured similarly to the processing system 400, a substrate enters the processing system 400 through the load lock chamber 460, the substrate is then transferred by the vacuum robot 472 into the process chamber 481 that is configured to deposit a p-type silicon layer(s) on the substrate, after depositing the p-type layer in process chamber 481 the substrate is then transferred by the vacuum robot 472 into the process chamber 484 that is configured to deposit both the intrinsic type silicon layer(s) and the n-type silicon layer(s), and then after depositing the intrinsic-type layer(s) and n-type layer(s) in process chamber 484 the substrate is returned to the load lock chamber 460 after which the substrate can be removed from the system. Assuming that the p-type layer is 150 Å in thickness and the deposition rate of 500 Å per minute, the period of time to deposit the p-type layer is approximately 0.3 minute. For an intrinsic layer of 2,700 Å at a deposition rate of 220 Å/min., the time period to deposit the intrinsic layer is approximately 12.3 minutes. Assuming an n-type layer of 250 Å at a deposition rate of 500 Å per minute it will require approximately 0.5 minute to deposit the n-type layer. It can therefore be seen that if one chamber is dedicated to deposition of a p-type layer and multiple chambers are dedicated to deposition of the intrinsic and n-type layers, an increased throughput of substrates can be realized by increasing the number processing chambers that can produce the i-n layers in parallel. That is, a continuous series of substrates can be loaded and maneuvered by the transfer chamber 470 from a process chamber that is adapted to deposit a p-type layer, such as process chamber 481, and then transfer each of the substrates to at least one subsequent processing chamber, such as process chambers 482 through 487 to form the i-n layers.

In a two chamber processing configuration, subsequent to deposition of the i-n layers in each of the chambers dedicated to producing the same, the process may be repeated. However, to preclude contamination being incorporated into the intrinsic layers formed on subsequent substrates, it has been found that performing a cleaning process, such as a seasoning process in each of the chambers dedicated to producing the i-n layers at some desired interval the device yield of the processing sequence can be improved. The seasoning process may generally comprises one or more steps that are used to remove prior deposited material from a processing chamber part and one or more steps that are used to deposit a material on the processing chamber part as discussed in accordance with one of the embodiments described herein. An example of a seasoning process and solar cell processing sequence that may be used in one or more of the components in the processing module 212 is further described in the U.S. patent application Ser. No. 12/170,387, filed Jul. 9, 2008, which is herein incorporated by reference.

Photoabsorber Deposition Example(s)

An example of deposition methods used to form one or more silicon layers, such as one or more of the silicon layers contained in the solar cell 300 of FIGS. 3A-3E in a process chamber similar to the PECVD chamber 401 are discussed below. A substrate having a surface area of 10,000 cm$^2$ or more, preferably 40,000 cm$^2$ or more, and more preferably 55,000 cm$^2$ or more is provided to the processing chamber. It is understood that after processing the substrate may be cut to form smaller solar cells.

In one embodiment, the heating and/or cooling elements 439 may be set to provide a substrate support temperature during deposition of about 400 degrees Celsius or less, preferably between about 100 degrees Celsius and about 400 degrees Celsius. The spacing during deposition between the top surface of a device substrate 303 disposed on the substrate receiving surface 432 and the showerhead 410 may be between 400 mil and about 1,200 mil, preferably between 400 mil and about 800 mil.

For deposition of silicon films, a silicon-based gas and a hydrogen-based gas are generally provided. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. Suitable hydrogen-based gases include, but are not limited to hydrogen gas ($H_2$). The p-type dopants of the p-type silicon layers may each comprise a group III element, such as boron or aluminum. Preferably, boron is used as the p-type dopant. Examples of boron-containing sources include trimethylboron (TMB (or $B(CH_3)_3$)), diborane ($B_2H_6$), $BF_3$, $B(C_2H_5)_3$, and similar compounds. Preferably, TMB is used as the p-type dopant. The n-type dopants of the n-type silicon layer may each comprise a group V element, such as phosphorus, arsenic, or antimony. Preferably, phosphorus is used as the n-type dopant. Examples of phosphorus-containing sources include phosphine and similar compounds. The dopants are typically provided with a carrier gas, such as hydrogen, argon, helium, and other suitable compounds. In the process regimes disclosed herein, a total flow rate of hydrogen gas is provided. Therefore, if a hydrogen gas is provided as the carrier gas, such as for the dopant, the carrier gas flow rate should be subtracted from the total flow rate of hydrogen to determine how much additional hydrogen gas should be provided to the chamber.

The following illustrates an example of a processing sequence that may be used to form a tandem cell, similar to the one illustrated in FIG. 3B, in the processing module 212 shown in FIG. 2A. In the first step, a substrate enters the cluster tool 212A through a load lock chamber "A", the substrate is then transferred by the vacuum robot into the process chamber "B" that is configured to deposit an amorphous p-type silicon layer(s) on the substrate. In one example, a p-type amorphous silicon layer, such as the p-type amorphous silicon layer 322, may formed over the TCO layer 310 formed on a substrate 302 by providing a gas mixture of hydrogen gas to silane gas in a ratio of about 20:1 or less. Silane gas may be provided at a flow rate between about 1 sccm/L and about 10 sccm/L. Hydrogen gas may be provided at a flow rate between about 5 sccm/L and 60 sccm/L. Trimethylboron may be provided at a flow rate between about 0.005 sccm/L and about 0.05 sccm/L. In other words, if trimethylboron is provided in a 0.5% molar or volume concentration in a carrier gas, then the dopant/carrier gas mixture may be provided at a flow rate between about 1 sccm/L and about 10 sccm/L. Methane may be provided at a flow rate between about 1 sccm/L and 15 sccm/L. An RF power between about 15 milliWatts/cm$^2$ and about 200 milliWatts/cm$^2$ may be provided to the showerhead. The pressure of the chamber is maintained between about 0.1 Torr and 20 Torr, preferably between about 1 Torr and about 4 Torr. The deposition rate of the p-type amorphous silicon layer may be about 100 Å/min or more. Methane or other carbon containing compounds, such $C_3H_8$, $C_4H_{10}$, $C_2H_2$, can be used to improve the window properties (e.g., to lower absorption of solar radiation) of p-type amorphous silicon layer. In the embodiment wherein trimethylboron is used to provide boron dopants in the p-type amorphous silicon layer 322, the boron dopant concentration is maintained at between about $1\times10^{18}$ atoms/cm$^2$ and about $1\times10^{20}$ atoms/cm$^2$. In the embodiment wherein the methane gas is used to provide to form the p-type layer as a silicon carbide layer, the carbon dopant concentration is controlled between about 10 atomic percent and about 20 atomic percent of the layer.

In the next step, after depositing the p-type amorphous layer on a surface of the substrate, the substrate is then transferred by the vacuum robot from process chamber "B" to process chamber "C" which is configured to deposit an amorphous i-type silicon layer and an microcrystalline n-type silicon layer on the substrate. In one example, an intrinsic type amorphous silicon layer, such as the intrinsic type amorphous silicon layer 324 of FIG. 3B, is formed over the p-type amorphous silicon layer 322 by providing a gas mixture of hydrogen gas to silane gas in a ratio of about 20:1 or less. Silane gas may be provided at a flow rate between about 0.5 sccm/L and about 7 sccm/L. Hydrogen gas may be provided at a flow rate between about 5 sccm/L and 60 sccm/L. An RF power between 15 milliWatts/cm$^2$ and about 250 milliWatts/cm$^2$ may be provided to the showerhead. The pressure of the chamber may be maintained between about 0.1 Torr and 20 Torr, preferably between about 0.5 Torr and about 5 Torr. The deposition rate of the intrinsic type amorphous silicon layer may be about 100 Å/min or more. In an exemplary embodiment, the intrinsic type amorphous silicon layer is deposited at a hydrogen to silane ratio at about 12.5:1.

Next, while the substrate is still positioned in process chamber "C" a microcrystalline n-type silicon layer is deposited on the amorphous intrinsic layer formed on the substrate. In one example, the n-type microcrystalline silicon layer, such as the n-type microcrystalline silicon layer 326 of FIG. 3B, may be formed over the intrinsic type amorphous silicon layer 324 by providing a gas mixture of hydrogen gas to silane gas in a ratio of about 100:1 or more. Silane gas may be provided at a flow rate between about 0.1 sccm/L and about 0.8 sccm/L, such as about 0.35 sccm/L. Hydrogen gas may be provided at a flow rate between about 30 sccm/L and about 250 sccm/L, such as about 71.43 sccm/L. Phosphine may be provided at a flow rate between about 0.0005 sccm/L and about 0.006 sccm/L. In other words, if phosphine is provided in a 0.5% molar or volume concentration in a carrier gas, then the dopant/carrier gas may be provided at a flow rate between about 0.1 sccm/L and about 1.2 sccm/L. An RF power between about 100 milliWatts/cm$^2$ and about 900 milliWatts/cm$^2$ may be provided to the showerhead. The pressure of the chamber may be maintained between about 1 Torr and about 100 Torr, preferably between about 3 Torr and about 20 Torr. The deposition rate of the n-type microcrystalline silicon layer may be about 50 Å/min or more. The n-type microcrystalline silicon layer has a crystalline fraction between about 20 percent and about 80 percent, preferably between 50 percent and about 70 percent. In the embodiment wherein phosphine is used to provide phosphorous dopants in the n-type microcrystalline silicon layer, the phosphorous dopant concentration is maintained at between about $1\times10^{18}$ atoms/cm$^2$ and about $1\times10^{20}$ atoms/cm$^2$.

In the next step, the substrate is transferred from cluster tool 212A to another cluster tool (i.e., reference numeral 212B-212D) found in the processing module 212 using one or more automation devices 281. In one example, the substrate is delivered through a load lock chamber "A" to the process chamber "B" contained in cluster tool 212B so that a microcrystalline p-type silicon layer(s) can be disposed over the layers formed substrate in the previous steps. In one example, the p-type microcrystalline silicon layer, such as p-type microcrystalline silicon layer 332 of FIG. 3B, is formed over the n-type microcrystalline silicon layer 326 by providing a gas mixture of hydrogen gas to silane gas in a ratio of about 200:1 or greater. Silane gas may be provided at a flow rate between about 0.1 sccm/L and about 0.8 sccm/L. Hydrogen gas may be provided at a flow rate between about 60 sccm/L and about 500 sccm/L. Trimethylboron may be provided at a flow rate between about 0.0002 sccm/L and about 0.0016 sccm/L. In other words, if trimethylboron is provided in a 0.5% molar or volume concentration in a carrier gas, then the dopant/carrier gas mixture may be provided at a flow rate between about 0.04 sccm/L and about 0.32 sccm/L. An RF power between about 50 milliWatts/cm$^2$ and about 700 milliWatts/cm$^2$ may be provided to the showerhead. The pressure of the chamber may be maintained between about 1 Torr and about 100 Torr, preferably between about 3 Torr and about 20 Torr. The deposition rate of the p-type microcrystalline silicon layer may be about 10 Å/min or more. The p-type microcrystalline silicon layer has a crystalline fraction between about 20 percent and about 80 percent, preferably between 50 percent and about 70 percent. In the embodiment wherein trimethylboron is used to provide boron dopants in the p-type microcrystalline silicon layer, the boron dopant concentration is maintained at between about $1\times10^{18}$ atoms/cm$^2$ and about $1\times10^{20}$ atoms/cm$^2$.

In the next step, after depositing the p-type microcrystalline layer the substrate is then transferred by the vacuum robot positioned in the cluster tool 212B from process chamber "B" to process chamber "C" that is configured to deposit an intrinsic type microcrystalline silicon layer and an n-type amorphous silicon layer on the substrate. In one example, an intrinsic type microcrystalline silicon layer, such as intrinsic type microcrystalline silicon layer 334 of FIG. 3B, is formed over the p-type microcrystalline silicon layer 332 by providing a gas mixture of silane gas to hydrogen gas in a ratio between 1:20 and 1:200. Silane gas may be provided at a flow rate between about 0.5 sccm/L and about 5 sccm/L. Hydrogen gas may be provided at a flow rate between about 40 sccm/L and about 400 sccm/L. In certain embodiments, the silane flow rate may be ramped up from a first flow rate to a second flow rate during deposition. In certain embodiments, the hydrogen flow rate may be ramped down from a first flow rate to a second flow rate during deposition. An RF power between about 300 milliWatts/cm$^2$ or greater, preferably 600 milliWatts/cm$^2$ or greater, may be provided to the showerhead. In certain embodiments, the power density may be ramped down from a first power density to a second power density during deposition. The pressure of the chamber is maintained between about 1 Torr and about 100 Torr, preferably between about 3 Torr and about 20 Torr. The deposition rate of the intrinsic type microcrystalline silicon layer may be about 200 Å/min or more, preferably 500 Å/min. Methods and apparatus for deposited microcrystalline intrinsic layer are disclosed in U.S. patent application Ser. No. 11/426,127 filed Jun. 23, 2006, entitled "Methods and Apparatus for Depositing a Microcrystalline Silicon Film for Photovoltaic Device," which is herein incorporated by reference. The microcrystalline silicon intrinsic layer has a crystalline fraction between about 20 percent and about 80 percent, preferably between 55 percent and about 75 percent. It was surprising to find that a microcrystalline silicon intrinsic layer having a crystalline fraction of about 70% or below provided an increase in open circuit voltage and leads to higher cell efficiency.

Next, while the substrate is still positioned in process chamber "C" in cluster tool 212B an n-type amorphous silicon layer is deposited on the intrinsic type microcrystalline layer formed on the substrate. In one example, an n-type amorphous silicon layer 336 illustrated in FIG. 3B is formed over the intrinsic type microcrystalline silicon layer 334 by depositing an optional first n-type amorphous silicon layer at a first silane flow rate and depositing a second n-type amorphous silicon layer over the first optional n-type amorphous silicon layer at a second silane flow rate lower than the first silane flow rate. The first optional n-type amorphous silicon layer may comprise providing a gas mixture of hydrogen gas to silane gas in a ratio of about 20:1 or less, such as about 5:5:1. Silane gas may be provided at a flow rate between about 1 sccm/L and about 10 sccm/L, such as about 5.5 sccm/L. Hydrogen gas may be provided at a flow rate between about 4 sccm/L and about 40 sccm/L, such as about 27 sccm/L. Phosphine may be provided at a flow rate between about 0.0005 sccm/L and about 0.0015 sccm/L, such as about 0.0095 sccm/L. In other words, if phosphine is provided in a 0.5% molar or volume concentration in a carrier gas, then the dopant/carrier gas mixture may be provided at a flow rate between about 0.1 sccm/L and about 3 sccm/L, such as about 1.9 sccm/L. An RF power between 25 milliWatts/cm$^2$ and about 250 milliWatts/cm$^2$, such as about 80 milliWatts/cm$^2$, may be provided to the showerhead. The pressure of the chamber may be maintained between about 0.1 Torr and about 20 Torr, preferably between about 0.5 Torr and about 4 Torr, such as about 1.5 Torr. The deposition rate of the first n-type amorphous silicon layer may be about 200 Å/min or more, such as about 561 Å/min. In the embodiment wherein phosphine is used to provide phosphorous dopants in the n-type amorphous silicon layer, the phosphorous dopants concentration is maintained at between about $1\times10^{18}$ atoms/cm$^2$ and about $1\times10^{20}$ atoms/cm$^2$.

The second n-type amorphous silicon layer deposition may comprise providing a gas mixture of hydrogen gas to silane gas in a ratio of about 20:1 or less, such about 7.8:1. Silane gas may be provided at a flow rate between about 0.1 sccm/L and about 5 sccm/L, such as about 0.5 sccm/L and about 3 sccm/L, for example about 1.42 sccm/L. Hydrogen gas may be provided at a flow rate between about 1 sccm/L and about 10 sccm/L, such as about 6.42 sccm/L. Phosphine may be provided at a flow rate between 0.01 sccm/L and about 0.075 sccm/L, such as about 0.015 sccm/L and about 0.03 sccm/L, for example about 0.023 sccm/L. In other words, if phosphine is provided in a 0.5% molar or volume concentration in a carrier gas, then the dopant/carrier gas mixture may be provided at a flow rate between about 2 sccm/L and about 15 sccm/L, such as about 3 sccm/L and about 6 sccm/L, for example about 4.71 sccm/L. An RF power between 25 milliWatts/cm$^2$ and about 250 milliWatts/cm$^2$, such as about 60 milliWatts/cm$^2$, may be provided to the showerhead. The pressure of the chamber may be maintained between about 0.1 Torr and about 20 Torr, preferably between about 0.5 Torr and about 4 Torr, for example about 1.5 Torr. The deposition rate of the second n-type amorphous silicon layer may be about 100 Å/min or more, such as about 300 Å/min. The thickness of the second n-type amorphous silicon layer is less than o about 300 Å, such as about 20 Å and about 150 Å, for example about 80 Å. The second n-type amorphous silicon layer is heavily doped and has a resistivity of about 500 Ohm-cm or below. It is believed that the heavily (e.g., degenerately) n-type doped amorphous silicon provides improved ohmic contact with a TCO layer, such as layer TCO layer 140. Thus, cell efficiency is improved. The optional first n-type amorphous silicon is used to increase the deposition rate for the entire n-type amorphous silicon layer. It is understood that the n-type amorphous silicon layer may be formed without the optional first n-type amorphous silicon and may be formed primarily of the heavily (e.g., degenerately) doped second n-type amorphous silicon layer.

It is noted that prior to each deposition of the layers, including n-type, intrinsic type and p-type silicon containing layers, an optional hydrogen or argon plasma gas treatment process may be performed. The hydrogen treatment process may be performed to treat the underlying layer to suppress surface contamination. Furthermore the plasma treatment process can also improve electrical properties at the interface since the surface defects may be removed or eliminated during the treatment process. In one embodiment, the plasma treatment process may be performed by supplying a hydrogen gas or argon gas into the processing chamber. The gas flow for supplying the hydrogen gas or the argon gas is between about 10 sccm/L and about 45 sccm/L, such as between about 15 sccm/L and about 40 sccm/L, for example about 20 sccm/L and about 36 sccm/L. In one example, the hydrogen gas may be supplied at about 21.42 sccm/L or the argon gas may be supplied at about 35.7 sccm/L. The RF power supplied to do the treatment process may be controlled at between about 25 milliWatts/cm$^2$ and about 250 milliWatts/cm$^2$, such as about 60 milliWatts/cm$^2$, may be provided to the showerhead 10 milliWatts/cm$^2$ and about 250 milliWatts/cm$^2$, such as about 80 milliWatts/cm$^2$ for hydrogen treatment and about 25 milliWatts/cm$^2$ for argon treatment.

Edge Seamer Module Design and Processes

Referring to FIGS. 1 and 2A, the edge deletion module 226 and processing sequence, performed during the substrate surface and edge preparation step 126, are generally used to remove material deposited in the edge deletion regions 380 (FIG. 3C) found on all four edges of a variable sized substrate 302. The material removed in this process may include soft metallic material layers as well as hard TCO and silicon containing layers, which have been found to greatly reduce the life of conventional belt type material removal devices due to the soft material accumulation on the abrasive portion of the belt surface that causes the belt to lose its abrasive cutting capability. This removed material in the edge deletion regions 380 provides electrical insulation of the active cells in the solar module 300. Additionally, the edge deletion region 380 provides electrical isolation and creates a region on which a reliable seal can be formed to prevent the premature degradation of the active regions of the formed solar cell device due to the encroachment of the outside environment.

FIG. 8A is a top plan, schematic view of one embodiment of the edge deletion module 226. An inlet conveyor 851 transports the glass substrate into a first edge deletion station 852. In this first station, two opposing side edges of the glass substrate are processed, and material is removed therefrom.

Next, the glass enters a cross transfer station 853. At this point, the glass substrate is fed into a second edge deletion station 854. In this station, the remaining two opposing side edges of the glass substrate are processed, and material is removed therefrom. At this point, the substrate surface and edge preparation step 126 is complete, and the solar cell device exits the edge deletion module 226 for further processing as previously described.

Figure 8B:
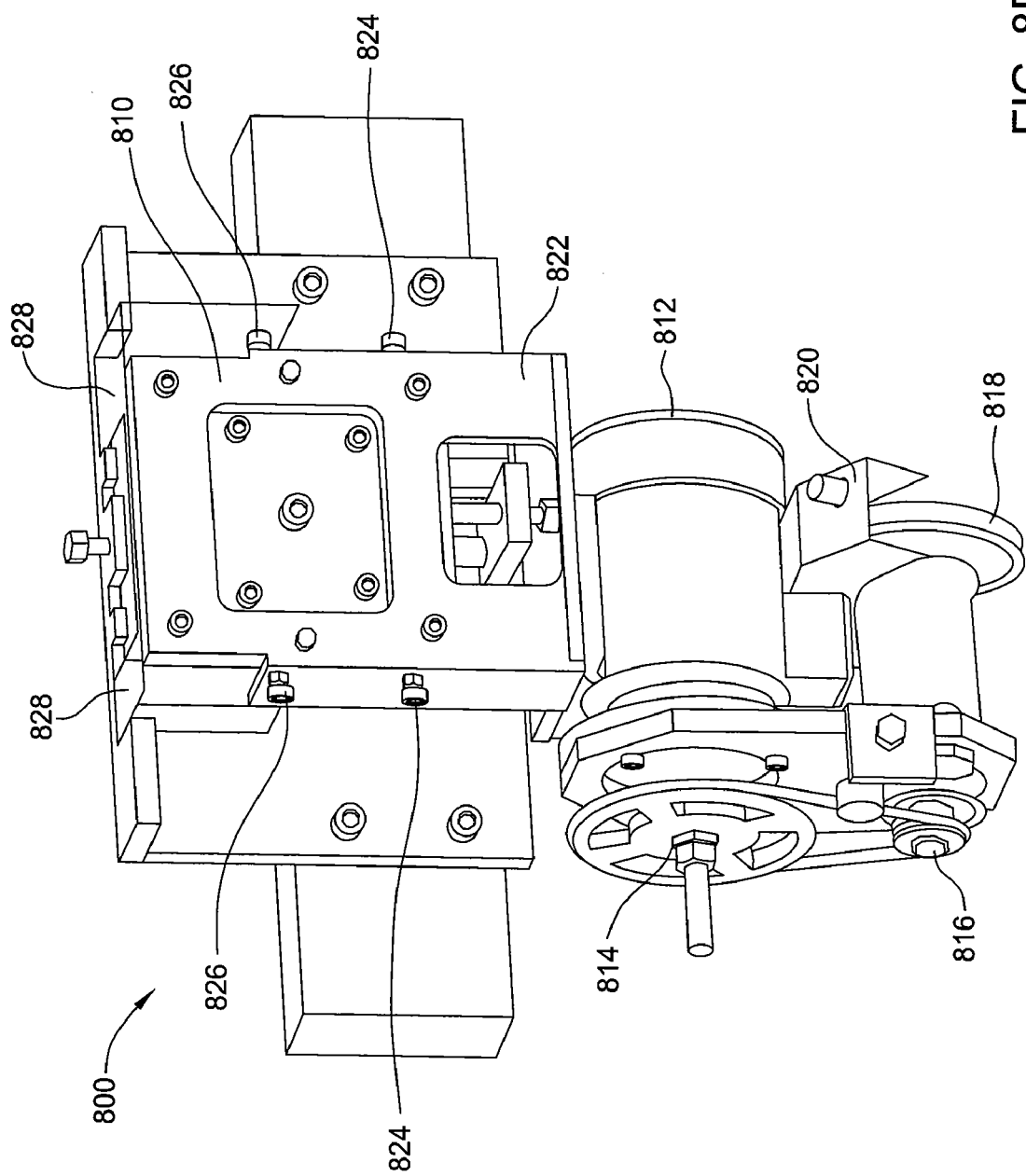
FIG. 8B is a partial schematic isometric view of an edge delete grinding wheel device according to one embodiment described herein.

FIG. 8B is a partial, schematic, modified isometric view of one embodiment of an material removal device 800 according to the present invention. Generally, the material removal device 800 includes a mounting structure 810, a motor 812, a motor pulley 814, a grinding wheel pulley 816, a grinding wheel 818, and a guard unit 820. The mounting structure 810 is typically mounted to a cross member within the first edge deletion station 852 or the second edge deletion station 854 as described below. The mounting structure 810 may include a vertical adjustment member 822, a horizontal adjustment member 824, and an angular alignment member 826. Exemplary embodiments of the vertical adjustment member 822, the horizontal adjustment member 824, and the angular alignment member 826 may comprise dual adjustment mechanisms, such as coarse and fine threaded adjustment screws. The vertical adjustment member 822, the horizontal adjustment member 824, and the angular alignment member 826 may be used for setting initial alignment of the material removal device 800 for seaming and edge deletion region 380 (FIGS. 3C-3D) of a solar cell device.

Another feature that may be included in the material removal device 800 is the constant pressure members 828. The constant pressure members 828 may comprise a mechanical, pneumatic, or hydraulic system of springs and dampers for ensuring the grinding wheel 818 asserts a constant downward pressure onto the solar cell device during the edge deletion process regardless of the thickness or the thickness variation of the solar cell device. Thus, the material removal device 800 may remove the same amount of material from the top surface of the solar cell device regardless of the thickness or thickness variation of the substrate. In this configuration, the application of a constant downward pressure irrespective of the actual substrate thickness or variation in substrate thickness can also be useful to automatically compensate for wear in the grinding wheel 818.

Figure 8C:
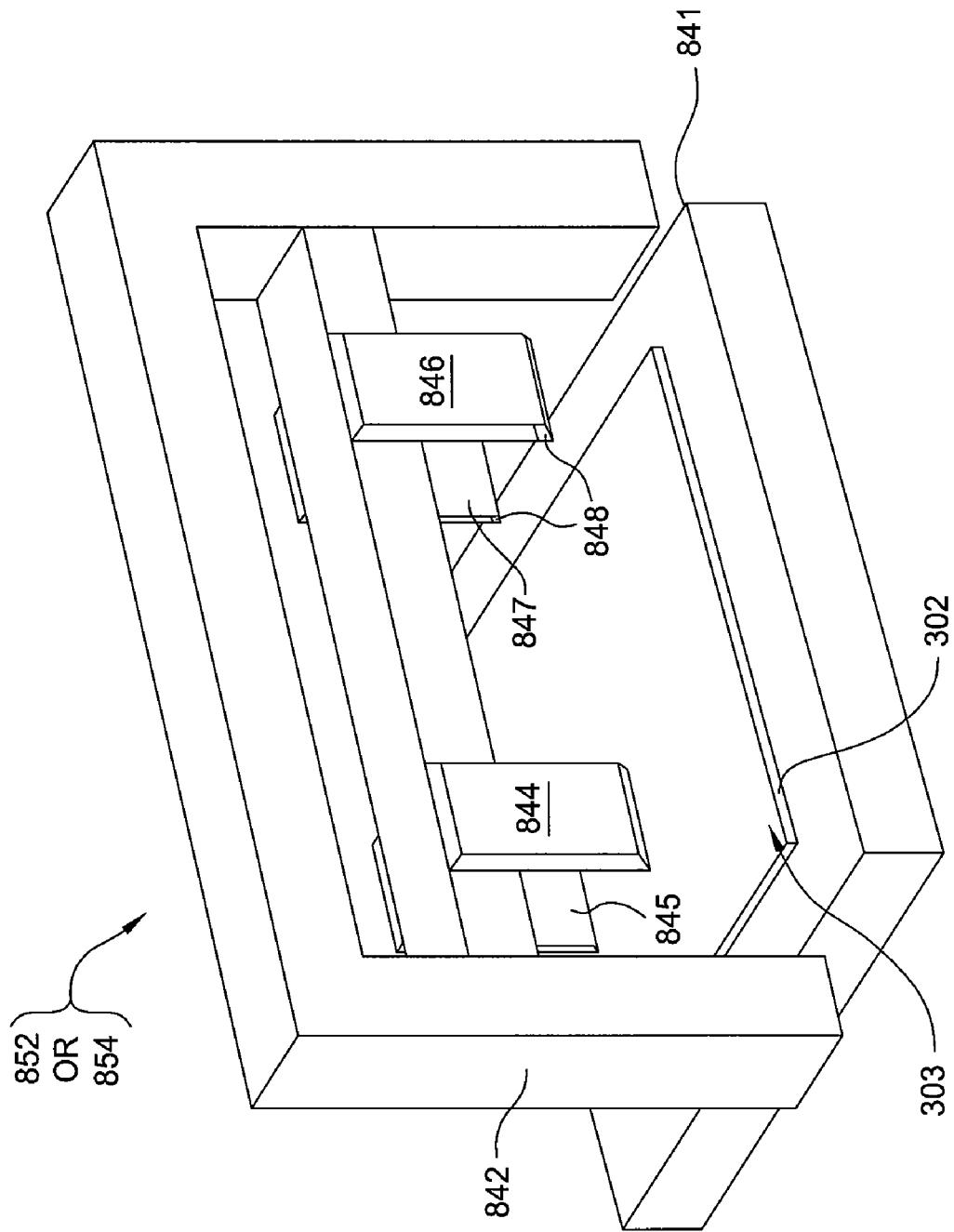
FIG. 8C is a partial schematic isometric view of an edge deletion station according to one embodiment described herein.

FIG. 8C is a partial, schematic, isometric view of one embodiment of the first edge deletion station 852 or the second edge deletion station 854. In this embodiment, the first edge deletion station 852 or the second edge deletion station 854 generally includes a substrate conveyor 841, a support structure 842, a first stationary grinding wheel device 844, a second stationary grinding wheel device 845, a first movable grinding wheel device 846, and a second movable grinding wheel device 847. In one embodiment, the first stationary grinding wheel device 844, a second stationary grinding wheel device 845, a first movable grinding wheel device 846, and a second movable grinding wheel device 847 may each comprise the material removal device 800 illustrated in FIG. 8B. In this embodiment, the first and second grinding wheel devices 844 and 845 may be fixed at one end of the support structure 842. The movable grinding wheel devices 846 and 847 may be disposed at the opposite ends of the support structure 842. In operation, the width of the solar cell device may be sensed via a position sensor 848 disposed on one or both of the movable grinding wheel devices 846, 847. The lateral position of the movable grinding wheel devices 846 and 847 may then be adjusted by the system controller 290, such that the movable grinding wheel devices 846 and 847 are in position to remove the appropriate amount of material from the top surface edge of the solar cell device. Thus, the first edge deletion station 852 or the second edge deletion station 854 may be used to remove material from the edge deletion region 380 on the top surface edges of the substrate 302 regardless of the width of the substrate.

It is important to note that the movable grinding wheel devices 846 and 847 may be separately controlled or may be coupled together to ensure proper alignment in the surface preparation and edge preparation step 126. Further, this dual wheel configuration may be mounted to a single support structure, as depicted in FIG. 8C, or to a dual support structure (not shown) having two or more wheels that can act independently of the other(s) may be used.

Additionally, this dual grinding wheel configuration may be advantageously used in a two stage edge removal process. In one embodiment, the first wheel removes the coated material layers from the top surface of the solar cell device, and the second wheel cleans any remaining material from the surface of the glass substrate and enables surface polishing. Thus, the film stack is fully removed, and adequate surface roughness is provided to the edge delete region, which is needed for later lamination. In another embodiment, each wheel removes specific materials. In this embodiment, the properties of each wheel may be tailored to enable efficient removal of only the desired material. An exemplary seaming devices that may be used with one or more embodiments described herein are disclosed in U.S. Provisional Patent Application Ser. No. 61/023,214, filed Jan. 24, 2008, and also U.S. Provisional Patent Application Ser. No. 61/034,931, filed Mar. 7, 2008, which are both incorporated by reference.

In one embodiment, the edge deletion module 226 and processing sequence, performed during the substrate surface and edge preparation step 126, is performed using laser edge deletion module. In this configuration a pulsed or continuous wave laser is rastered across the edge deletion regions 380 to remove any material disposed thereon.

Figure 17:
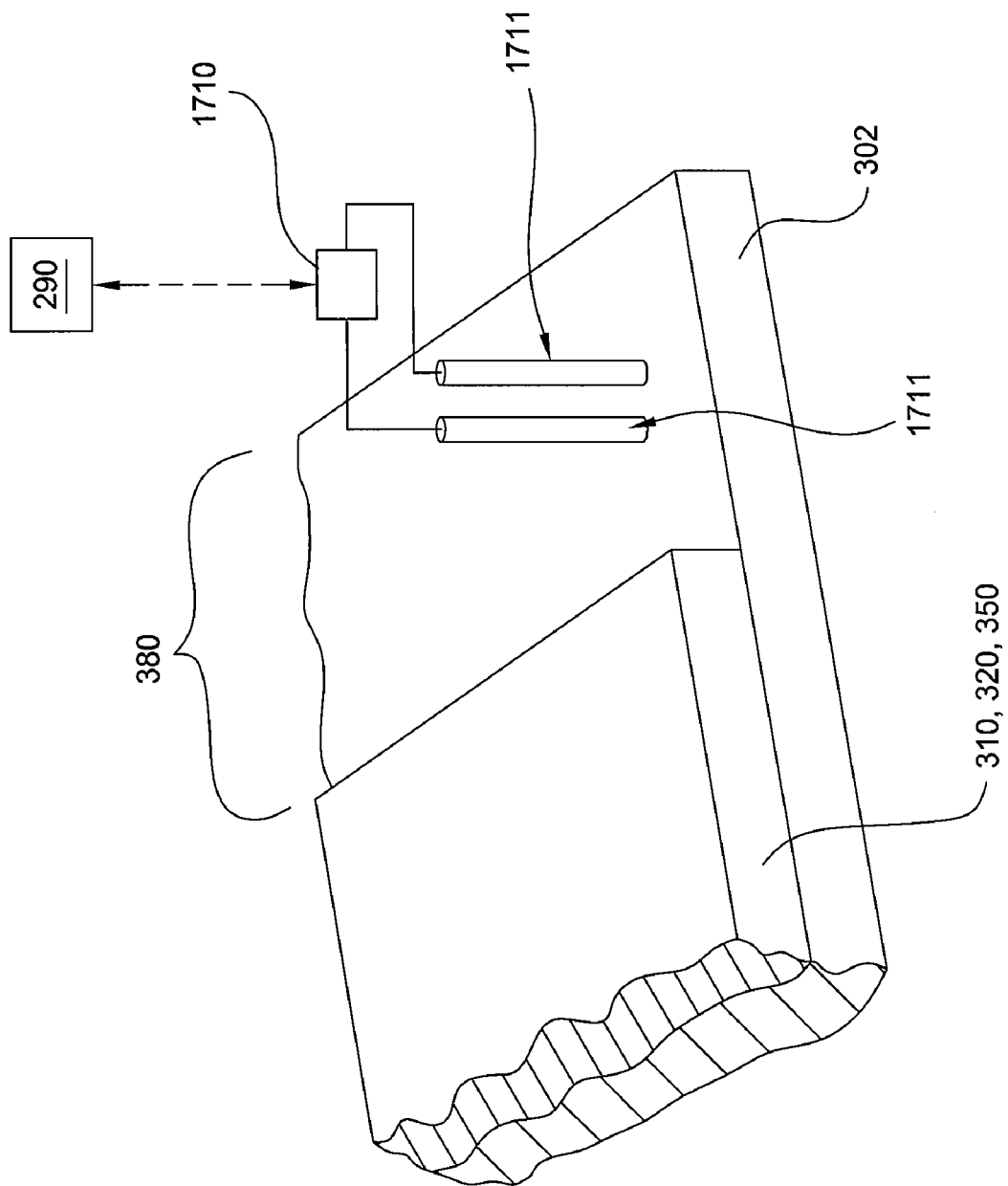
FIG. 17 is a partial isometric cross-sectional view of a quality assurance device according to one embodiment described herein.

In one embodiment of the edge deletion module 226, a quality assurance test is performed on the edge deletion regions 380 to assure that a desired amount of material has been removed. In general the quality assurance tests may include, but are not limited to measuring the conductance of the material on the substrate surface, an eddy current measurement technique, optical sensing techniques (e.g., light reflection, scattering, and/or absorption measurement techniques), or vision system (e.g., camera) is positioned to monitor and sense the cleanliness of the edge deletion region 380. In one embodiment, two or more contact probes 1711 and conductivity measurement system 1710, as shown in FIG. 17 are used to sense the conductivity of portions of the edge deletion region 380. In one configuration, a voltage or current is passed between the probes 1711, which is sensed by the conductivity measurement system 1710 to characterize the conductivity of the material remaining in the edge deletion regions 380. In one example, the probes 1711 are positioned at various points within the edge deletion region 380 to assure that a desired amount of material has been removed in each region. If one or more of the quality assurance tests sense that the edge deletion process was not satisfactorily completed then the system controller 290 can send the substrate to be reprocess or to a waste collection device.

Bonding Wire Attach Module Design and Processes

Figure 9A:
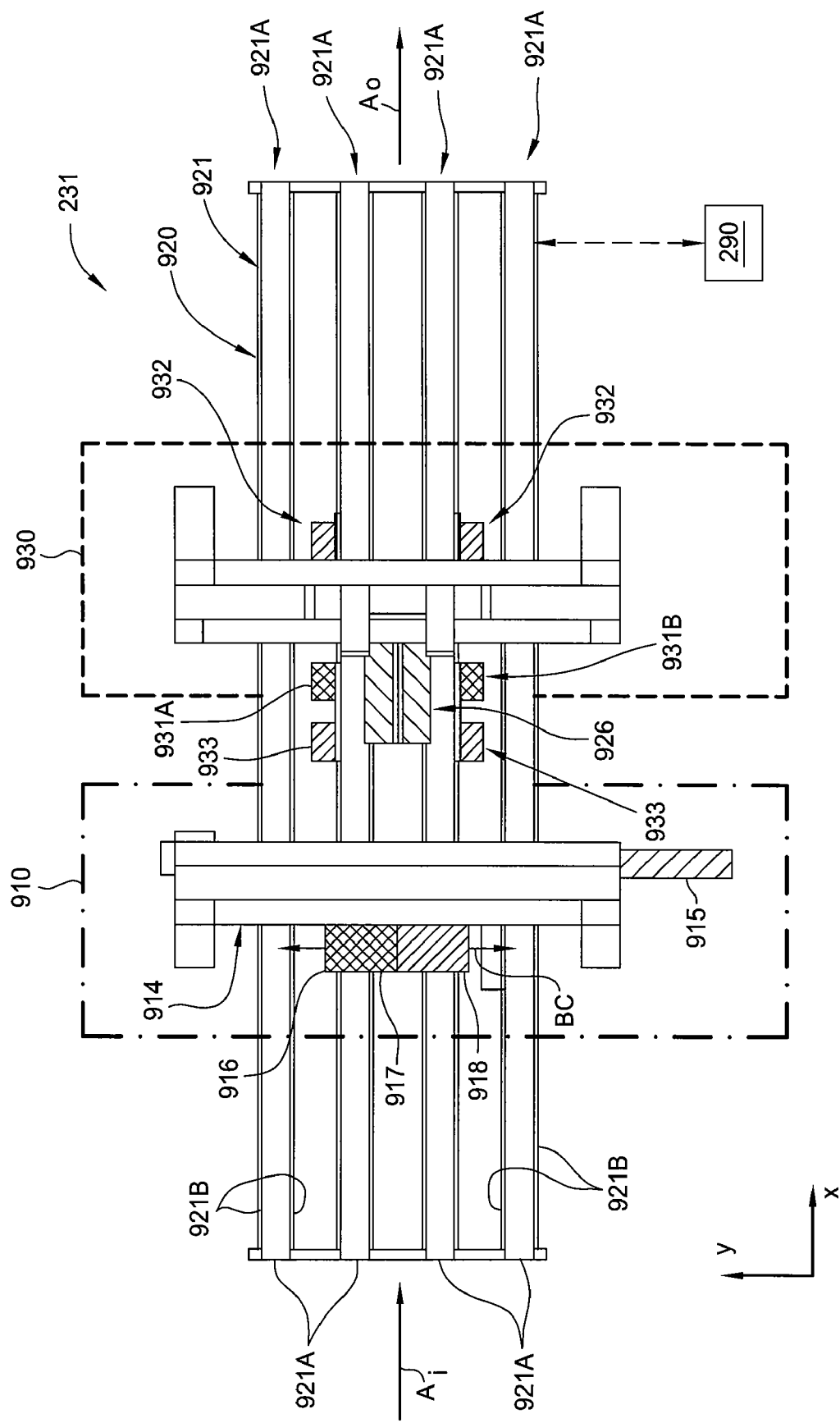
FIG. 9A illustrates a schematic plan view of a bonding wire attach module according to one embodiment described herein.
Figure 9C:
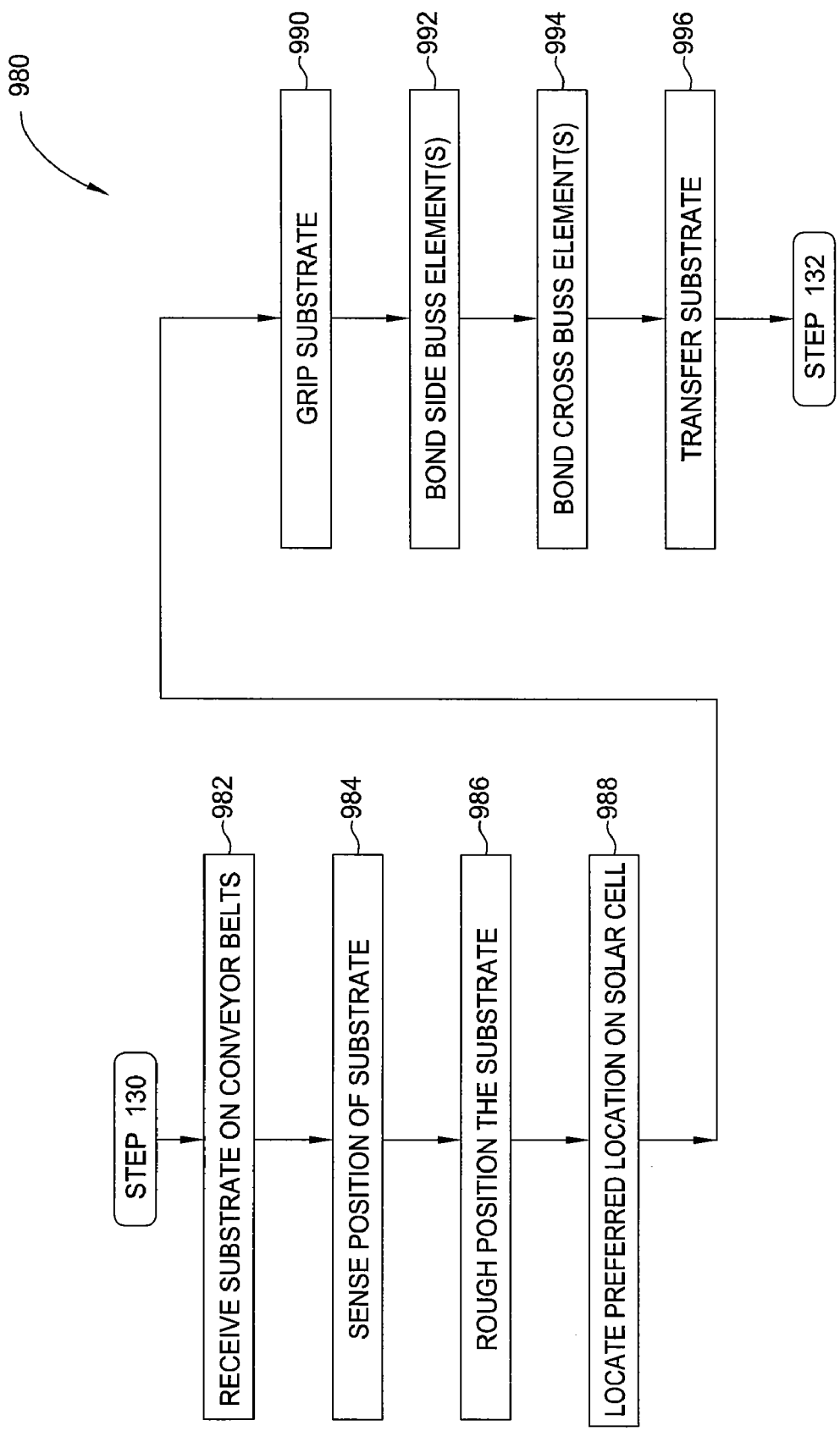
FIG. 9C illustrates a processing sequence according to one embodiment described herein.

As noted above, during step 131, the bonding wire attach step, one or more process steps, such as shown in processing sequence 980 in FIG. 9C, are performed to form the electrical leads that will allow the solar cell to be easily and systematically connected to other external devices to deliver the generated electrical power.

FIGS. 9A-9B illustrate one or more embodiments of a bonding wire attach module 231 which may be useful to perform the processing sequence 980 discussed below. FIG. 9A is a schematic plan view of the bonding wire attach module 231 that illustrates some of the common components found within this module. Generally, the bonding wire attach module 231 contains a side buss assembly 930, a cross buss assembly 910, a system controller 290, and a substrate handling system 920. A device substrate 303 is transferred into the bonding wire attach module 231 following the paths $A_i$, then passes through the cross-buss assembly 910 and the side-buss assembly 930, and exits the bonding wire attach module 231 following path $A_o$. An exemplary bonding wire attachment device that may be used with one or more embodiments described herein are further described in U.S. Provisional Patent Application Ser. No. 61/032,005, filed Feb. 27, 2008, which is herein incorporated by reference.

The substrate handling system 920 generally contains a support truss, or support structure (not shown), that is positioned beneath and is adapted to support and retain the various components used to perform the processing sequence 980, discussed below. In one embodiment, a substrate handling system 920 contains a conveyor system 921 that has a plurality of conventional automated conveyor belts 921A are used to position and transfer the formed device substrate 303 through the bonding wire attach module 231 in a controlled and automated fashion.

In one embodiment, the conveyor system 921 also contains a plurality of frictionless support elements 921B that are mounted to the support structure and positioned adjacent to the automated conveyor belts 921A to allow a solar cell to be supported, moved and positioned with minimum contact and abrasion of the substrate surfaces during the substrate alignment and/or the bonding processes. In one configuration, the conventional automated conveyor belts 921A are mounted on a moveable structure that allows a solar cell to be disposed on and/or removed from the frictionless support elements 921B by the movement of the automated conveyor belts 921A. The frictionless support elements 921B may comprise a gas receiving plenum that has one or more plenum surfaces that have a plurality of holes formed therein. In operation the holes are adapted to deliver a gas (e.g., air, $N_2$) from the gas receiving plenum to a surface of a substrate that is disposed over the plenum surface. The gas delivered by the holes is thus used to "frictionlessly" support the substrate over plenum surface so that it can be moved and aligned without contacting or abrading the surface of the substrate. The use of the frictionless support elements 921B also allows for a more precise control of the movement of the substrate versus using the automated conveyor belt system since the often small X-direction and Y-direction movements of a large substrate during alignment (steps 986 and 988 discussed below) are not as affected by frictional forces. In one embodiment, the substrate handling system 920 also contains various conventional gripping members that are used to align, position and/or move the substrate through the bonding wire attach module 231.

In one embodiment, the substrate handling system 920 also contains a vision system 926 that is used to accurately align the active regions of the formed solar cell to the elements found in the side buss assembly 930 and the cross buss assembly 910 so that the side-buss 355 (FIG. 3C) and cross-buss 356 can be accurately placed on the formed solar cell device. In general, the vision system 926 and system controller 290 are adapted to find one or more features on a device substrate 303 by moving it relative to one or more cameras found in the vision system 926. The vision system 926 generally contains at least one camera and other electronic components that are able to locate, communicate, and store the position of features found on the device substrate 303 by scanning its surface. For example, the vision system 926 can be used to find the various scribed features (e.g., laser scribe in steps 108, 114, and 120) formed in the layers deposited on the glass substrate. Due to tolerances in the glass substrate received in step 102 the position of the scribe marks can vary relative to one or more edges of the glass substrate, such that the variability can affect the placement of the buss wires (e.g., side-buss 355 and cross-buss 356) and the device yield of the solar cell formation process. Once the desirable features on the device substrate 303 are found by the vision system 926, the solar cell can be repositioned by use of one or more of the components in the substrate handling system 920 to allow the side-buss 355 and cross-buss 356 to be placed in a desired position relative to the scribe lines.

In general, the side buss assembly 930 has two flux dispensing modules 932, two soldering modules 933 and two side buss depositing elements 931A, 931B, that are used to substantially simultaneously form the two side-buss 355 (FIG. 3C) elements on the solar cell device 300 as the device is moved in the direction "$A_i$" through the bonding wire attach module 231. In operation the side buss assembly 930 is used to dispense a flux material on desired regions of the back contact layer 350 (step 118), then generally simultaneously deposit a side-buss 355 (e.g., metal strip) on opposing edges of the device substrate 303 and over a portion of the dispensed flux, and then fuse the side-buss 355 to the back contact layer 350. In one embodiment, multiple discrete solder points 934B (FIG. 9B) that are positioned at a desired pitch are used to fuse regions of the side-buss 355 to the back contact layer 350.

FIG. 9B is a side view of a portion of one of the side buss depositing elements 931A, 931B and the soldering module 933 that illustrates the elements used to attach the side-buss 355 on the surface of the device substrate 303 as the substrate is sequentially indexed, or continually moved, in the direction "$A_i$". In operation, a length of the side-buss 355 material, or metal ribbon, is positioned by use of a feed gripper 935 and roller 936 so that the multiple discrete solder points 934B in the bonding assemblies 934 can locally heat up various points along the length of the side-buss 355 to form a plurality of electrical connections between the side-buss 355 material and the back contact layer 350. In one embodiment, six bonding assemblies 934 can be vertically positioned to simultaneously bring a plurality of solder points 934B into contact with the side-buss 355 by use of one or more vertical actuators 934A. The use of multiple solder points 934B at once, such as two or more, is helpful to improve the throughput of the bonding wire attach module 231, since it allows large lengths of the buss line(s) to be attached at one time. The attachment of large lengths of the buss line minimizes the affect of the time required to heat up the side-buss 355 and back contact layer 350 to a desired temperature to form a good electrical connection at the each bonded region. One will note that the bonded regions are generally formed by the application of heat delivered from the bonding assemblies 934 to the side-buss 355 and the back contact layer 350. The distance between each of the solder points 934B along the direction "$A_i$" is typically configured to assure that the electrical resistance in the bonded side-buss 355 will not affect the performance of the formed solar cell device. In one embodiment, the solder points 934B are spaced between about 10 mm and 50 mm apart. In one embodiment, the soldering module 933 also contains a plurality of cooling nozzles (not shown) that are positioned to deliver a cooling fluid (e.g., room temperature gas) to each of the bonded regions prior to the solder points 934B being separated from the side-buss 355 surface after performing the bonding process.

The cross-buss assembly 910 is generally used to deposit the cross-buss 356 connections and insulating material 357 (FIG. 3C) on the surface of the solar cell 300. The cross-buss assembly 910 generally contains a motion assembly 914, a dispensing assembly 916, and a material feed assembly 915. The motion assembly 914 is generally used to move and/or position the dispensing assembly 916 in a cross direction "BC" (i.e., ±Y-direction) so that the cross-buss 356 elements can be deposited on the surface of the back contact layer 350. The motion assembly 914 generally contains a conventional actuator that is used to control the movement of the dispensing assembly 916 by use of commands sent from the system controller 290. To prevent the cross-buss 356 elements from shorting the active regions of the solar cell 300 the insulating material 357, which has electrical insulating properties, is placed under the cross-buss 356.

The dispensing assembly 916 generally contains an insulating material dispensing assembly 917 and a cross-buss material dispensing assembly 918 that each receive the cross-buss 356 and insulating material 357 from the material feed assembly 915. In one embodiment, the insulating material 357 has an adhesive like material deposited on two sides so that one side can be affixed to the surface of the device substrate 303 by use of one or more application elements, such as a roller, and the cross-buss 356 can be affixed to the other insulating material 357 surface by use of application elements, such as a roller.

Referring to FIGS. 1 and 9A-9C, in step 131 a series of sub-sequence steps, or processing sequence 980, are used to complete the bonding wire attach process. As discussed above, embodiments of the invention may include a method and a device for electrically connecting the solar cell so that the junction box and other external devices can receive the generated power during the solar cell's operation. FIG. 9C illustrates one embodiment of a process sequence 980 that contains a plurality of steps (i.e., steps 982-996) that are used to form a solar cell device contained in processing sequence 100. The configuration of the processing sequence, number of processing steps, the order of the processing steps in the process sequence 980, and the order of the process sequence 980 steps within the processing sequence 100 illustrated herein are not intended to be limiting to the scope of the invention described herein.

The process sequence 980 generally starts at step 982 in which one or more device substrates 303 are moved to the input of the bonding wire attach module 231 by use of a robotic device so that the automated conveyor belts 921A can receive and position the solar cell. The automated conveyor belts 921A may also be adapted to receive a plurality of substrates that have been processed following steps 102-130. Movement of the substrates can be controlled by commands sent to one or more driving mechanism coupled to the automated conveyor belts 921A from the system controller 290.

In the next step, step 984, the substrate is moved along the automated conveyor belts 921A until the leading edge of the substrate is sensed by use of a conventional position sensor (not shown) contained in the substrate handling system 920. The leading edge is generally the edge of the solar cell that is perpendicular to the direction of motion "$A_i$" (FIG. 9A).

In the next step, step 986, the substrate is lowered onto a gas cushion created by the gas flowing through the plurality of holes formed in the plurality of frictionless support elements 921B. Once the substrate is positioned on the gas cushion it is then aligned to a X-axis and Y-axis datum surfaces/elements using convention linear actuators (not shown) found in the substrate handling system 920.

In the next step, step 988, an accurate location and alignment is attained between features formed on the substrate and the automated components in the bonding wire attach module 231. In one embodiment, the X-direction, Y-direction and angular alignment of the scribe lines 354 (FIG. 3C) are aligned relative to the automation components in the bonding wire attach module 231. The X-direction, Y-direction and angular alignment of the substrate W can be adjusted by use of the data collected by the vision system 926 and automated actuators controlled by the system controller 290.

In the next step, step 990, once the solar cell has been aligned the substrate is then positively retained by use of a conventional gripping elements (not shown). Once the gripping elements, or actuated clamping mechanism, have grasped a portion of the substrate, the datum elements are disengaged from the solar cell and retract. In one embodiment, the gripping elements are then used to move the substrate along a known path through the bonding wire attach module 231 so that the side-buss 355 and cross-buss 356 elements can be accurately placed in the subsequent steps. In one embodiment, the vision system 926 is used to rechecked the solar cell's position after the gripping elements have grasped a portion of the substrate to assure that the solar cell is still in a desirable alignment.

In the next step, or step 992, the side-busses 355 are positioned and bonded to the back contact layer 350. In one embodiment, each side-buss 355 is incrementally bonded to the back contact layer 350 by sequentially performing the following steps: apply the flux material to the surface of the back contact layer 350, apply the side-buss 355 over the flux material, and then form discrete electrical connection points between the side-buss 355 and the back contact layer 350 by use of the bonding assemblies 934. In one embodiment, incremental lengths of both side-busses 355 are simultaneously attached to opposing edges of the solar cell by indexing the solar cell in a desired direction "$A_i$" (FIGS. 9A and 9B) and then bonding the side-buss 355 to the back contact layer 350 by the application of heat delivered by the soldering points 934B. In this configuration, the incremental lengths can be set to provide a regular spacing of the solder points 934B along the length of the side-buss 355.

In the next step, or step 994, the insulating material 357 and cross-busses 356 are positioned in desired locations on the back contact layer 350 of the solar cell. In this process two lengths of the insulating material 357 and the cross-busses 356 are positioned on surface of the solar cell to form leads that are used to deliver current from the side-busses 355 to the junction box 370 (FIG. 3C). In one example, step 994 can be broken into two major steps. First, the insulating material 357 is placed between the cross-busses 356 and the back contact layer 350 to prevent the cross-busses 356 from shorting out the active regions of the solar cell device. In this step, the insulating material dispensing assembly 917 is used to dispense one or more desired lengths of the insulating material 357 on the surface of the solar cell. Second, the cross-buss material dispensing assembly 918 is used to dispense one or more desired lengths of the cross-buss 356 (e.g., metal strip material) on the surface of the insulating material 357. Second, the cross-buss material dispensing assembly 918 is used to dispense one or more desired lengths of the cross-buss 356 (e.g., metal strip) on the surface of the insulating material 357. In one embodiment, the process of dispensing the cross-buss 356 generally includes pressing the cross-buss 356, which has an adhesive disposed on one side, on to the surface of the insulating material 357 and then cutting the cross-buss 356 when desired length has been positioned thereon. As shown in FIG. 3C, this step may require two lengths of cross-buss 356 material and two lengths of insulating material 357 to be affixed to the device substrate 303 to allow the creation of the two electrically isolated leads that are separately connected to the active regions of the solar cell through each side-buss 355. One will note that the placement of the side-buss 355, cross-buss 356 and the insulating material 357 can adjusted based on the size and design of the solar cell. In one embodiment, the placement and physical configuration of the cross-buss 356 and the insulating material 357 can be automatically adjusted solar-cell-to-solar-cell by use of instructions received from the system controller 290.

In one embodiment of step 992, the process of disposing the insulating material 357 and cross-busses 356 on the back contact layer 350 in step 994 is performed during portions of step 992. In this case, a portion of the side-buss 355 is bonded to the back contact layer 350 prior to the insulating material 357 and cross-busses 356 being applied to the surface of the solar cell. Next, after step 994 has been completed the rest of the step 992 is performed to complete the side-buss 355 formation process. In this configuration, as shown in FIG. 3C, a portion of side-buss 355 will be disposed over the cross-buss 356 so that at least one bonding region created by the soldering points 934B can be formed between the side-buss 355 and cross-buss 356 to form a reliable electrical connection through which current can pass from the side-buss 355 to the cross-buss 356.

In the next step, step 996, after the steps 992 and 994 have been completed the gripping elements then release the solar cell and the automated conveyor belts 921A are raised to receive the device substrate 303 from the frictionless support elements 921B. After the substrate has been received by the automated conveyor belts 921A the gas flowing to the frictionless support elements 921B is turned off and the automated conveyor belts 921A move the substrate towards the next module in the processing sequence 100. Movement of the substrates can be controlled by commands sent to one or more driving mechanism coupled to the automated conveyor belts 921A sent from the system controller 290.

An example of an exemplary bonding wire attachment module, module hardware configuration and bonding wire attachment process sequence that may be used with one or more embodiments described herein are further disclosed in U.S. Provisional Patent Application Ser. No. 61/032,005, filed Feb. 27, 2008, which is herein incorporated by reference.

Bonding Module Design and Processes

As noted above, during step 134, or the lamination step, one or more process steps are performed to bond the backside glass substrate to the solar cell devices formed in steps 102-132 to form a bonded composite solar cell structure 304 (FIG. 3D). Step 134 is thus used to seal the active elements of the solar cell from the external environment to prevent the premature degradation of a formed solar cell during its useable life. An exemplary bonding module 234 and method of using the same are further described in U.S. Provisional Patent Application Ser. No. 61/023,739, filed Jan. 25, 2008, which is herein incorporated by reference.

Figure 10:
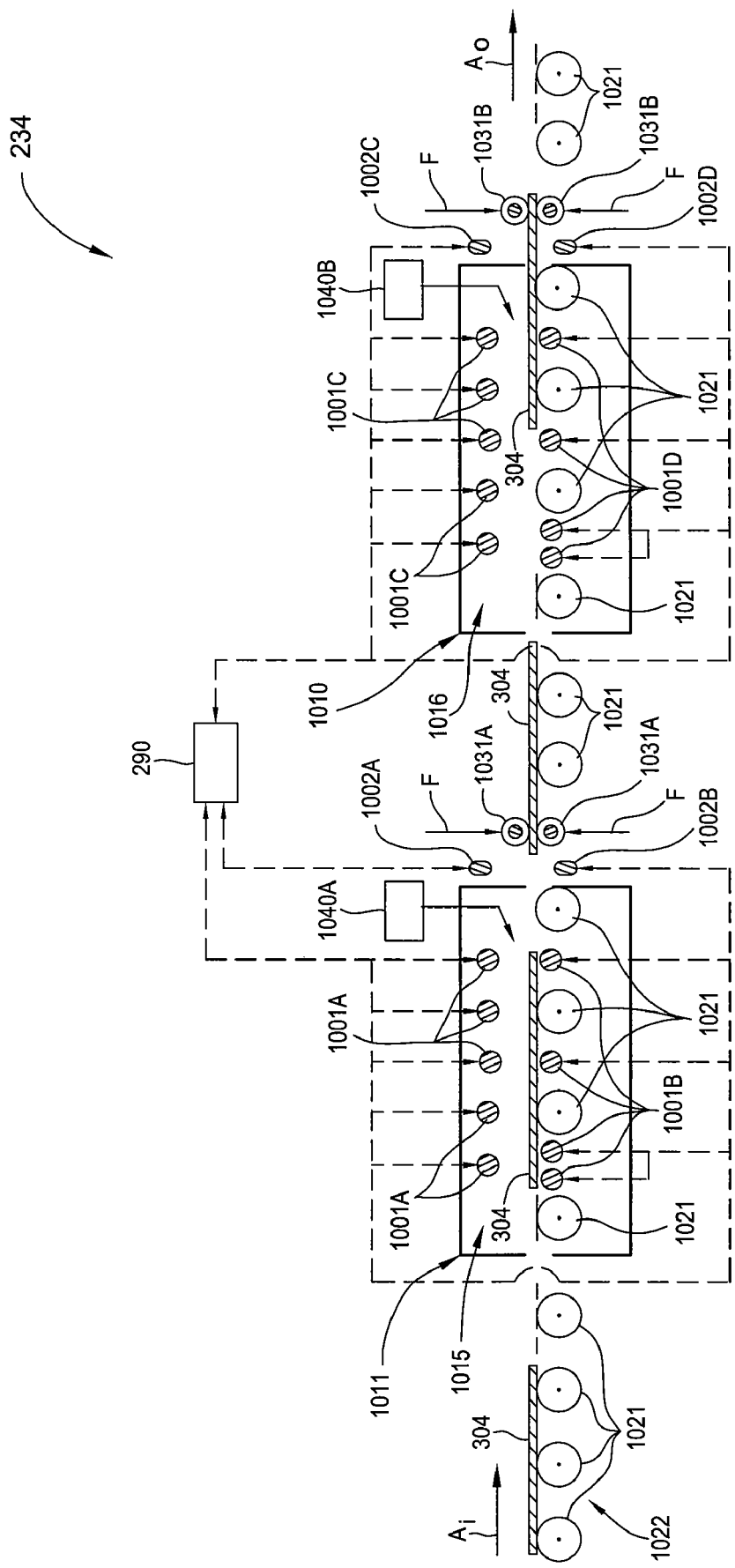
FIG. 10 is a schematic cross-sectional view of a bonding module according to one embodiment described herein.

FIG. 10 illustrate one or more embodiments of a bonding module 234 which may be useful to perform the lamination process, discussed below. FIG. 10 is a schematic cross-sectional view of the bonding module 234 that illustrates some of the common components found within this module. Generally, the bonding module 234 contains a preheat module 1011, a lamination module 1010, a system controller 290, and a conveyor system 1022. The conveyor system 1022 generally contains a plurality of support rollers 1021 that are designed to support, move and/or position a device substrate 303, the back glass substrate 361, and the bonding material 360, or hereafter composite solar cell structure 304. As shown in FIG. 10, a solar cell can be transferred into and through the bonding module 234 following the paths $A_i$ and $A_o$.

The preheat module 1011 generally contains a plurality of support rollers 1021, a plurality of heating elements 1001A, 1001B, two or more temperature sensors (e.g., temperature sensors 1002A, 1002B), and one or more compression rollers 1031A. The plurality of support rollers 1021 are adapted to support the composite solar cell structure 304 while it is positioned within the processing region 1015 of the preheat module 1011 and are configured to withstand the temperatures created by the heating elements 1001A, 1001B during normal processing. In one embodiment, the preheat module 1011 also contains a fluid delivery system 1040A that is use to deliver a desired flow of a fluid, such as air or nitrogen ($N_2$), through the processing region 1015 during processing.

The plurality of heating elements 1001A, 1001B are typically lamps (e.g., IR lamps), resistive heating elements, or other heat generating devices that are controlled by the system controller 290 to deliver a desired amount of heat to desired regions of the composite solar cell structure 304 during processing. In one embodiment, a plurality of heating elements 1001A are positioned above the composite solar cell structure 304 and a plurality of heating elements 1001B are positioned below the composite solar cell structure 304. In one embodiment, the heating elements 1001A, 1001B are oriented substantially perpendicular to the direction of travel of the substrate and the energy delivered by the lamps creates a uniform temperature profile across the substrate as it is continually moved through the processing region 1015.

The compression rollers 1031A are adapted to provide a desired amount of force F to the composite solar cell structure 304 to assure that all of the air bubbles found within the composite solar cell structure 304 are removed and the bonding material within the composite solar cell structure 304 is evenly distributed after performing the preheat process step. The compression rollers 1031A are generally configured to receive the composite solar cell structure 304 after it has been sufficiently heated in the preheat module 1011.

Referring to FIG. 10, the preheat module 1011 also contains two temperatures sensors 1002A, 1002B that are adapted to measure the temperature of regions of the composite solar cell structure 304 during the preheat process. The temperature sensors may be non-contact type temperature sensor, such as a conventional pyrometer, or a conventional contacting type of temperature sensor. In one embodiment, the preheat module 1011 contains a top temperature sensor 1002A that is adapted to measure the temperature of the top of the composite solar cell structure 304 and a bottom temperature sensor 1002B that is adapted to measure the temperature of the bottom of the composite solar cell structure 304 during or after processing. In one embodiment, the top temperature sensor 1002A and a bottom temperature sensor 1002B are positioned over one another so that the difference in temperature between the top side and bottom side of the composite solar cell structure 304 at the same position on the substrate can be simultaneously measured.

In general, during the preheat process the composite solar cell structure 304 is controllably heated as it passes through the processing region 1015 by use of the one more of the heating elements 1001A, 1001B disposed therein. In one embodiment, at least one of the top heating elements 1001A and at least one of the bottom heating elements 1001B are close loop controlled using the system controller 290 and at least one temperature sensor 1002B positioned on the top of the substrate and at least one temperature sensor 1002B positioned on the bottom of the substrate. After the substrate is preheated a desired force is applied to one or more sides of the preheated substrate by use of the one or more compression rollers 1031A using one or more controlled force generating elements. The applied force supplied by the one or more compression rollers 1031A may be between about 200 [N/cm] and about 600 [N/cm].

The lamination module 1010 generally contains a plurality of support rollers 1021, a plurality of heating elements 1001C, 1001D, two or more temperature sensors (e.g., temperature sensors 1002C, 1002D), and one or more compression rollers 1031B. The plurality of support rollers 1021 are adapted to support the composite solar cell structure 304 while it is positioned within the processing region 1016 of the lamination module 1010 and are configured to withstand the temperatures achieved during normal thermal processing. In one embodiment, the lamination module 1010 also contains a fluid delivery system 1040B that is use to deliver a desired flow of a fluid through the processing region 1016 during processing. In one embodiment, the fluid delivery system 1040B is fan assembly that is adapted to deliver a desired flow of air across one or more surfaces of the substrate disposed within the processing region 1016 by use of commends sent from the system controller 290.

The plurality of heating elements 1001C, 1001D are typically lamps (e.g., IR lamps), resistive heating elements, or other heat generating devices that are controlled by the system controller 290 to deliver a desired amount of heat to desired regions of the composite solar cell structure 304 during processing. In one embodiment, a plurality of heating elements 1001C are positioned above the composite solar cell structure 304 and a plurality of heating elements 1001D are positioned below the composite solar cell structure 304. In one embodiment, the heating elements 1001C, 1001D are oriented substantially perpendicular to the direction of travel of the substrate and the energy delivered by the lamps creates a uniform temperature profile across the substrate as it is moved through the processing region.

The one or more compression rollers 1031B are adapted to provide a desired amount of force F to the composite solar cell structure 304 (i.e., composite structure) to assure that all of the air bubbles found within the composite solar cell structure 304 are removed and the bonding material within the composite solar cell structure 304 is evenly distributed. The compression rollers 1031B are generally configured to receive the composite solar cell structure 304 after it has been sufficiently heated in the lamination module 1010. In one embodiment, as shown in FIG. 10, a pair of compression rollers 1031B are used to remove any trapped air from the substrate by apply a force F to both sides of the composite solar cell structure 304 by the compression rollers 1031B by use of a conventional electric or pneumatic force generating element.

Referring to FIG. 10, the lamination module 1010 also contains two temperatures sensors 1002C, 1002D that are adapted to measure the temperature of regions of the composite solar cell structure 304 during the lamination process. The temperature sensors may be non-contact type temperature sensor, such as a conventional pyrometer, or a conventional contact type temperature sensor. In one embodiment, the lamination module 1010 contains a top temperature sensor 1002C that is adapted to measure the temperature of the top of the composite solar cell structure 304 and a bottom temperature sensor 1002D that is adapted to measure the temperature of the bottom of the composite solar cell structure 304 during or after processing. In one embodiment, the top temperature sensor 1002C and a bottom temperature sensor 1002D are positioned one over another so that the difference in temperature between the top side and bottom side of the composite solar cell structure 304 can be simultaneously measured. In one embodiment, an array of pairs of temperature sensors 1002C, 1002D are positioned over desired areas of the composite solar cell structure 304 so that top and bottom temperature readings at different areas of the composite solar cell structure 304 can be measured.

Therefore, after performing the preheat process a lamination process is performed in the lamination module 1010. During the lamination process the composite solar cell structure 304 is controllably heated as it passes through the processing region 1016 by use of the one more of the heating elements 1001C, 1001D disposed therein. In one embodiment, at least one of the top heating elements 1001C and at least one of the bottom heating elements 1001D are close loop controlled using the system controller 290 and at least one temperature sensor 1002C positioned on the top of the substrate and at least one temperature sensor 1002D positioned on the bottom of the substrate. After the substrate is heated in the lamination module a desired force is applied to one or more sides of the composite substrate by use of the one or more compression rollers 1031B using one or more controlled force generating elements. The applied force supplied by the one or more compression rollers 1031B may be between about 200 [N/cm] and about 600 [N/cm].

Autoclave Module Design and Processes

As discussed above, in step 134, the composite solar cell structure is inserted in the processing region of the autoclave module where heat and pressure applied to the partially formed solar cells to reduce the amount of trapped gas disposed between bonding material 360 and the back glass substrate 361, substrate 302 or the back contact layer 350 to prevent environmental attack of portions of the solar cell device through the regions of trapped gas. Use of the autoclave process is also used to improve the properties of the bond between the substrate 302, back glass substrate and bonding material 360. The processes performed in the autoclave are also useful to assure that the stress in the glass and bonding layer (e.g., PVB layer) are more controlled to prevent future failures of the hermetic seal or failure of the glass due to the stress induced during the bonding/lamination process.

Figure 11:
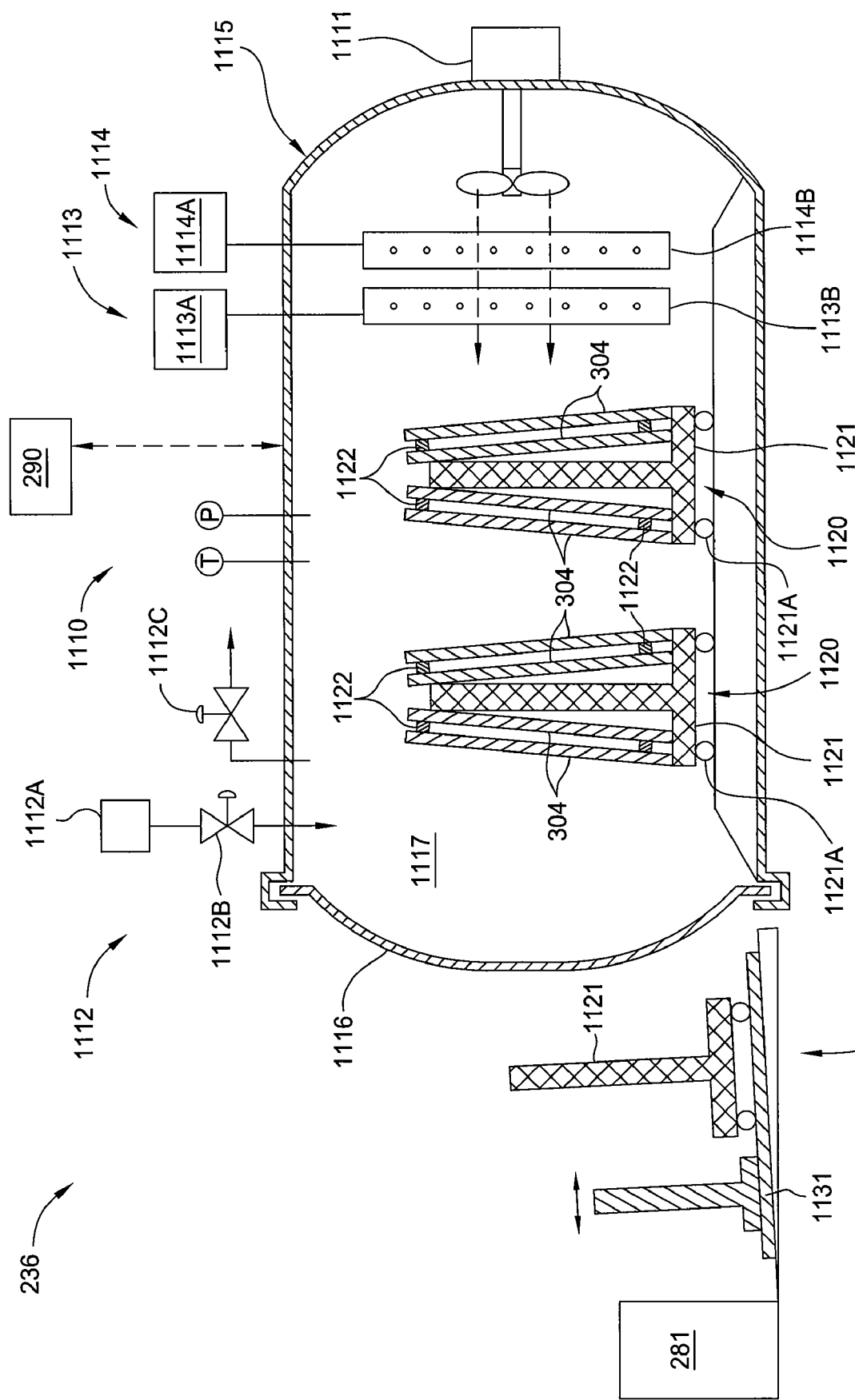
FIG. 11 is a schematic side cross-sectional view of an autoclave assembly according to one embodiment described herein.

FIG. 11 illustrates a side cross-sectional view of an autoclave module 236 and supporting equipment. The autoclave module 236 will generally contain a vessel assembly 1110, one or more substrate racks 1120, and a loading system 1130. The vessel assembly 1110 generally contains a fluid movement device 1111, compressor 1112, heating unit 1113, cooling unit 1114, and a vessel 1115. The vessel 1115 has a door 1116 that configured to enclose the substrate racks 1120 and composite solar cell structures 304 disposed thereon in a processing region 1117 during processing. As shown in FIG. 11 the door 1116 is closed and sealed against the vessel 1115. The compressor 1112, system controller 290 and pressure sensor "P" are used in combination to deliver and actively control the pressure within the processing region 1117 during the autoclave process by controlling the delivery and release of a high pressure fluid from a fluid pump 1112A, valve 1112B and relief valves 1112C. In one embodiment, the compressor 1112 is adapted to provide compressed air at pressure greater than about 13 Bar to the processing region 1117 of the autoclave module 236 during processing. In another embodiment, the compressor 1112 is adapted to provide compressed air at pressure between about 13 Bar and about 15 Bar to the processing region 1117 during processing.

To control the temperature of the composite solar cell structures 304 during the autoclave process the system controller 290 and temperature sensor "T" are used in combination to control amount of heat that is transferred to the composite solar cell structures 304 positioned in the processing region 1117 by use of the components contained in the heating unit 1113 and the cooling unit 1114. The heating unit 1113 generally contains a heater controller 1113A and a plurality of heating elements 1113B (e.g., thermally controlled resistance heating elements) that are in thermal communication the composite solar cell structures 304 disposed within the processing region 1117. Similarly, the cooling unit 1114 contains a cooling unit controller 1114A and a plurality of cooling elements 1114B that are in thermal communication the composite solar cell structures 304 disposed within the processing region 1117. The cooling elements 1114B may comprise a series fluid containing channels, in which a fluid exchanging medium is provided from the cooling unit controller 1114A, to cool the components contained in the processing region 1117. In one example, the heating elements 1113B and/or cooling elements 1114B are disposed within the processing region 1117 and are adapted to add and/or remove heat from the composite solar cell structures 304 by convective heat transfer supplied by movement of the high pressure gas contained in the processing region 1117 during processing by use of the fluid movement device 1111 (e.g., mechanical fan). The fluid movement device 1111 is configured to provide motion to the fluid contained in the processing region 1117 during processing to also reduce the variation in temperature throughout the processing region 1117. In one embodiment, the temperature in the processing region is maintained between about 140° C. and about 160° C. for a time between about 1 and about 4 hours. The autoclave processing temperatures, pressures, and times will vary by the type of bonding material that is used, and as one or more of the process variables are altered.

The loading system 1130 is generally configured to deliver and remove one or more of the racks 1120 to the processing region 1117 of the vessel 1115 prior to and after processing. The loading system 1130 generally contains an automated material handling device 1131, for example, a conveyor or a robotic device, which is used to transfer the racks 1120 to and from the processing region 1117 of the vessel 1115 in an automated fashion.

The one or more substrate racks 1120 generally include one or more regions shelves 1121 that are adapted to support the composite solar cell structures 304 during processing. In one embodiment, each substrate rack 1120 contains wheels 1121A that allows the racks to be easily moved and positioned within the production line 200. Each of the composite solar cell structures 304 are spaced a desired distance apart to assure that temperature uniformity and pressures applied to the composite solar cell structures 304 are uniform. In one embodiment, to assure that the substrates see the same processing conditions one or more spacers 1122 are disposed between and in contact with both adjacent composite solar cell structures 304 to assure that the spacing between the adjacent composite solar cell structures 304 is uniform. In one embodiment, three or more spacers are positioned between adjacent composite solar cell structures 304. In one example, the spacers 1122 are adapted to space adjacent composite solar cell structures 304 between about 5 mm and about 15 mm apart.

In general, the autoclave module 236 may be transferrably connected to the automation device 281 positioned after the bonding module 234 to receive and perform an autoclave process on one or more of the formed composite solar cell structures 304. The autoclave module 236 may also be transferrably connected to the automation device 281 positioned before the junction box attachment module 238 so that the processed substrates can be transferred to the down stream processing modules.

In one embodiment, as shown in FIG. 2A, the composite solar cell structures 304 leaving the bonding module 234 are transferred to a substrate rack 1120 that is then transferred to the autoclave module 236 for processing, and then transferred to a position near the junction box attachment module 238 after processing. As shown in FIG. 2A, a plurality of substrate racks 1120 are positioned to receive substrates from the automation device 281 positioned after the bonding module 234. In one embodiment, one or more robots 235A (e.g., 6-axis robot) are positioned to transfer the composite solar cell structures 304 from the automation device 281, which is positioned after the bonding module 234, and on to a moveable substrate rack 1120 by use of a robotic device (e.g., automated material handling device 1131). Similarly, in one embodiment, the substrate racks 1120 are moved from the autoclave module to a position where a robot 235B (e.g., 6-axis robot) is able to transfer the composite solar cell structures 304 from a substrate rack 1120 and on to the automation device 281 positioned before the junction box attachment module 238. In one embodiment, the substrate rack 1120 may be moved to and from the autoclave module 236 in an automated fashion. In some cases it is desirable to minimize the need for and/or the amount of human intervention.

Junction Box Attachment Module Design and Processes

The junction box attachment module 238 and processing sequence 1280, performed during step 138, are used to install a junction box 370 (FIG. 3C) on a partially formed solar cell. The installed junction box 370 acts as an interface between the external electrical components that will connect to the formed solar cell, such as other solar cells or the power grid, and the internal electrical connections points, such as the ends of the cross-buss 356, formed during step 131. In one embodiment, the junction box 370 contains one or more connection points (e.g., reference numerals 371, 372 in FIG. 3C) so that the formed solar cell can be easily and systematically connected to other external devices to deliver the generated electrical power. An exemplary junction box attachment module 238 and method of using the same are further described in U.S. Provisional Patent Application Ser. No. 61/023,810, filed Jan. 25, 2008, which is herein incorporated by reference.

Figure 12A:
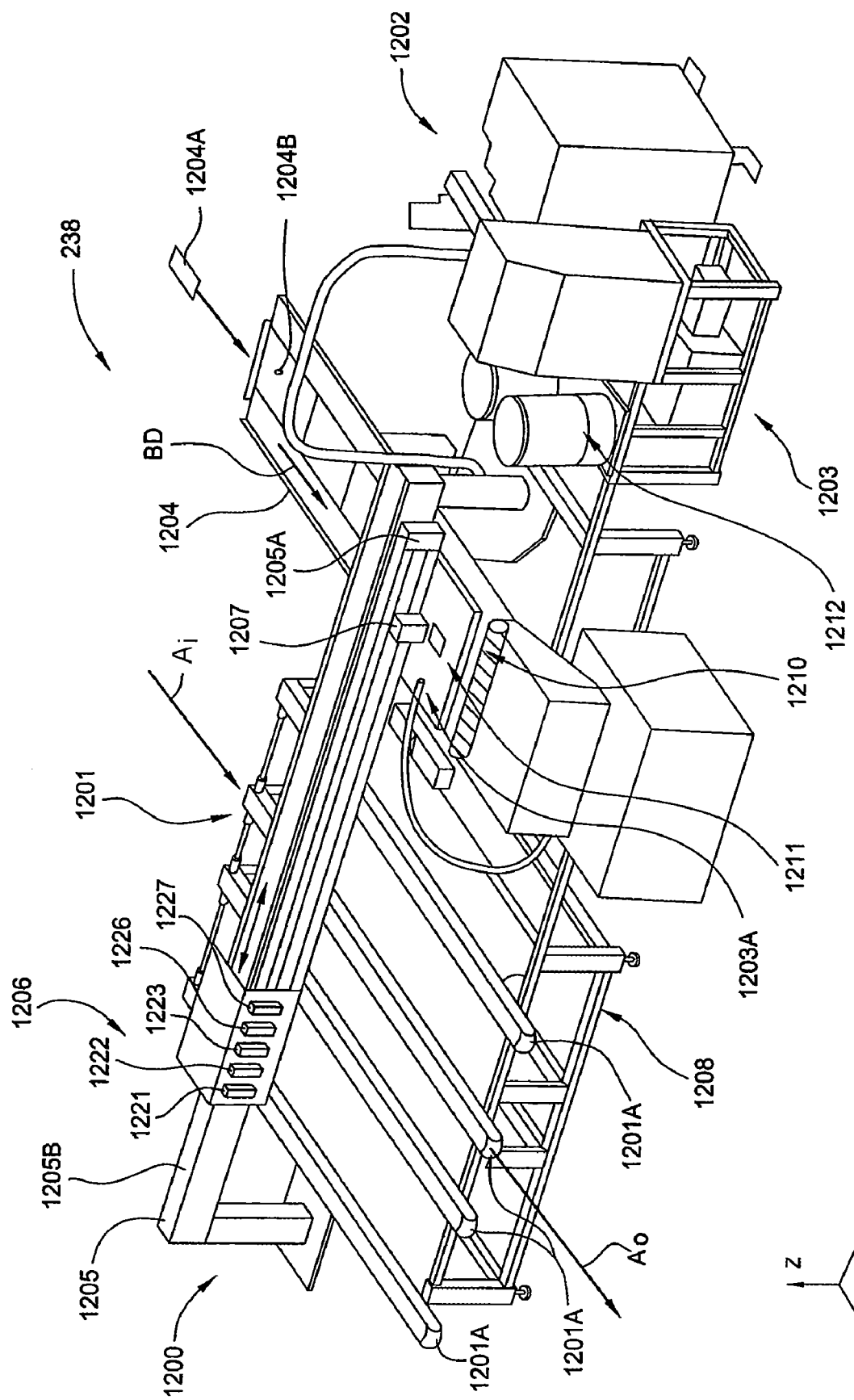
FIG. 12A is a schematic isometric view of a junction box attachment module according to one embodiment described herein.

FIG. 12A illustrates one or more embodiments of a junction box attachment module 238 which may be useful to perform the processing sequence 1280, discussed below. FIG. 12A is an isometric view of the junction box attachment module 238 that illustrates some of the common components found within this module. Generally, the junction box attachment module 238 contains a main structure 1200, an adhesive dispense assembly 1202, a potting dispense assembly 403, a junction box conveyor assembly 1204, a gantry system 1205, a head assembly 1206, a flux dispense assembly 1212 and a conveyor system 1201. The main structure 1200 generally contains a support truss, or support structure 1208, that is adapted to support and retain the various components used to perform the processing sequence 1280. In one embodiment, the conveyor system 1201 contains a plurality of conventional conveyor belts 1201A that are mounted to the support structure 1208 to allow the composite solar cell structure 304 to be positioned and transferred through the junction box attachment module 238. As shown in FIG. 12A, a solar cell can be transferred into the junction box attachment module 238 following the path $A_i$ and exit the junction box attachment module following path $A_o$.

The gantry system 1205, which is also supported by the support structure 1208, generally contains structural components 1205B and automation hardware that is used to move and position the head assembly 1206 over a solar cell substrate that is positioned on the conveyor system 1201. The gantry system 1205 may contain an actuator 1205A, such as a servomotor controlled belt and pulley system, that is adapted to controllably position the head assembly 1206 over the composite solar cell structure 304.

The junction box conveyor assembly 1204 is generally configured to receive one or more junction box components (e.g., junction box 370 and junction box lid (discussed below)) from an operator, or an automated supply device 1204A, and deliver them to a receiving region 1211 of the junction box attachment module 238 in an automated fashion. Once the one or more junction box components are positioned in the receiving region 1211, the head assembly 1206 components can then receive, remove, and then place these components onto the composite solar cell structure 304 positioned on the conveyor system 1201. In one embodiment, the junction box conveyor assembly 1204 is adapted to receive a tray 1210 of junction box components from the supply device 1204A and move (path "BD") the tray to the receiving region 1211 using a conveyor system 1204B. The conventional conveyor system 1204B is generally adapted to move and position the components received from the supply device 1204A by use of commands sent from the system controller 290.

The adhesive dispense assembly 1202 generally contains components that are adapted to deliver an adhesive, such as a hot melt RTV adhesive, to a portion of the junction box attachment module 238 where the adhesive can be disposed upon a sealant receiving surface of the junction box 370. In one embodiment, the adhesive dispense assembly 1202 is automated and is adapted to heat and then dispense the adhesive material using conventional resistive heating elements and a pressurized fluid delivery system. The pressurized fluid delivery system may use pressurized gas or other mechanical means to deliver the heated adhesive to the dispense head assembly 1203A and the junction box 370. Since the solar cell fabrication cost is an important consideration the accurate dispense of the adhesive material in an automated way can improve device yield, reduce labor and material cost per formed device, and make the process results more repeatable.

The flux dispense assembly 1212 generally contains components that are adapted to deliver a flux material to a portion of the junction box attachment module 238 where the flux material can be disposed upon the electrical connections in the junction box 370 and the ends of the cross-buss 356 to improve the wetting of the solder material during step 1290, discussed below.

The potting dispense assembly 1203 generally contains components that are adapted to deliver a potting material, such as a two part RTV material, to an internal region of the junction box 370 using a dispense nozzle 1227 that has been accurately positioned over the junction box 370 and composite solar cell structure 304 by use of the gantry system 1205. In general, the internal region of the junction box 370 is formed after the junction box 370 has been sealably mounted to the composite solar cell structure 304. In one embodiment, a desired amount of each of the two parts of potting material are simultaneously delivered to the internal region of the junction box 370 by use of the system controller 290. The potting material is generally used to isolate the active regions of the solar cell and electrical connections found in the junction box 370 from environmental attack during the usable life of the formed solar cell device. Since the solar cell fabrication cost is an important consideration the accurate positioning and controlled dispense of the potting material in an automated way can improve device yield, reduce labor cost and material cost per formed device, and make the process results more repeatable.

The head assembly 1206 that contains a vision system 1221, a robotic gripper 1222, a thermode assembly 1223, a lid retrieving robot 1226 and the dispense nozzle 1227. As noted above, in one embodiment, the head assembly 1206 can be positioned in a desired position along the length of the gantry system 1205 using an actuator 1205A and system controller 290. In general, the vision system 1221 and system controller 290 are adapted to find one or more features on a formed solar cell device 300 by scanning a camera found in the vision system 1221 across the solar cell device using the gantry system 1205's ability to move the head assembly 1206 (y-direction motion) and the conveyor system 1201 ability to move the solar cell (x-direction motion). The vision system 1221 generally contains a camera and other electronic components that are able to locate, communicate, and store the position of features found within the formed composite solar cell structure 304 by scanning the solar cell device. For example, the vision system 1221 can be used to find the position of the exposed ends of the cross-buss 356 and opening found in the back glass substrate 361 of the composite solar cell structure 304.

Once the desirable features on the solar cell are found by the vision system 1221, a junction box 370 that has been received by the robot gripper 1222 can be positioned on the composite solar cell structure 304 and the electrical connections can be reliably made (step 1290 discussed below). The robotic gripper 1222 generally contains actuated robotic gripping elements that are adapted to receive, retain and position the junction box 370.

The thermode assembly 1223 generally contains two or more thermal devices that are used to deliver heat to form a good electrical connection between the ends of the cross-buss 356 (FIG. 3C) and the electrical connections found in the junction box 370. In operation, the thermode assembly 1223 and solar cell 300 are positioned so that the electrical connections in the junction box 370 can receive enough heat to cause a solder type material found on the electrical connections and/or ends of the cross-buss 356 to melt and form a robust electrical connection.

The lid retrieving robot 1226 is designed to receive the junction box lid 370A from the receiving region 1211 and position it over the junction box 370 after all of the electrical connections have been made and the potting material has been positioned within the internal region of the junction box 370. The lid retrieving robot 1226 generally contains one or more vacuum end-effectors 1226A that are adapted to receive and hold the junction box lid 370A so that it can be placed over an opening formed in the junction box 370 in which the thermode assembly 1223 can access the electrical connections found in the junction box 370.

Figure 12B:
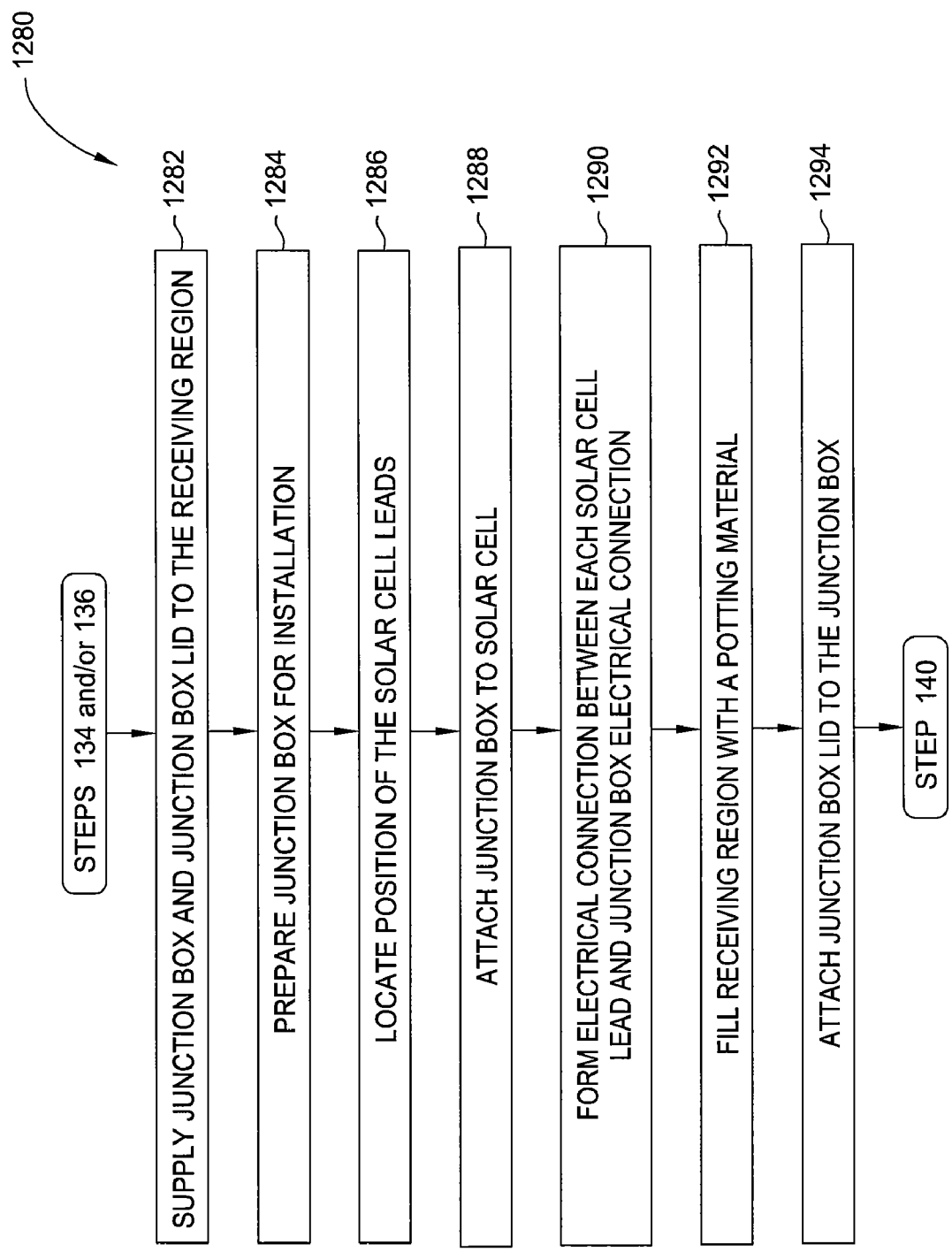
FIG. 12B illustrates a processing sequence according to one embodiment described herein.

Referring to FIGS. 1 and 12A-12B, in step 138, a processing sequence 1280 is used to complete the junction box attachment process. As discussed above, embodiments of the invention may include a method and a device for forming the solar cell's connection point(s) so that the formed solar cell can be easily and systematically connected to other external devices, such as other solar cells, to generate electrical power. FIG. 12B illustrates one embodiment of a process sequence 1280 that contains a plurality of steps (i.e., steps 1282-1294) that are used to form an electrical connection to a solar cell device. The configuration, number of processing steps, and order of the processing steps in the process sequence 1280 illustrated are not intended to be limiting to the scope of the invention described herein.

The process sequence 1280 generally starts at step 1282 in which one or more junction boxes 370 and/or one or more junction box lids 370A are moved to the receiving region 1211 of the junction box attachment module 238 using the conveyor assembly 1204, discussed above.

In the next step, step 1284, the junction box 370 is prepared for installation on the composite solar cell structure 304 that has been processed up through steps 134 and/or 136 of the process sequence 100, discussed above. During step 1284 an adhesive material, such as a hot melt RTV adhesive, is disposed upon a sealant receiving surface of the junction box 370.

In the next step, step 1286, the vision system 1221 in conjunction with the gantry assembly 1205, head assembly 1206, conveyor system 1201 and system controller 290 are used to scan the solar cell to find the ends of the cross-buss 356 and opening formed in the back glass substrate.

In the next step, step 1288, the junction box 370 is disposed on the composite solar cell structure 304, which is positioned on the conveyor system 1201, so that the adhesive material found on the sealant receiving surface can form a seal around the opening contained in the back glass substrate 361. In one embodiment, during step 1288 the junction box 370 is picked-up by the robotic gripper 1222 from the arm 1207, and accurately oriented and positioned over the ends of the cross-buss 356 and opening by use of the information received by the vision system 1221 during step 1286. In one embodiment, the robotic gripper 1222 is adapted to urge the junction box 370 and adhesive material against the surface of the back glass substrate 361 during installation.

In the next step, step 1290, the thermode assembly 1223 is positioned (X, Y and Z directions) to deliver heat to the ends of the cross-buss 356 and the electrical connections in the junction box 370 to form a good electrical contact.

In the next step, step 1292, the internal region of the junction box 370 is filled with a desired amount of a potting material by use of the dispense nozzle 1227 contained in the head assembly 1206, the gantry system 1205, conveyor system 1201, and the system controller 290. The potting material, such as a polymeric material, is generally used to isolate the active regions of the solar cell and electrical connections formed during step 1290 from environmental attack during the life of the formed solar cell device.

Finally, in the last step, step 1294, the junction box lid is disposed on the junction box 370 so that the internal region of the junction box can be further isolated from the external environment. After completion of this process sequence 1280 the solar cell device is transferred to the device testing module 240 where step 140 can be performed.

An exemplary junction box attachment module 238 and method of using the same are further described in U.S. Provisional Patent Application Ser. No. 61/023,810, filed Jan. 25, 2008, which is herein incorporated by reference.

Solar Simulator Module Design and Processes

Figure 13A:
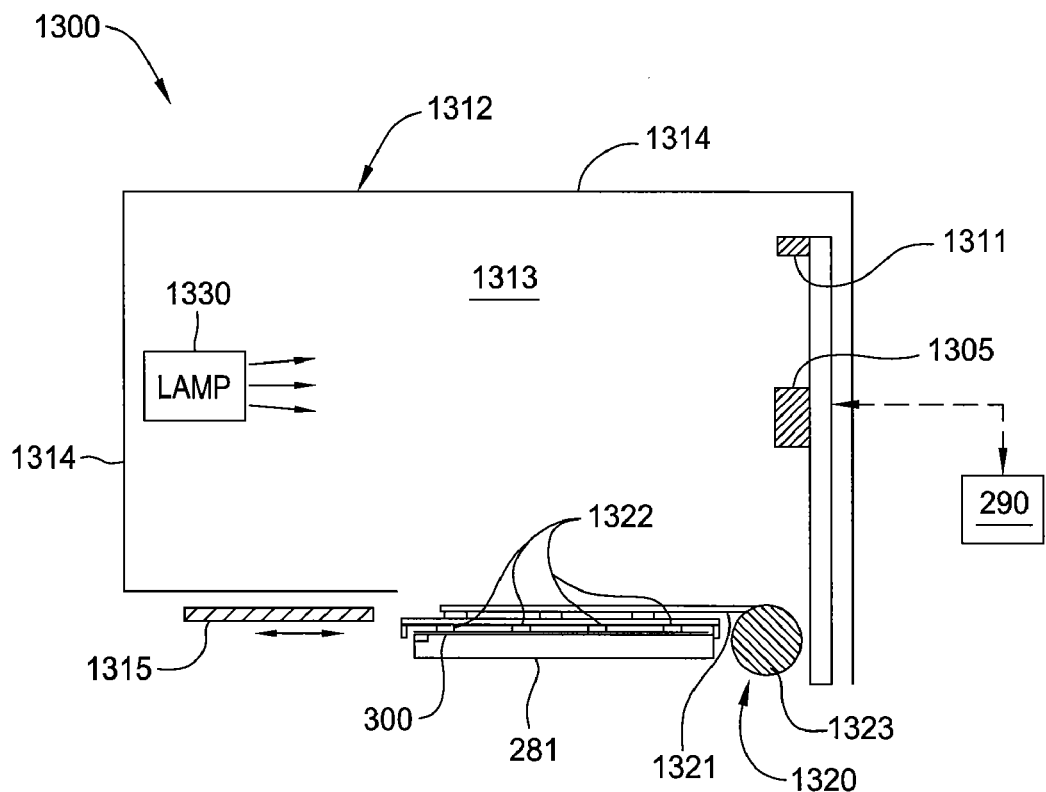
FIGS. 13A-13B are schematic side cross-sectional views of a solar simulator type device testing module according to one embodiment described herein.
Figure 13B:
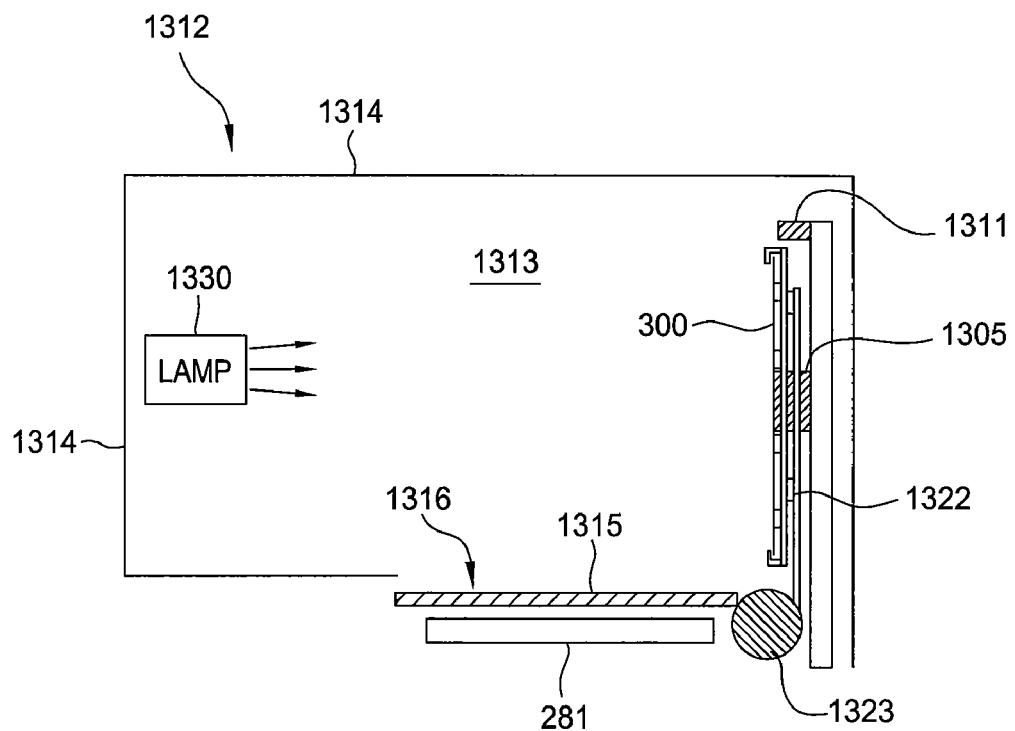

In one embodiment, the device testing module 240 comprises a solar simulator module 1300 that is used to qualify and test the output of the one or more formed solar cells. In this configuration, a light emitting source (i.e., lamp(s) 1330) and automated probing device (i.e., probing nest 1305) are used to measure the output of the formed solar cell 300 by use of various automated components that are adapted to make electrical contact with the junction box terminals 371, 372 (FIG. 3C) in the junction box 370. During testing, to assure that the at least partially formed solar cell 300 has desirable electrical characteristics (e.g., open circuit voltage, maximum power, short circuit current, efficiency), the active region(s) of the solar cell 300 are exposed to a known amount of light energy within a desired range of wavelengths. If the solar simulator module 1300 detects a defect in measure output characteristics of the formed solar cell 300 the system controller 290 can be used to take corrective actions or the solar cell can be scrapped. If the output of the formed device meets the user defined requirements a surface of the back glass substrate 361 receives a label that denotes the actual measured electrical characteristics of the device and the at least partially formed solar cell 300 is allowed to proceed to the next step in the solar cell fabrication process. In one aspect of the invention, multiple solar cells can be tested at once, such a 2.2×2.6 meter (e.g., Gen 8.5) formed solar cell device that has been sectioned to form two or four smaller solar cell devices. FIGS. 13A-13B illustrate multiple aspects of the solar simulator module 1300.

The solar cell simulator will generally contain a probe nest 1305, lamp(s) 1330, gantry 1320, and enclosure 1312. In one configuration, as shown in FIGS. 13A-13B, the enclosure 1312 is positioned around the testing region 1313 of the solar simulator module 1300 so that stray light and reflections do not affect the quality of the testing process performed on the solar cell 300. In this configuration a solar cell 300 may be positioned in the testing region 1313 of the solar simulator module 1300 by use of an automation device 281, for example, in a direction that is into and out of the page shown in FIGS. 13A-13B. In one embodiment, the testing region 1313 is fully enclosed by use of a retractable screen 1315 that is positioned in an automated fashion using a actuating device (e.g., linear motor, air cylinder) over an opening 1316 formed in one of the walls 1314 of the enclosure 1312 to prevent light outside the enclosure 1312 from affecting the testing process (FIG. 13B). The retractable screen 1315 forms a portion of the testing region 1313 that encloses the lamp(s) 1330 and partially solar cell 300 to provide light uniformity, intensity consistency, testing repeatability and testing reliability.

In one embodiment, the testing region 1313 is optimized to allow a spacing between solar cell 300 and the lamp(s) 1330 to be between about 4.4 and about 6.5 meters away from each other and still achieve a Class A certification. The walls 1314 of the enclosure 1312 may lined with a dark colored material (e.g., felt) to enable most of the light created by the lamp(s) 1330 to be received by the solar cell 300 during the testing process.

In one embodiment, the solar simulator module 1300 contains a probe nest 1305 that is generally used to connect the electrical components in the solar simulator module 1300 to the junction box terminals 371, 372 in the solar cell's junction box 370 so that the electrical characteristics of the solar cell 300 can be measured during the solar simulator testing process. The probe nest 1305 generally contains four major components. The first element is an alignment mechanism that receives a formed solar cell 300 that is positioned on an automation device 281 and allows the formed solar cell to be aligned to a known reference so that an electrical connection can reliably be made to the electrical connection points in the junction box terminals 371, 372. The second element is a gantry 1320, or automated robotic element, that is used to receive and hold the aligned solar cell 300 so that it can be actively positioned in a desired orientation relative to the lamp(s) 1330 for testing and then returned to the automation device 281 after testing. The third element is a probe nest 1305 that allows for the reliable connection to the electrical connection points in the junction box terminals 371, 372. Finally, the solar cell 300 may contain one or more elements that provide datum surfaces around which the solar cell can be aligned to various components in the solar simulator module 1300. In one embodiment, the junction box 370 contains one or more surfaces that provide a datum reference that is used to align the solar cell so that the probing elements in the probe nest 1305 can be inserted reliably and the solar cell 300 can be accurately positioned and retained within the solar cell simulator. In operation, components in the probe nest 1305 are used to locate and probe the junction box terminals 371, 372 as well as sense the temperature of the solar cell to provide normalization of the readings for temperature. Once the measurements are complete the probe nest 1305 is disconnected, and the solar cell is placed back onto the automation device 281, where a label is attached while the panel is removed from the system.

In one configuration, the solar simulator module 1300 also contains a reference cell 1311 that is positioned to receive light from the lamp(s) 1330. The reference cell 1331 is used by the system controller 290 to monitor and control the output of the lamp(s) 1330.

In one embodiment of the solar simulator 1300, the solar cell 300 is vertically oriented by use of the gantry 1320 during the testing process so that the path that the light travels from the lamp(s) 1330 to the solar cell 300 is substantially horizontal. The horizontal light path is believed to improve serviceability, since if a lamp fails the user does not need to climb up into the tool to replace the bulb, and the overall foot print of tool is reduced. In one embodiment, the gantry 1320 contains an arm 1321, rotary actuator 1323, reference cell 1311, and substrate supporting elements 1322. The substrate supporting elements 1322 may be vacuum gripping elements that are coupled to the arm 1321 and are adapted to contact and hold onto portions of the back glass substrate 361 during testing. The rotary actuator 1323 is generally configured to position the substrate supporting elements 1322 to receive the solar cell 300 from the automation device 281 (FIG. 13A) and orient the solar cell 300 in a desired orientation (e.g., vertical orientation shown in FIG. 13B) by use of conventional mechanical actuator (not shown) to receive the light delivered from the lamp(s) 1330.

It is believed that conventional testing configurations generally require the lamps to be >6.5 meters from a 2.2×2.6 meter sized solar cell 300 during the testing. The horizontal configuration of the delivered light energy also allows the solar cell to be more easily aligned to the lamp(s) 1330, thus assuring that the results of the solar cell simulation tests are accurate.

In one embodiment, the solar simulator module 1300 is designed to simultaneously test and record the outputs of multiple solar cells 300 at once. Therefore, the gantry 1320 design and probe nest 1305 design of the solar simulator module 1300 is configured to receive each of the junction boxes 370 on each of the solar cells 300 at the same time. The multiple solar cell testing configuration thus allows the production line 200 to form a large solar cell device that can then sectioned into smaller solar cells and then simultaneously tested in an automated fashion without user intervention. The design also generally improves the reliability, throughput, and efficiency of the solar cell simulator and thus the solar cell formation process.

Also, in one embodiment, the solar simulator module 1300 contains an automated label device that affixes a label to each tested solar cell 300 after testing. The label may generally contain a unique serial number for each formed cell, the solar cell's electrical characteristics (e.g., open circuit voltage, maximum power, short circuit current, efficiency), and any relevant safety information.

Examples of quality assurance are disclosed in U.S. Provisional Patent Application Ser. No. 61/020,304, filed Jan. 10, 2008, which is herein incorporated by reference.

Solar Parametric Tester Module Design and Processes

Referring to FIGS. 1 and 2A, in one embodiment, the step 140 in the processing sequence 100 contains a plurality of testing and analysis steps, such as steps 111 and 123 that are used to test and analyze various regions, or test structures, formed on a portion of a partially formed solar cell device. In general test structures may be regions or scribed areas formed on or within the layers formed on the substrate 302, which are designed to provide some information about the processes performed in the production line 200. One example of a formed test structure 1405 that may be used in conjunction with one or more of the embodiments described herein is illustrated in FIG. 14A. FIG. 14A is a schematic cross-sectional diagram of a measurement assembly 1461 used to measure the electrical properties of the back contact layer 350 in a resistance tester structure 1405 formed in the deposited layers on the substrate 302. FIG. 14B is top view of the test structure 1405, according to an embodiment of the invention. The test structure 1405 includes a TCO layer 310, a first p-i-n junction 320, and a back contact layer 350 all deposited on the substrate 302. Active portions of the formed solar cell 300 formed on substrate 302 are isolated from test structure 1405 by isolation grooves 1431. Isolation grooves 1431 may be formed via the same material removal processes, or scribing process, used to form the isolation grooves 381A-381C (FIG. 3E) that form the other active solar cells formed on the substrate 302. Examples of other types of test structures that may be formed on one or more regions of a substrate and used to help qualify a solar cell formation process are further described in the U.S. Provisional Patent Application Ser. No. 61/043,060, filed Apr. 7, 2008, which is incorporated by reference herein.

As shown in FIG. 2A, the solar cell production line 200 may contain solar parametric testing (SPT) module 1400 that is used to test and analyze various regions of a solar cell device in an automated fashion during different phases of the solar cell formation process. While FIG. 2A illustrates the SPT module 1400 in an off-line configuration, in which the module is not connected to the automation hardware in the solar cell production line 200, this configuration is not intended to be limiting as to the scope of the invention. Further, in one embodiment, the SPT module 1400 is transferrably connected to the one or more automation devices 281 (e.g., conveyors, substrate handling robots) in the solar cell production line 200 so that the SPT module 1400 can receive, and possibly return, the solar cell to the production line in an automated fashion. In one example, the SPT module 1400 is positioned to receive a substrate in an automated fashion from an automation devices 281 positioned between the clean module 210 and the processing module 212. In another example, the SPT module 1400 is positioned to receive a substrate in an automated fashion from an automation devices 281 positioned between the scribe module 220 and the quality assurance module 222.

Figure 14C:
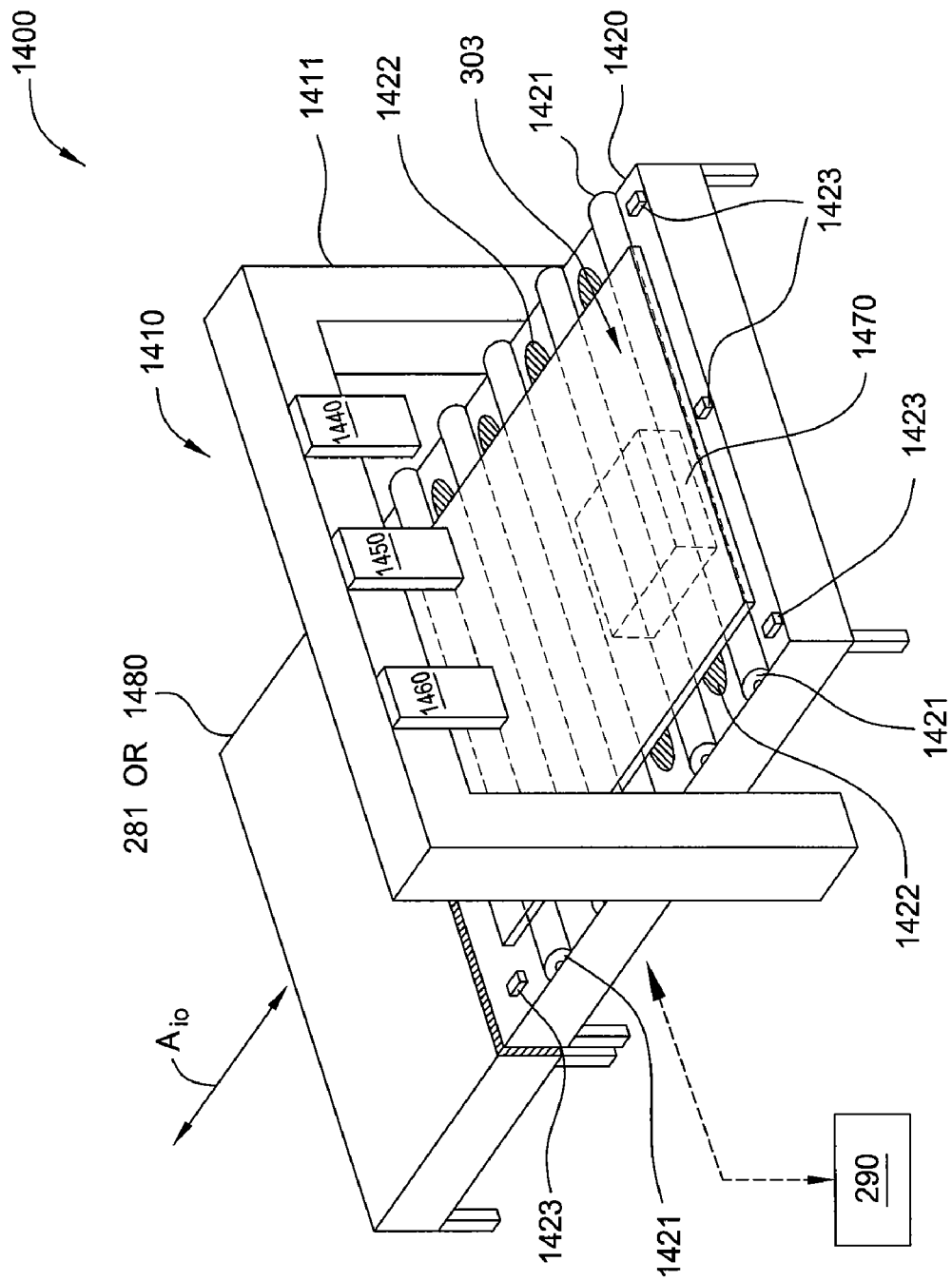
FIG. 14C is a schematic isometric view of a solar parametric tester module which may be useful to analyze portions of a solar cell according to one embodiment described herein.

FIG. 14C illustrate one or more embodiments of a SPT module 1400 which may be useful to perform the processing sequence 1490, discussed below. FIG. 14C is a schematic isometric view of a typical SPT module 1400 that contains a test assembly 1410 and an automation assembly 1420, which are both in communication with a system controller 290. The test assembly 1410 generally contains a support truss, or support structure 1411, that is adapted to support and retain the various components used to perform one or more of the tests performed in the SPT module 1400 using commands sent from the system controller 290. In one embodiment, the test assembly 1410 generally comprises a vision system 1440, a solar cell efficiency module 1450, a resistance measurement module 1460, and a light source 1470 that are in communication with the system controller 290.

In one embodiment, as shown in FIG. 14C, a solar cell is transferred into the SPT module 1400 using a substrate support table 1480 that can be manually moved and connected up to the SPT module 1400 so that the substrate (e.g., device substrate 303) can be received by the automation assembly 1420 and then tested. In another embodiment, the substrate support table 1480 is replaced by an automation device 281 that allows the SPT module 1400 to be connected to one or more automation components in the solar cell production line 200 so that each substrate can be handled in an automated fashion using commands sent from the system controller 290.

Referring to FIG. 14C, in one embodiment, the automation assembly 1420 contains a conveyor that has a plurality of conventional automated conveyor rollers 1421, which are used to position the solar cell device within the an SPT module 1400 in a controlled and automated fashion. In another embodiment, the automated conveyor rollers 1421 comprise a series of belts that are used to support and position the device substrate 303.

The automation assembly 1420 may also contain a plurality of frictionless support elements 1422 that are mounted to a supporting structure within the automation assembly 1420 to allow a solar cell to be supported, moved and positioned with minimum contact and abrasion of the substrate surfaces during the substrate alignment and/or the testing processes. In one configuration, the automated conveyor rollers 1421 are mounted on a moveable structure that allows a solar cell to be disposed on and/or removed from the frictionless support elements 1422 by the relative movement between the rollers 1421 and the frictionless support elements 1422 by a conventional actuator assembly (not shown). The frictionless support elements 1422 may comprise a gas receiving plenum that has one or more plenum surfaces that have a plurality of holes formed therein. In operation the holes are adapted to deliver a gas (e.g., air, $N_2$) from the gas receiving plenum to a surface of a substrate that is disposed over the plenum surface. The gas delivered by the holes is thus used to "frictionlessly" support the substrate over plenum surface so that it can be moved and aligned without contacting or abrading the surface of the substrate. The use of the frictionless support elements 1422 also allows for a more precise control of the movement of the substrate versus using the automated conveyor belt system since the often small X-direction and Y-direction movements of a large substrate during alignment are not as affected by frictional forces.

In one embodiment, the automation assembly 1420 also has various aligning and gripping members 1423 that are used to align, position and/or move the substrate within the SPT module 1400. In one embodiment, the automation assembly 1420 contains one or more separately moveable gripping members 1423 that are used to align, retain and/or move the solar cell during processing. In one embodiment, the automation assembly 1420 also contains one or more datum finding elements that are used to align the edge of the substrate to a known position within the automation assembly 1420.

In one embodiment, the automation assembly 1420 also contains a vision system 1440 that is used to accurately align the active regions of the at least partially formed solar cell to the elements found in the SPT module 1400. In general, the vision system 1440 and system controller 290 are adapted to find one or more features on a device substrate 303 by moving the solar cell relative to one or more cameras found in the vision system 1440. In one configuration the formed solar cell is scanned by the vision system 1440 by use of the gripping members 1423 and the frictionless support elements 1422 which allow X and Y-direction movement. The vision system 1440 generally contains at least one camera and other electronic components that are able to locate, communicate, and store the position of features formed on or within the device substrate 303. For example, the vision system 1440 can be used to find the various formed test structures or other scribed features (e.g., laser scribe in steps 108, 114, and 120) formed in the layers deposited on the substrate 302. Due to tolerances in the substrate 302 received in step 102 the position of the scribe marks can vary relative to one or more edges of the glass substrate, such that the variability can affect the device yield of the solar cell formation process. Once the desirable features on the solar cell are found by the vision system 1440, the solar cell can be repositioned to allow the device substrate 303 to be placed in a desired position so that the various testing steps can be performed on the one or more test structures formed on the substrate.

In one embodiment, the vision system 1440 and software in the system controller 290 are used to monitor and/or characterize the misalignment of the scribing marks formed in the test structure 1405. In one embodiment, the vision system 1440 is used to magnify and display the test structure, for example, test structure 1405 so that an operator can characterize the film properties or misalignment of the scribe lines. In another embodiment, a vision system 1440 and system controller 290 are used to analyze the test results received from the test structure and then automatically make corrections to the solar cell 300 formation process(es) to correct the undesirable process results.

Referring to FIGS. 14A and 14C, a resistance measurement module 1460 generally contains a measurement assembly 1461 and a plurality of contact pins 1451-1454 that are adapted to probe the various test structures that are to be analyzed. The measurement assembly 1461 may generally contain one or more voltage sources connected to two or more of the contact pins, one or more current sources connected to two or more of the contact pins, one or more voltage measurement devices connected to two or more of the contact pins and/or one or more current measurement devices connected to a contact pin. In one embodiment, the contact pins 1451-1454 are an array of "po-go" pins that are designed to reliably contact various desired regions of a test structure on many different substrates multiple times. In general, the resistance measurement module 1460 contains a contact pin supporting structure that can be actuated and positioned in one or more directions so that two or more contact pins can be placed in contact with desired points on the test structures formed on the substrate 302. In one embodiment, the contact pin supporting structure contains a plurality contact pins (e.g., >100 contact pins) that are adapted to probe each test structures formed on the substrate at once.

The solar cell efficiency module 1450 generally contains one or more components that can be used to characterize the performance of the partially formed solar cell using the light source 1470. In one embodiment, as shown in FIG. 14C, the light source 1470 is positioned on a side of the substrate that is opposite to the side that the resistance measurement module 1460 is adapted to probe. The solar cell efficiency module 1450 is generally an automated assembly that is used in conjunction with the contact pins contained in the resistance measurement module 1460 and the light source 1470 to characterize the electrical characteristics of the partially formed solar cell device.

In one embodiment, the SPT module 1400 contains a substrate identification device, such as a bar code reader that is used to identify and log data collected in the module for each tested substrate, so that trends and/or other substrate processing information can reviewed and analyzed at some later date. The collected test data and bar code information can be stored and retrieved from one or more databases formed in one or more storage device contained in the system controller 290 and managed by software contained therein.

Figure 14D:
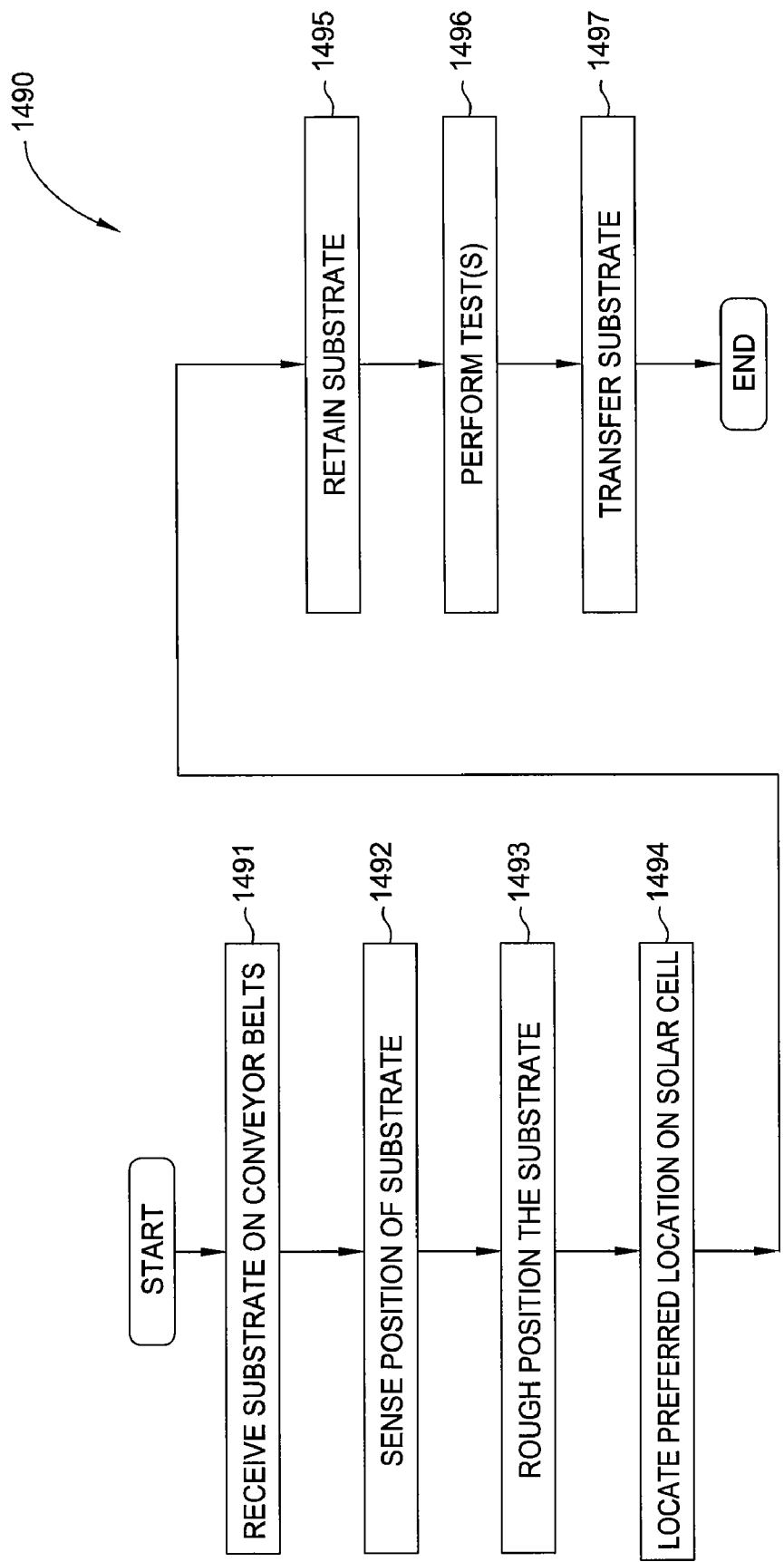
FIG. 14D illustrates a processing sequence according to one embodiment described herein.

Referring to FIGS. 1, 14A and 14C, in one or all of the steps 111 or 123, a series of sub-sequence steps, or processing sequence 1490, are used to complete the testing solar cell process. FIG. 14D illustrates one embodiment of a process sequence 1490 that contains a plurality of steps (i.e., steps 1491-1497) that are used to test aspects of the solar cell formation process. The configuration of the processing sequence, number of processing steps, and order of the processing steps in the process sequence 1490 illustrated herein are not intended to be limiting to the scope of the invention described herein.

The process sequence 1490 generally starts at step 1491 in which one or more solar cells, hereafter substrates, are moved to the input of the SPT module 1400 by use of a robotic device so that the automated conveyor rollers 1421 can receive and position the solar cell. The automated conveyor rollers 1421 may also be adapted to receive a plurality of substrates that have been processed following one or more of the steps 102-130. Movement of the substrates can be controlled by commands sent to one or more driving mechanisms coupled to the automated conveyor rollers 1421 from the system controller 290.

In the next step, step 1492, the substrate is moved along the automated conveyor rollers 1421 until the leading edge of the substrate is sensed by use of a moveable hard stop element and an optical sensor, and/or position sensor, contained in the leading edge rough stop assembly. The leading edge is generally the edge of the solar cell that is perpendicular to the direction of motion "$A_{io}$" (FIG. 14C).

In the next step, step 1493, the substrate is lowered onto a gas cushion created by the gas flowing through the plurality of holes formed in the plurality of frictionless support elements 1422. The substrate is lowered onto the gas cushion by use of one or more actuators that raise and lower the automated conveyor rollers 1421. Once the substrate is positioned on the gas cushion it is then aligned to a datum element by use of one or more of the gripping elements 1423. In one embodiment, servos in one or more of the gripping elements 1423 are controlled to position the solar cell in a desired position within the SPT module 1400. The servo control of the gripping elements 1423 allows the substrate to be position in the X and Y directions so that the fine adjustments or corrections can be made in the next step using the vision system 1440.

In the next step, step 1494, an accurate location and alignment is attained between features formed on the substrate and the automated components in the SPT module 1400. In one embodiment, the X-direction, Y-direction and angular alignment of the scribe lines are aligned relative to the automation components in the SPT module 1400. The X-direction, Y-direction and angular alignment of the substrate can be adjusted by use of the data collected by the vision system 1440 and control signals sent to the servo controlled gripping elements 1423 by the system controller 290. The vision system 1440 generally contains at least one camera and other electronic components that are able to locate, communicate, and store the position of features found within the formed solar cell substrate as the solar cell device is moved using one or more of the automation assembly 1420 components. As noted above, due to tolerances in the glass substrate the position of the scribe marks can vary, which can affect the device yield of the solar cell formation process.

In the next step, step 1495, once the solar cell has been aligned the substrate is then positively retained by use of one or more of the gripping elements 1423. Once the gripping elements 1423 have grasped a portion of the substrate, the other redundant gripping elements 1423 may be disengaged from the solar cell. The one or more gripping elements 1423 are generally adapted to grasp one or more non-active regions of the solar cell, such as the region at the edge of the solar cell cleared by the edge deletion module 226 during step 126. In one embodiment, the vision system 1440 is used to rechecked the solar cell's position after the gripping elements 1423 have grasped a portion of the substrate to assure that the solar cell is still in a desirable alignment.

In the next step, step 1496, the one or more of the test structures are probed and analyzed by use of the resistance measurement module 1460, solar cell efficiency module 1450, vision system 1440, and/or the light source 1470.

In the next step, step 1497, after the steps 1491-1496 have been completed on the substrate the gripping elements 1423 then release the solar cell and the automated conveyor rollers 1421 are raised to receive the substrate from the frictionless support elements 1422. After the substrate has been received by the automated conveyor rollers 1421 the gas flowing to the frictionless support elements 1422 is turned off and the automated conveyor rollers 1421 move the substrate out of the SPT module 1400 and back into the production line 200. Movement of the substrates can be controlled by commands sent to one or more driving mechanism coupled to the automated conveyor rollers 1421 from the system controller 290.

Alternate System Metrology and Analysis Components

In combination with the solar simulator module 1300 and/or the SPT module 1400, discussed above, the device testing module 240 may also contain other data collection and analysis techniques that can be used to control the production line 200. In one embodiment, the device testing module 240 may include modules that are able to measure quantum efficiency, particles, sheet resistance (Rs), material composition, deposited film thickness, profile measurement, FTIR, SEM, TEM, doping concentration, grain structure, thermal measurements, photochemical measurements, optical mechanical and stress measurements, defect density, electrochemical measurements, electrical/hall effect measurements, and photoconductivity for all materials in the photovoltaic stack. The use of metrology to characterize the manufacturing processes used to form photovoltaic cells can be useful to improve the cycle time, system availability, device yield, and efficiency of the processing sequence.

In one embodiment, software to run the factory and metrology for factory data acquisition is provided to create a useful photovoltaic cell production line. The metrology tools can be used after each process step to measure aspects and the state of the manufacturing of the PV cells with the end result of the factory being the solar cell. The various metrology process steps can be performed on-line (within the process sequence flow), or off-line (substrates are removed from the process flow).

In one embodiment of the solar cell production line 200, one or more optical imaging techniques are used to characterize the solar cell formation process performance, defects in the formed solar cells, particles, or other important process parameters. In one aspect, various optical techniques, such as dark field optical imaging, bright field optical imaging, x-ray spectroscopic techniques, and IR radiation measurements are used to characterize the properties of one or more substrates at various stages throughout the processing sequence 100. Optical measurement techniques may generally include projecting one or more sources of radiation at the substrate and measuring the scattering, transmission, reflection, and/or absorption of light from a region or complete substrate surface. In one embodiment, the factory automation system is able to store the various optical measurement results of multiple processed substrates so that they can be compared with other substrates to find a trend or issue in the one or more elements of the solar cell production line 200, such as the robotics, deposition chamber(s), and scribe modules. The optical measurement techniques may be performed at various stages of the process sequence and can be used to help analyze processing problems to reduce scrap, improve device yield and improve solar cell performance.

Figure 16:
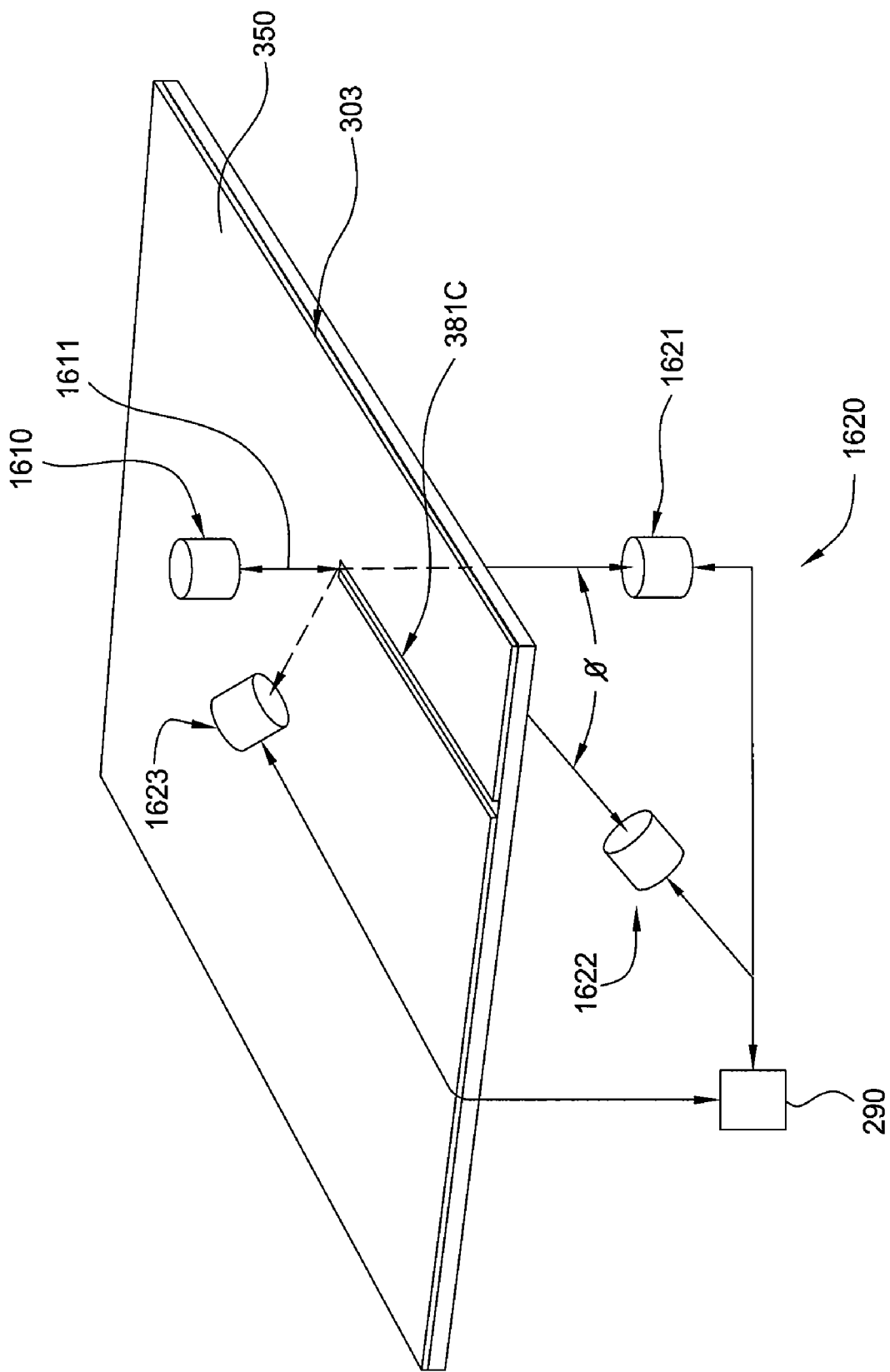
FIG. 16 is an isometric view of an optical inspection device according to one embodiment described herein.

In one embodiment of one or more of the scribe modules (e.g., scribe modules 208, 214, and 220) utilize an optical measurement technique to characterize the effectiveness of these material removal processes. These techniques can be especially effective when a laser source is used to ablate material from the surface of the substrate since the transmission and scattering of the light used to ablate material can be measured and characterized to assure that the results are similar for all processed substrates. FIG. 16 is an isometric view of a portion of a scribe module, such as scribe modules 208, 214 and 220, that illustrates one embodiment of an optical inspection hardware assembly 1620 that is useful to control a scribing process performed therein. The optical inspection hardware assembly 1620 may contain a transmitted light sensor 1621 (e.g., photoconductive type sensor) that is positioned to monitor the intensity of the light 1611 that is provided by the laser source 1610 and transmitted through the device substrate 303 so that the variation in intensity can be measured and analyzed during the scribing process by use of a system controller 290. In one example, as shown in FIG. 16 the scribing process can be used to form a isolation groove 381C (FIG. 3E) in the back contact layer 350. The detected signal from the sensor 1621 can thus be used to assure that the scribe process results are within a desirable range and, if not, adjust the output of the laser source 1610 to correct for the variations in power during the scribing process. In another embodiment, one or more scattered light sensors (e.g., sensors 1622 and 1623) are used to measure the scattering of the light 1611 from the laser source 1610 to further understand the effectiveness of the process. The data collected by the system controller 290 can be stored and/or further analyzed.

In one embodiment of the cleaning modules (e.g., clean modules 206, 210 and 230), one or more sensors are disposed in the used rinse water or used cleaning solution to monitor the cleanliness of the substrates, and/or end point of the process. In this configuration, one or more conductivity, liquid optical particle measurement techniques, pH, ORP or other similar techniques are used to monitor the liquid effluent from one or more of the chambers to understand the state of the substrate being processed or the "cleanliness" of the processing chamber.

Support Attachment Module Design and Processes

Figure 15A:
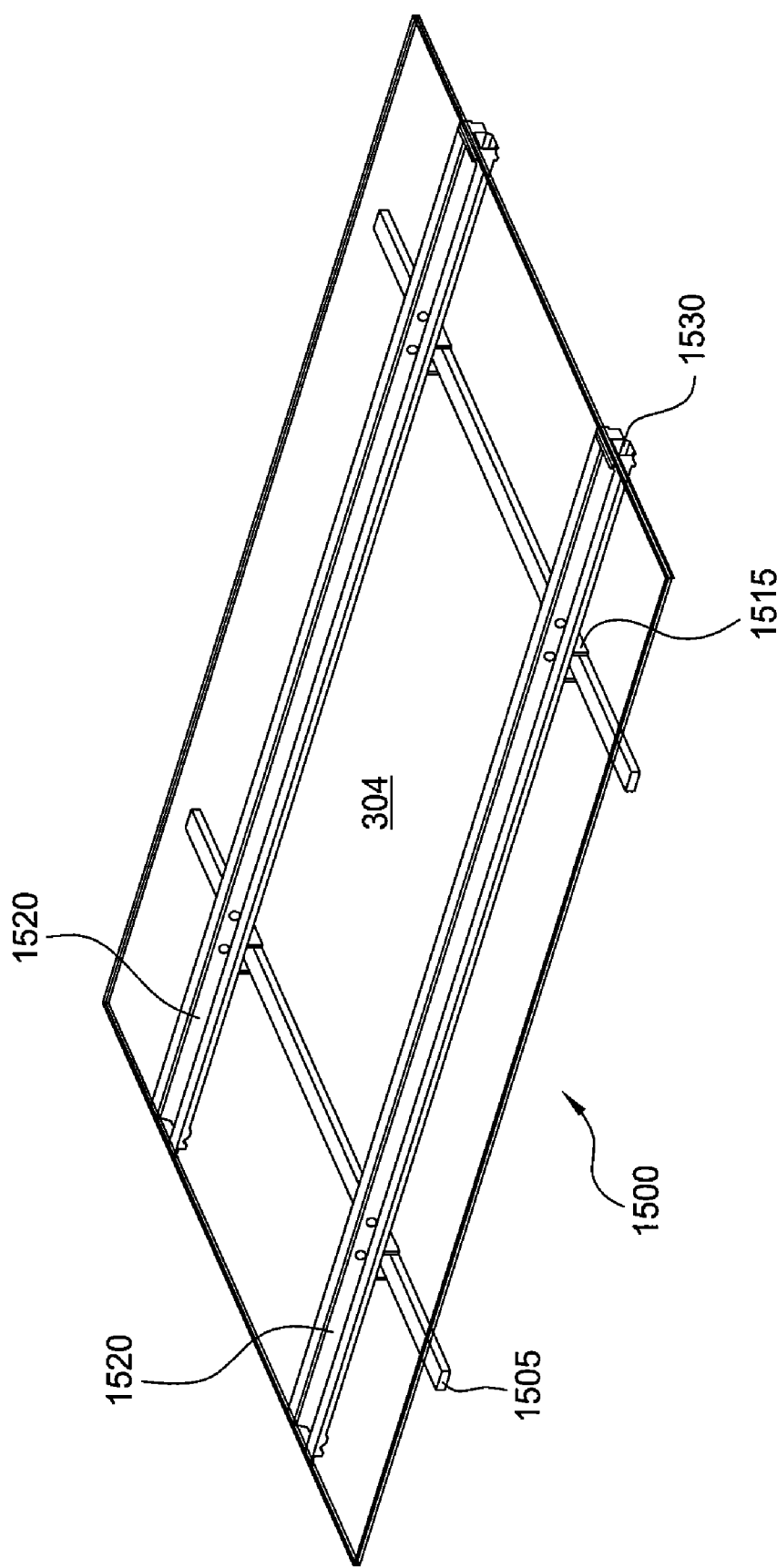
FIG. 15A is an isometric view of solar cell device having elongated support members bonded thereto according to one embodiment described herein.

FIG. 15A illustrates one embodiment of a composite solar cell structure 304 that has one or more supporting elements attached to a surface, such as the backside of the composite solar cell structure 304. In one embodiment of the production line 200, one or more elongated support members 1520 is affixed to a surface of the composite solar cell structure 304. In general, the elongated support members 1520 will have a cross-sectional shape to support a solar panel under the typical environmental loading conditions but be flexible enough to minimize the maximum stress experienced by the solar cell during normal operation. The elongated support members 1520 may also be bonded or adhered to the solar panels through strong, flexible glue or double-sided tape that withstands significant environmental loads, such as wind uploading, yet remain flexible enough to minimize stress concentrations in the solar panels. The support members may have one or more coatings to provide resistance to corrosion. The solar panels, or solar cells, discussed herein may vary in size, and may have a light receiving surface having an area as large as 2.2 meters×2.6 meters.

FIG. 15A is an isometric view of one embodiment of a solar panel mounting configuration 1500. In this configuration, elongated support members 1520 are attached to transverse support beams 1505 via support brackets 1515. A composite solar cell structure 304 is bonded to the elongated support members 1520 along the length of the non-light receiving surface of the composite solar cell structure 304. The composite solar cell structure 304 may be further retained at the edges of the composite solar cell structure 304 via end brackets 1530. In this embodiment two elongated support members 1520 are shown spanning the length of the composite solar cell structure 304; however, other embodiments may include any number of elongated support members 1520 spanning the length of the composite solar cell structure 304. Examples of an exemplary structure comprising a composite solar cell structure 304 and bonded elongated members is disclosed in U.S. Provisional Patent Application Ser. No. 61/036,691, filed Mar. 14, 2008 and U.S. Provisional Patent Application Ser. No. 61/028,795, filed Feb. 14, 2008, which are both incorporated by reference.

Figure 15B:
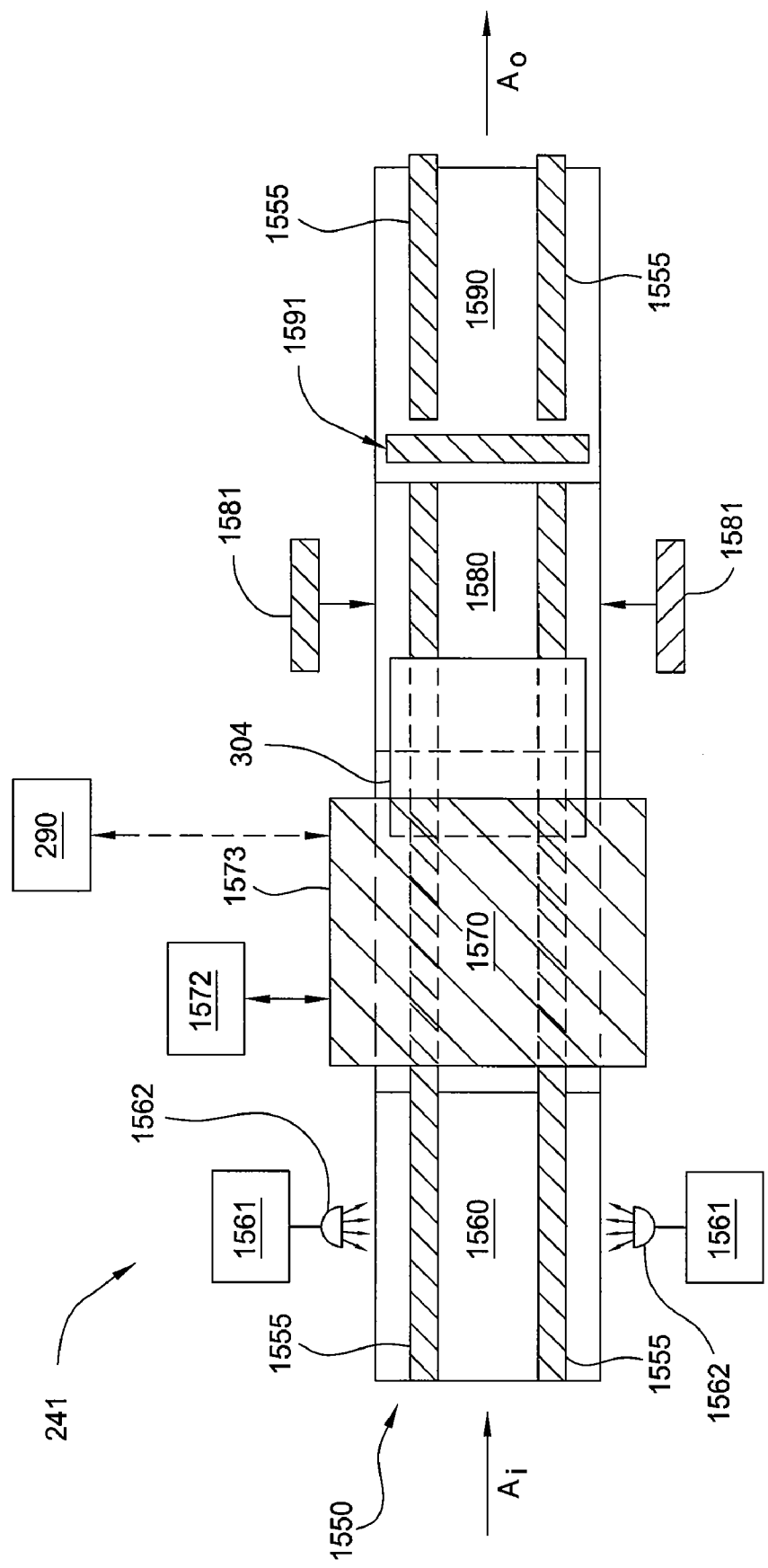
FIG. 15B is a plan view of support structure attachment module according to one embodiment described herein.

FIG. 15B is a plan view of a support structure attachment module 241 that can be used to bond the elongated support members 1520 to a surface of the solar cell in an automated or semi automated fashion. The support structure attachment module 241 generally contains a cleaning region 1560, a drying region 1570, a rail attach region 1580, and an attachment section 1590 that are all transferrably connected by use of an automation system 1550. In general, the support structure attachment module 241 is positioned to receive the composite solar cell structure 304 from an automation device 281 that is connected to the device testing module 240, perform the support structure attachment process (step 141), and then deliver the substrate to the unload module 242 following paths $A_i$ and $A_o$.

The automation system 1550 is generally a conveying system that is used to support and transfer the solar cell through the various sections of the support structure attachment module 241. In one example, as shown in FIG. 15B, the automation system 1550 comprises a series of actuated conveyor belts 1555 that are controlled by commands sent from the system controller 290. In one embodiment, the automation system 1550 components are similar to the automation device 281 described herein.

In the first step in the support structure attachment process, a cleaning module 1560 is adapted to perform one or more cleaning and preparation processes to the back glass substrate 361 so that the elongated support members 1520 can be securely and reliably attached in a subsequent step. The cleaning and preparation process may include a cleaning fluid rinse of the back glass substrate 361, gas purge of the surface to remove particles, and/or the application of a primer or other material (e.g., glue) that can be used to help promote or form a bond between the surface of the surface of the solar cell and the elongated support members 1520. In one embodiment, a cleaning fluid or primer material is delivered from one or more source vessels 1561 through a nozzle 1562 to a surface of the composite solar cell structure 304.

In the next step, the composite solar cell structure 304 is transferred to the drying region 1570 where the composite solar cell structure 304 is dried to remove any contaminants that might affect the bonding process. In one embodiment, the drying region 1570 includes a hood 1573 and exhaust device 1572 (e.g., fan) that are adapted to dry the surface of the substrate by promoting evaporation of the cleaning solution components and/or collect vapors emanating from the primer or other chemicals delivered during the cleaning process.

In the next step, the composite solar cell structure 304 is transferred to the rail attach region 1580 where the elongated support member 1520 are placed on the composite solar cell structure 304 by use of robotic devices 1581. The robotic device 1581 may be conventional robotic devices that are positioned to receive an elongated support member 1520 from a receiving area (not shown) and place the elongated support member 1520 on a desired region of the composite solar cell structure 304. In one embodiment, prior to placement of the elongated support member 1520 on the composite solar cell structure 304 an amount of a glue or tape like material is affixed to a bonding surface of the elongated support member 1520 that is placed against a surface of the composite solar cell structure 304 by the robotic devices 1581.

In the next step, the composite solar cell structure 304 is transferred through the attachment section 1590 where the elongated support member 1520 is urged against the surface of the composite solar cell structure 304, which is supported on the automation system 1550, by use of one or more automated rollers 1591. In one embodiment, the pair of automated rollers 1591 are generally weighted to provide a desired load to the elongated support member 1520 and the composite solar cell structure 304 to assure that the elements used to bond the elongated support member 1520 to the composite solar cell structure 304 are in contact. In another embodiment, the force applied by the pair of automated rollers 1591 by an actuator (not shown) and the speed with which the composite solar cell structure 304 is fed through the automated rollers 1591 by the automation system 1550 components is controlled by the system controller 290. Next, the composite solar cell structure 304 can then be transferred to the unload module 242 using one or more of the automation system 1550 components.

Automation and Environmental Control

One aspect of the production line 200 (FIGS. 2A-2C) is the ability of the system to receive a "raw" unprocessed substrate and perform a plurality of automated processes, to form a complete functional and tested solar cell device that can then be shipped to an end user. To move the solar cell substrate to the various processing stations a plurality of robots, conveyors and other automation devices are used to control each substrate's flow through the production line 200. In one example, the production line 200 is configured so that the process flow through the system generally follows a flow path "P", as shown in FIG. 2A, or paths $P_1$-$P_{18}$ shown in FIGS. 2B-2C. In general, the bulk of the movement of the various substrates through the production line 200 is performed by use of multiple automation devices 281 that are adapted to move and position the substrates 302 so that can be received by, or positioned within, one or more of the processing modules (e.g., reference numerals 202, 206, 208, 210, 212, 218, etc.) by use of commands sent by the system controller 290. The automation device 281 may generally comprise a robotic device or conveyor that is adapted to move and position a substrate. In one example, the automation device 281 is a series of conventional substrate conveyors (e.g., roller type conveyor) and/or robotic devices (e.g., 6-axis robot, SCARA robot) that are configured to move and position the substrate as desired. An example of a dual arm end-effector that may be used in solar cell production line, such as the robot is further described in the U.S. patent application Ser. No. 11/421,793, filed Jun. 2, 2006, which is herein incorporated by reference. In one embodiment, one or more of the automation devices 281 also contains one or more substrate lifting components, or drawbridge conveyors, that are used to allow substrates upstream of a desired processing chamber to be delivered past a substrate that would be blocking its movement to the desired position within the production line. In this way the movement of substrates to various processing chambers will not be impeded by other substrates waiting to be delivered to another processing chamber position.

Referring to FIGS. 1, 2A and 6, in one embodiment of the solar cell production line 200, one or more accumulators 211 are inserted to provide buffering capability to the flow of substrates through the solar cell production line 200. The accumulators 211 generally have a plurality of substrate supports that can support a substrate and be retrieved by an automation device 281. As shown in FIG. 2A, in one embodiment, the solar cell production line 200 has at least one accumulator 211 (e.g., two accumulators 211A are shown in FIG. 2A) positioned before the one or more cluster tools 212A-212D found in the processing module 212. During the production of solar cells it is generally desirable to load the accumulators 211A with two or more substrates to assure that the one or more cluster tools 212A-212D have a ready supply of substrates, and provide a collection area where substrates coming from the upstream processes can be stored if one or more of the cluster tools 212A-212D goes down.

In one embodiment, the solar cell production line 200 has at least one accumulator 211 positioned after the processing module 212. During production the accumulators 211B receive substrates exiting the process module 212 to allow the substrates time to cool down, provide a ready supply of substrates to the back contact deposition chamber 218, and/or provide a collection area where substrates coming from the processing module 212 can be stored if the back contact deposition chamber 218 goes down. In one embodiment, as discussed above, it is generally desirable to monitor and/or actively control the temperature of the substrates exiting the accumulators 211B to assure that the results of the interconnect formation step 114 are repeatable. In one aspect, it is desirable to assure that the temperature of the substrates exiting the accumulators 211B or arriving at the scribe module 214 are at a temperature in a range between about 20° C. and about 25° C. In one embodiment, it is desirable to control the substrate temperature to about 25+/−0.5° C. In one embodiment, the accumulators 211B are configured to retain at least about 80 substrates. During the normal running of the solar cell production line 200 the accumulators 211B may have about half of their spaces empty for buffering capability if a downstream module is taken down for maintenance activities.

In one embodiment, the solar cell production line 200 has at least one accumulator 211 positioned after the scribe module(s) 214. During production the accumulators 211C will be used to provide a ready supply of substrates to the contact deposition chamber 218, and/or provide a collection area where substrates coming from the processing module 212 can be stored if the contact deposition chamber 218 goes down or can not keep up with the throughput of the scribe module(s) 214. In one embodiment it is generally desirable to monitor and/or actively control the temperature of the substrates exiting the accumulators 211C to assure that the results of the back contact formation step 120 are repeatable. In one aspect, it is desirable to assure that the temperature of the substrates exiting the accumulators 211C or arriving at the contact deposition chamber 218 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

In one embodiment, the solar cell production line 200 has at least one accumulator 211 positioned after the processing module 218. During production the accumulators 211D will be used to provide a ready supply of substrates to the scribe modules 220, and/or provide a collection area where substrates coming from the processing module 218 can be stored if the scribe modules 220 go down or can't keep up with the throughput of the processing module 218. In one embodiment it is generally desirable to monitor and/or actively control the temperature of the substrates exiting the accumulators 211D to assure that the results of the back contact formation step 120 are repeatable. In one aspect, it is desirable to assure that the temperature of the substrates exiting the accumulators 211D or arriving at the scribe module 220 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Control System Design

Embodiments of the present invention may also provide an automation system that contains one or more controllers that are able to control the flow of substrates, materials, and the allocation of processing chambers within the solar cell fabrication process sequence. The automation system may also be used to control and tailor the properties of each completed device formed in the system in real time. The automation system may also be used to control the startup and troubleshooting of the system to reduce substrate scrap, improve device yield, and improve the time to produce a substrate.

Figure 7:
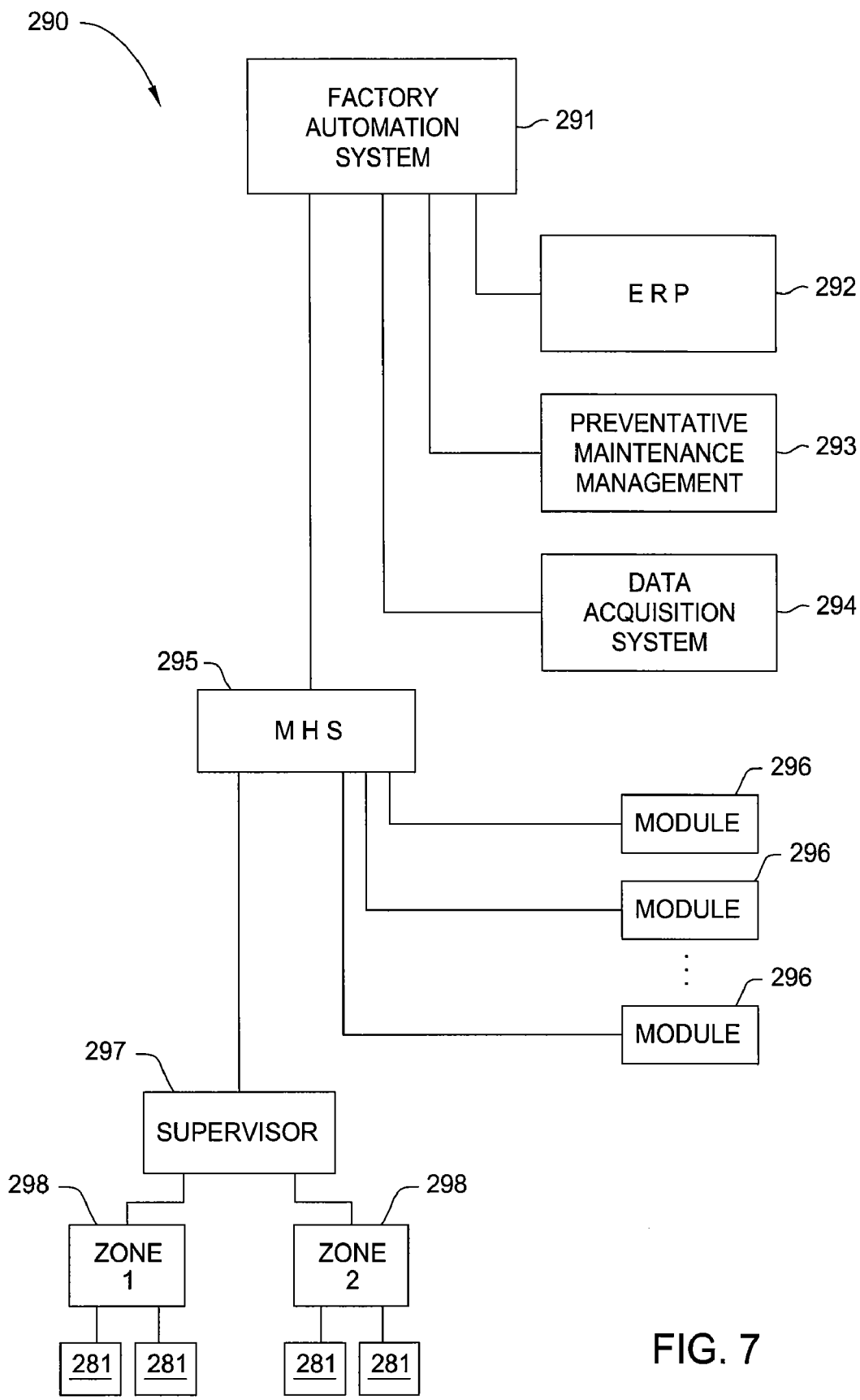
FIG. 7 is a schematic view of the control elements in the system controller 290 according to one embodiment described herein.

FIG. 7 is a schematic view of one embodiment of the various control features that may be contained within the system controller 290. In one embodiment, the system controller 290 contains a factory automation system (FAS) 291 that deals with the strategic aspects of the substrate processing, and thus may control the dispatch of substrates into or through various parts of the system and the scheduling of various maintenance activities. The FAS thus is able to control and receive information from a number of components in the control architecture, such as a material handling/control system (MHS) 295, an enterprise resource (ERP) system 292, a preventive maintenance (PM) management system 293, and a data acquisition system 294. The FAS 291 generally provides complete control and monitoring of the factory, the use of feedback control, feed forward control, automatic process control (APC), and statistic process control (SPC) techniques, along with the other continuous improvement techniques to improve factory yield.

The MHS system 295 generally controls the actual movement and interface of various modules within the system to control the movement of one or more substrates through the system. The MHS system 295 will generally interface with multiple programmable logic controllers (PLCs) that each tasked with the movement and control of various smaller aspects of processing performed in the solar cell production line 200. The MHS and FAS systems may use feed forward or other automation control logic to control and deal with the systematic movement of substrates through the system. Since cost to manufacture solar cells is generally an issue, minimizing the capital cost of the production line is often an important issue that needs to be addressed. Therefore, in one embodiment, the MHS system 295 utilizes a network of inexpensive programmable logic controllers (PLCs) to perform the lower level control tasks, such as controlling the one or more of the automated devices 281, and controlling the one or more of the modules 296 (e.g., junction box attachment module 238, autoclave module 236) contained in the production line 200. Use of this configuration of devices also has an advantage since PLCs are generally very reliable and easy to upgrade. In one example, the MHS system 295 is adapted to control the movement of substrates through groups, or zones 298, of automated devices 281 by use of commands sent from the MHS system and delivered through supervisor controller 297, which may also be a PLC type device.

The ERP system 292 deals with the various financial and support type functions that arise during the production of solar cell devices. The ERP system 292 can be used to ensure that the each module is available for use at a desired time within the production sequence. The ERP system 292 may control and advise the users of various current and upcoming support type issues in the production line. In one embodiment, the ERP system 292 has the capability to predict and order the various consumable materials used within the production sequence. The ERP system 292 may also be used to review, analyze and control the throughput of the system to improve profit margins on the formed devices. In one embodiment the ERP system 292 is integrated with SAP to order and control of the management of consumable materials, spares, and other material related issues.

The (PM) management system 293 is generally used to control the scheduling and taking down of various elements in the system to perform maintenance activities. The PM management system 293 can thus be used to coordinate the maintenance activities being performed on adjacent modules in the production line to assure that down time of the production line, or branch of the production line, can be minimized. In one example, it may be desirable to take down cluster tool 212B and its associated inlet automation device 281 to reduce the unnecessary down time of both parts when either component separately removed from service. The PM management system 293 and ERP system 292 can generally work together to assure that all of the spare parts and other consumable elements have been ordered and are waiting for the maintenance staff when the preventive maintenance activity is ready to be performed.

In one embodiment, the FAS 291 is also coupled to a data acquisition system 294 that is adapted receive, store, analyze and report various process data received from each of the processing tools, in-line metrology data, offline metrology data and other indicators that are useful to assure that the processes being performed on the substrates are repeatable and within specification. The input and output data that is collected from internal inputs/sensors or from external sources (e.g., external systems (ERP, remote source)) is analyzed and distributed to desired areas of the solar cell production line and/or is integrated in various areas of the process sequence to improve the cycle time, system or chamber availability, device yield and efficiency of the process. One embodiment, provides the use of factory automation software for the control of a photovoltaic cell manufacturing facility. The automation will provide WIP data storage and analysis. Serial number tracking and data storage. The software will also have the ability to perform data mining to improve yield and link with the company ERP to assist in forecasting, WIP planning, sales, warranty claim payment and defense, and cash flow analysis.

While the foregoing is directed to embodiments of the present invention, other and further embodiments of the invention may be devised without departing from the basic scope thereof, and the scope thereof is determined by the claims that follow.

The invention claimed is:

1. An automated integrated solar cell production line, comprising:
a substrate loading station to load substrates into the integrated production line that comprises a plurality of automation devices which are configured to serially transfer substrates along a path;
a front contact isolation module disposed along the path and downstream from the substrate loading station, and adapted to etch a front contact layer deposited thereon to provide isolation therebetween;
a plurality of cluster tools disposed along the path and downstream from the front contact isolation module, and having at least one processing chamber that is adapted to deposit a silicon-containing layer on a surface of the substrate;
an interconnect formation module disposed along the path and downstream from the plurality of cluster tools, and adapted to etch the silicon-containing layer;
one or more metal deposition chambers disposed along the path and downstream from the back contact isolation module, and adapted to deposit a metal layer over the silicon-containing layer;
a back contact isolation module disposed along the path and downstream from the one or more metal deposition chambers;
one or more edge deletion modules disposed along the path and downstream from the one or more metal deposition chambers that are adapted to remove material from a perimeter area of a substrate;
a bonding wire attach module disposed along the path and downstream from the one or more material removal chambers;
a lamination device disposed along the path and downstream from the bonding wire attach module that is adapted to bond a second substrate to the first substrate by applying heat and pressure to the first and second substrates which have the silicon-containing layer and a bonding layer disposed therebetween; and
an autoclave disposed downstream from the lamination device, wherein the autoclave comprises:
a vessel;
a compressor that is in fluid communication with a processing region of the vessel and is adapted to expose the first substrate, second substrate and bonding layer to a gas at a pressure greater than 13 Bar;
a heating element disposed in the processing region;
a substrate support that is adapted to support a plurality of first and second substrates that have been bonded together in the processing region; and
at least one spacer adapted to position each of the plurality of first and second substrates that have been bonded together in a spaced apart relationship during processing in the autoclave.

2. The automated solar cell production line of claim 1, wherein the bonding wire attach module comprises:
a substrate handling system that is adapted to transfer the substrate from a first position to a second position;
a vision system that is positioned to view the surface of the substrate;
two or more conductive element deposition devices that are each adapted to substantially simultaneously position a conductive element on the conductive layer formed on the surface of the substrate as the substrate is moved from the first position to the second position by the substrate handling system; and
two or more solder points that can be positioned to provide heat to two or more regions of at least one of the conductive elements that is disposed on the conductive layer.

3. The automated solar cell production line of claim 1, further comprising one or more test modules, wherein each of the one or more test modules comprise:
a plurality of contact pins;
a measurement device that is in electrical communication with at least one of the plurality of contact pins;
a vision system that is positioned to view a surface of the substrate, and is adapted to view features formed on the substrate by use of a camera, a controller and one or more robotic devices; and
an actuator that is adapted to position the contact pins relative to the substrate so that the contact pins can make electrical contact with a desired surface of the substrate.

4. The automated solar cell production line of claim 1, further comprising a solar cell support structure attachment module that comprises:
a cleaning region that is disposed downstream of the lamination device, and is configured to remove contamination from the second substrate;
a rail attach region having a robotic device that is adapted to place an elongated support member on the second substrate;
an attachment section having an automated roller that is adapted to urge the elongated support member against the second substrate; and
an automation system that is configured to transfer the first and second substrates through the cleaning region, the rail attach region, and the attachment section.

* * * * *